(12) United States Patent
Masuoka et al.

(10) Patent No.: US 8,772,881 B2
(45) Date of Patent: Jul. 8, 2014

(54) SEMICONDUCTOR DEVICE

(75) Inventors: Fujio Masuoka, Tokyo (JP); Hiroki Nakamura, Tokyo (JP)

(73) Assignee: Unisantis Electronics Singapore Pte Ltd., Peninsula Plaza (SG)

(*) Notice: Subject to any disclaimer, the term of this patent is extended or adjusted under 35 U.S.C. 154(b) by 314 days.

(21) Appl. No.: 12/794,088

(22) Filed: Jun. 4, 2010

(65) Prior Publication Data
US 2010/0308422 A1 Dec. 9, 2010

Related U.S. Application Data

(60) Provisional application No. 61/268,195, filed on Jun. 9, 2009.

(30) Foreign Application Priority Data

Jun. 5, 2009 (JP) ................................ 2009-135754

(51) Int. Cl.
*H01L 27/11* (2006.01)
*H01L 27/088* (2006.01)

(52) U.S. Cl.
USPC ................... 257/401; 257/E27.099; 257/329; 257/350

(58) Field of Classification Search
None
See application file for complete search history.

(56) References Cited

U.S. PATENT DOCUMENTS

| | | |
|---|---|---|
| 4,670,768 A | 6/1987 | Sunami et al. |
| 5,427,962 A | 6/1995 | Sasaki et al. |
| 5,480,838 A | 1/1996 | Mitsui |
| 5,550,084 A | 8/1996 | Anjum et al. |
| 5,599,725 A | 2/1997 | Dorleans et al. |
| 5,656,842 A | 8/1997 | Iwamatsu et al. |

(Continued)

FOREIGN PATENT DOCUMENTS

| | | |
|---|---|---|
| EP | 0 020 929 A1 | 1/1981 |
| EP | 0334927 B1 | 12/1993 |

(Continued)

OTHER PUBLICATIONS

Wolf, S., "Silicon Processing for the VLSI Era", vol. 3—"The Submicron MOSFET", Lattice Press, Sunset Beach, California (USA), 1995.; section 4.1.1: Basics of MOSFET Operation, pp. 136-138.*

(Continued)

*Primary Examiner* — Johannes P Mondt
(74) *Attorney, Agent, or Firm* — Brinks Gilson & Lione

(57) ABSTRACT

The object to provide a highly-integrated SGT-based SRAM is achieved by forming an SRAM using an inverter which comprises a first island-shaped semiconductor layer, a first gate dielectric film in contact with a periphery of the first island-shaped semiconductor layer, a first gate electrode having one surface in contact with the first gate dielectric film, a second gate dielectric film in contact with another surface of the first gate electrode, a first arc-shaped semiconductor layer in contact with the second gate dielectric film, a first first-conductive-type high-concentration semiconductor layer arranged on a top of the first island-shaped semiconductor layer, a second first-conductive-type high-concentration semiconductor layer arranged underneath the first island-shaped semiconductor layer, a first second-conductive-type high-concentration semiconductor layer arranged on a top of the first arc-shaped semiconductor layer, and a second second-conductive-type high-concentration semiconductor layer arranged underneath the first arc-shaped semiconductor layer.

11 Claims, 72 Drawing Sheets

(56) References Cited

U.S. PATENT DOCUMENTS

| | | |
|---|---|---|
| 5,696,008 A | 12/1997 | Tamaki et al. |
| 5,773,329 A | 6/1998 | Kuo |
| 5,994,735 A | 11/1999 | Maeda et al. |
| 6,235,568 B1 | 5/2001 | Murthy et al. |
| 6,323,528 B1 | 11/2001 | Yamazaki et al. |
| 6,373,099 B1 | 4/2002 | Kikuchi et al. |
| 6,461,900 B1 | 10/2002 | Sundaresan et al. |
| 6,653,181 B2 | 11/2003 | Hergenrother et al. |
| 6,867,084 B1 | 3/2005 | Chiu et al. |
| 8,039,893 B2 | 10/2011 | Masuoka et al. |
| 2001/0002715 A1 | 6/2001 | Armacost et al. |
| 2002/0017687 A1 | 2/2002 | Yamazaki et al. |
| 2002/0164858 A1 | 11/2002 | Sayama et al. |
| 2005/0212063 A1 | 9/2005 | Nakano et al. |
| 2006/0261406 A1* | 11/2006 | Chen ............................. 257/329 |
| 2008/0062756 A1* | 3/2008 | Mayor et al. ................. 365/181 |
| 2009/0146194 A1 | 6/2009 | Moselund et al. |
| 2009/0189222 A1 | 7/2009 | Shino |
| 2010/0213525 A1 | 8/2010 | Masuoka et al. |
| 2010/0219482 A1 | 9/2010 | Masuoka et al. |
| 2010/0244140 A1 | 9/2010 | Masuoka et al. |
| 2011/0062521 A1 | 3/2011 | Masuoka et al. |

FOREIGN PATENT DOCUMENTS

| | | | | |
|---|---|---|---|---|
| EP | 0 721 221 | | 7/1996 | |
| EP | 1 507 294 A2 | | 2/2005 | |
| EP | 2 061 075 | | 5/2009 | |
| EP | 2 234 150 A2 | | 9/2010 | |
| EP | 2 259 315 A2 | | 12/2010 | |
| EP | 2 259 315 A3 | | 12/2010 | |
| JP | 60-070757 A | | 4/1985 | |
| JP | 62-045058 A | | 2/1987 | |
| JP | 02-066969 A | | 3/1990 | |
| JP | 02-188966 A | | 7/1990 | |
| JP | 03-225873 A | | 10/1991 | |
| JP | 05160408 A | * | 6/1993 | ............ H01L 29/784 |
| JP | 05-291518 | | 11/1993 | |
| JP | 08-051203 A | | 2/1996 | |
| JP | 2001-028399 A | | 1/2001 | |
| JP | 2004-319808 A | | 11/2004 | |
| JP | 2005-310921 A | | 11/2005 | |
| JP | 2007-250652 A | | 9/2007 | |
| JP | 2008-066562 A | | 3/2008 | |
| JP | 2008-205168 A | | 9/2008 | |
| JP | 2008-300558 A | | 12/2008 | |
| JP | 2009-038226 A | | 2/2009 | |
| JP | 2010-283181 A | | 12/2010 | |
| WO | WO 2009/057194 A1 | | 5/2009 | |
| WO | WO 2009/060934 | | 5/2009 | |
| WO | WO 2009/096464 A1 | | 8/2009 | |
| WO | WO 2009/096470 A1 | | 8/2009 | |

OTHER PUBLICATIONS

Takato et al., "High Performance CMOS Surrounding Gate Transistor (SGT) for Ultra High Density LSIs", IEEE Electron Devices Meeting, Technical Digest; pp. 222-225 IEDM (1988).*
Korean Office Action for Korean Patent Application No. KR2010-52973 dated Nov. 22, 2011 with English Translation.
Chen, Yijian et al., "Vertical integrated-gate CMOS for ultra-dense IC", *Microelectronic Engineering*, vol. 83, 2006, pp. 1745-1748.
European Search Report for European Application No. 10 00 9573, dated Feb. 24, 2012, 10 pages.
European Search Report for European Application No. 10 00 3151, dated Mar. 5, 2012, 9 pages.
S. Watanabe et al., "A Novel Circuit Technology with Surrounding Gate Transistors (SGT's) for Ultra High Density DRAM's" IEEE JSSC, vol. 30, No. 9, Sep. 1995.
European Search Report for EP patent Application No. 2259315 dated May 3, 2011.
Korean Office Action for Korean Patent Application No. KR 2010-52973 dated Aug. 4, 2011 with English Translation.
Notice of Allowance for co-pending U.S. Appl. No. 12/729,977, dated Jun. 5, 2012, 10 pages.
Office Action from co-pending U.S. Appl. No. 12/882,698, dated Jul. 9, 2012, 29 pages.
Office Action for U.S. Appl. No. 12/854,564, dated Apr. 23, 2013, 14 pages.
Notice of Allowance for U.S. Appl. No. 12/729,977, dated Oct. 9, 2012, 8 pages.
Office Action for U.S. Appl. No. 12/882,698, dated Oct. 5, 2012, 17 pages.
Search Report for European Patent Application Serial No. 10 00 8387, dated Jun. 28, 2013, 6 pages.
Notice of Allowance for U.S. Appl. No. 12/854,564, dated Jul. 10, 2013, 13 pages.
Office Action for U.S. Appl. No. 12/854,564, dated Dec. 4, 2012, 16 pages.
Office Action for U.S. Appl. No. 13/534,615, dated Feb. 15, 2013, 10 pages.
Notice of Allowance for U.S. Appl. No. 12/882,698, dated Feb. 21, 2013, 8 pages.
Notice of Allowance for U.S. Appl. No. 13/534,615, dated Jun. 7, 2013, 9 pages.

* cited by examiner

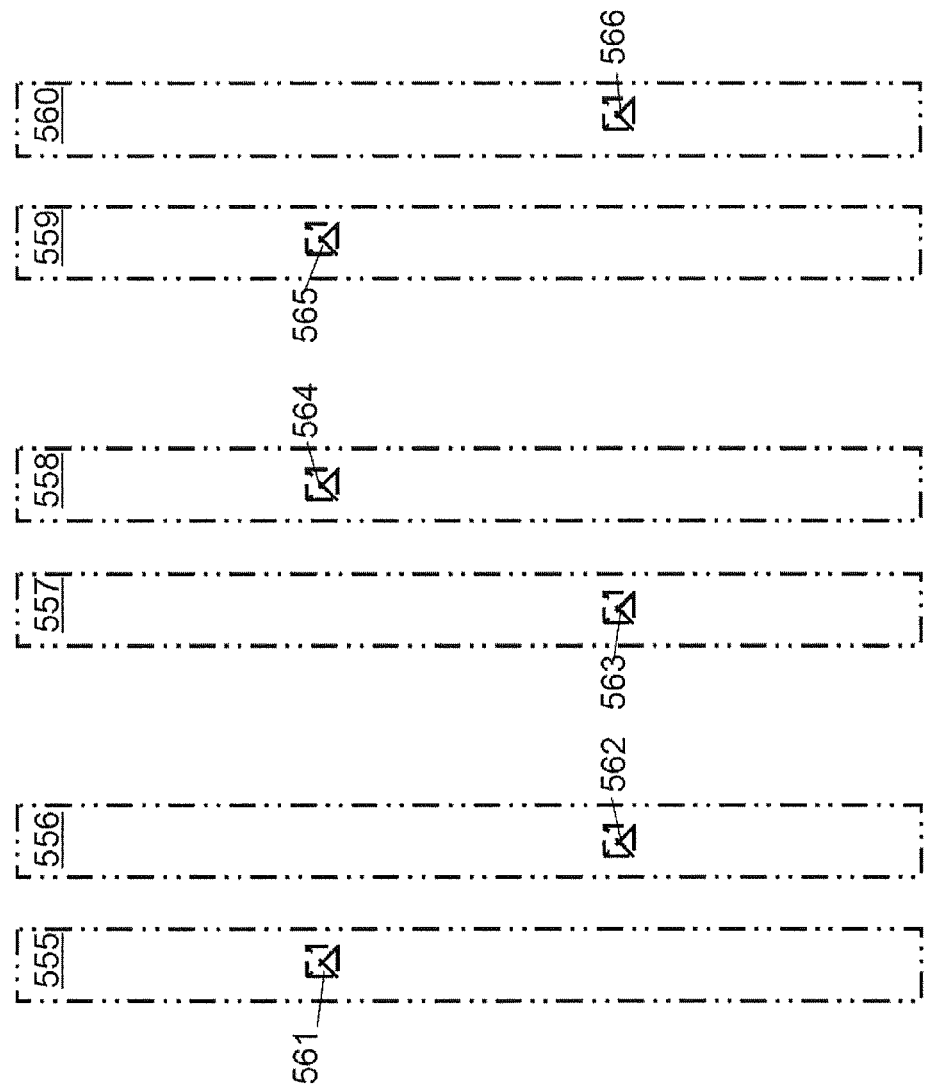

SEMICONDUCTOR DEVICE

CROSS-REFERENCE TO RELATED APPLICATION

This application claims the benefit of Japanese Patent Application No. 2009-135754 filed on Jun. 5, 2009 and U.S. Provisional Application No. 61/268,195 filed on Jun. 9, 2009, the entire disclosure of which is incorporated by reference herein.

FIELD

The present invention relates to a semiconductor device.

BACKGROUND

A degree of integration in a semiconductor device, particularly in an integrated circuit using a MOS transistor, has been increasing year by year. Along with the increase in the degree of integration, miniaturization of the MOS transistor used therein has progressed to a nano region. The progress in miniaturization of the MOS transistor, which constitutes an inverter circuit as a basic circuit for digital circuits, gives rise to a problem, such as difficulty in suppressing a leak current, which causes deterioration in reliability due to hot carrier effects and poses an impediment to sufficiently reducing a circuit occupancy area while meeting a requirement of ensuring a necessary current magnitude. With a view to solving this problem, there have been proposed a surrounding gate transistor (SGT) having a structure in which a source, a gate and a drain are arranged in a direction perpendicular to a substrate, wherein the gate is formed to surround an island-shaped semiconductor layer, and a CMOS inverter circuit using the SGT (see, for example, S. Watanabe, K. Tsuchida, D. Takashima, Y. Oowaki, A. Nitayama, K. Hieda, H. Takato, K. Sunouchi, F. Horiguchi, K. Ohuchi, F. Masuoka, H. Hara, "A Novel Circuit Technology with Surrounding Gate Transistors (SGT's) for Ultra High Density DRAM's," IEEE JSSC, Vol. 30, No. 9, 1995).

An inverter is constructed using a pMOS transistor and an nMOS transistor. In an inverter circuit, a gate width of a pMOS transistor has to be set to be twice as large as that of an nMOS transistor, because a hole mobility is one-half of an electron mobility. Therefore, a conventional CMOS inverter circuit using an SGT (SGT CMOS inverter circuit) is composed of two pMOS SGTs and one nMOS SGT. In other words, the conventional SGT CMOS inverter circuit is composed of total three island-shaped semiconductors.

An SRAM is composed of two inverters and two selection transistors. In cases where an SRAM is constructed using the conventional SGT CMOS inverter circuit, it is composed of four pMOS and four nMOS. In other words, the SRAM using the conventional SGT CMOS inverter circuit is composed of total eight island-shaped semiconductors.

SUMMARY

It is therefore an object of the present invention to provide a semiconductor device comprising a highly-integrated SGT-based SRAM.

In order to achieve this object, according to a first aspect of the present invention, there is provided a semiconductor device which comprises: a first inverter arranged at an intersection of the 1st row and the 1st column, wherein the first inverter includes a first island-shaped semiconductor layer, a first gate dielectric film in contact with at least a part of a periphery of the first island-shaped semiconductor layer, a first gate electrode having one surface in contact with the first gate dielectric film, a second gate dielectric film in contact with another surface of the first gate electrode, a first arc-shaped semiconductor layer in contact with at least a part of the second gate dielectric film, a first first-conductive-type high-concentration semiconductor layer arranged on a top of the first island-shaped semiconductor layer, a second first-conductive-type high-concentration semiconductor layer arranged underneath the first island-shaped semiconductor layer, a first second-conductive-type high-concentration semiconductor layer arranged on a top of the first arc-shaped semiconductor layer, and a second second-conductive-type high-concentration semiconductor layer arranged underneath the first arc-shaped semiconductor layer; a second inverter arranged at an intersection of the 2nd row and the 2nd column, wherein the second inverter includes a second island-shaped semiconductor layer, a third gate dielectric film in contact with at least a part of a periphery of the second island-shaped semiconductor layer, a second gate electrode having one surface in contact with the third gate dielectric film, a fourth gate dielectric film in contact with another surface of the second gate electrode, a second arc-shaped semiconductor layer in contact with at least a part of the fourth gate dielectric film, a third first-conductive-type high-concentration semiconductor layer arranged on a top of the second island-shaped semiconductor layer, a fourth first-conductive-type high-concentration semiconductor layer arranged underneath the second island-shaped semiconductor layer, a third second-conductive-type high-concentration semiconductor layer arranged on a top of the second arc-shaped semiconductor layer, and a fourth second-conductive-type high-concentration semiconductor layer arranged underneath the second arc-shaped semiconductor layer; a first selection transistor arranged at an intersection of the 1st row and the 2nd column, wherein the first selection transistor includes a third island-shaped semiconductor layer, a fifth gate dielectric film in contact with at least a part of a periphery of the third island-shaped semiconductor layer, a third gate electrode partially in contact with the fifth gate dielectric film, a fifth second-conductive-type high-concentration semiconductor layer arranged on a top of the third island-shaped semiconductor layer, and a sixth second-conductive-type high-concentration semiconductor layer arranged underneath the third island-shaped semiconductor layer; and a second selection transistor arranged at an intersection of the 2nd row and the 1st column, wherein the second selection transistor includes a fourth island-shaped semiconductor layer, a sixth gate dielectric film in contact with at least a part of a periphery of the fourth island-shaped semiconductor layer, a fourth gate electrode partially in contact with the sixth gate dielectric film, a seventh second-conductive-type high-concentration semiconductor layer arranged on a top of the fourth island-shaped semiconductor layer, and an eighth second-conductive-type high-concentration semiconductor layer arranged underneath the fourth island-shaped semiconductor layer.

According to a second aspect of the present invention, there is provided a semiconductor device which comprises: a first inverter arranged at an intersection of the 1st row and the 1st column, wherein the first inverter includes a first island-shaped semiconductor layer, a first gate dielectric film surrounding a periphery of the first island-shaped semiconductor layer, a first gate electrode surrounding a periphery of the first gate dielectric film, a second gate dielectric film surrounding a part of a periphery of the first gate electrode, a first arc-shaped semiconductor layer in contact with a part of a periphery of the second gate dielectric film, a first first-conductivetype high-concentration semiconductor layer arranged on a top of the first island-shaped semiconductor layer, a second first-conductive-type high-concentration semiconductor layer arranged underneath the first island-shaped semiconductor layer, a first second-conductive-type high-concentration semiconductor layer arranged on a top of the first arc-shaped semiconductor layer, and a second second-conductive-type high-concentration semiconductor layer arranged underneath the first arc-shaped semiconductor layer; a second inverter arranged at an intersection of the 2nd row and the 2nd column, wherein the second inverter includes a second island-shaped semiconductor layer, a third gate dielectric film surrounding a periphery of the second island-shaped semiconductor layer, a second gate electrode surrounding a periphery of the third gate dielectric film, a fourth gate dielectric film surrounding a part of a periphery of the second gate electrode, a second arc-shaped semiconductor layer in contact with a part of a periphery of the fourth gate dielectric film, a third first-conductive-type high-concentration semiconductor layer arranged on a top of the second island-shaped semiconductor layer, a fourth first-conductive-type high-concentration semiconductor layer arranged underneath the second island-shaped semiconductor layer, a third second-conductive-type high-concentration semiconductor layer arranged on a top of the second arc-shaped semiconductor layer, and a fourth second-conductive-type high-concentration semiconductor layer arranged underneath the second arc-shaped semiconductor layer; a first selection transistor arranged at an intersection of the 1st row and the 2nd column, wherein the first selection transistor includes a third island-shaped semiconductor layer, a fifth gate dielectric film surrounding a periphery of the third island-shaped semiconductor layer, a third gate electrode surrounding a periphery of the fifth gate dielectric film, a fifth second-conductive-type high-concentration semiconductor layer arranged on a top of the third island-shaped semiconductor layer, and a sixth second-conductive-type high-concentration semiconductor layer arranged underneath the third island-shaped semiconductor layer; and a second selection transistor arranged at an intersection of the 2nd row and the 1st column, wherein the second selection transistor includes a fourth island-shaped semiconductor layer, a sixth gate dielectric film surrounding a periphery of the fourth island-shaped semiconductor layer, a fourth gate electrode surrounding a periphery of the sixth gate dielectric film, a seventh second-conductive-type high-concentration semiconductor layer arranged on a top of the fourth island-shaped semiconductor layer, and an eighth second-conductive-type high-concentration semiconductor layer arranged underneath the fourth island-shaped semiconductor layer.

According to a third aspect of the present invention, there is provided a semiconductor device which comprises: a first inverter arranged at an intersection of the 1st row and the 1st column, wherein the first inverter includes a first island-shaped semiconductor layer, a first gate dielectric film surrounding a periphery of the first island-shaped semiconductor layer, a first gate electrode surrounding a periphery of the first gate dielectric film, a second gate dielectric film surrounding a part of a periphery of the first gate electrode, a first arc-shaped semiconductor layer in contact with a part of a periphery of the second gate dielectric film, a first first-conductive-type high-concentration semiconductor layer arranged on a top of the first island-shaped semiconductor layer, a second first-conductive-type high-concentration semiconductor layer arranged underneath the first island-shaped semiconductor layer, a first second-conductive-type high-concentration semiconductor layer arranged on a top of the first arc-shaped semiconductor layer, and a second second-conductive-type high-concentration semiconductor layer arranged underneath the first arc-shaped semiconductor layer; a second inverter arranged at an intersection of the 2nd row and the 2nd column, wherein the second inverter includes a second island-shaped semiconductor layer, a third gate dielectric film surrounding a periphery of the second island-shaped semiconductor layer, a second gate electrode surrounding a periphery of the third gate dielectric film, a fourth gate dielectric film surrounding a part of a periphery of the second gate electrode, a second arc-shaped semiconductor layer in contact with a part of a periphery of the fourth gate dielectric film, a third first-conductive-type high-concentration semiconductor layer arranged on a top of the second island-shaped semiconductor layer, a fourth first-conductive-type high-concentration semiconductor layer arranged underneath the second island-shaped semiconductor layer, a third second-conductive-type high-concentration semiconductor layer arranged on a top of the second arc-shaped semiconductor layer, and a fourth second-conductive-type high-concentration semiconductor layer arranged underneath the second arc-shaped semiconductor layer; a first selection transistor arranged at an intersection of the 1st row and the 2nd column, wherein the first selection transistor includes a third island-shaped semiconductor layer, a fifth gate dielectric film surrounding a periphery of the third island-shaped semiconductor layer, a third gate electrode surrounding a periphery of the fifth gate dielectric film, a fifth second-conductive-type high-concentration semiconductor layer arranged on a top of the third island-shaped semiconductor layer, and a sixth second-conductive-type high-concentration semiconductor layer arranged underneath the third island-shaped semiconductor layer; a second selection transistor arranged at an intersection of the 2nd row and the 1st column, wherein the second selection transistor includes a fourth island-shaped semiconductor layer, a sixth gate dielectric film surrounding a periphery of the fourth island-shaped semiconductor layer, a fourth gate electrode surrounding a periphery of the sixth gate dielectric film, a seventh second-conductive-type high-concentration semiconductor layer arranged on a top of the fourth island-shaped semiconductor layer, and an eighth second-conductive-type high-concentration semiconductor layer arranged underneath the fourth island-shaped semiconductor layer; a fifth first-conductive-type high-concentration semiconductor layer arranged underneath the second first-conductive-type high-concentration semiconductor layer, the second second-conductive-type high-concentration semiconductor layer and the eighth second-conductive-type high-concentration semiconductor layer; a sixth first-conductive-type high-concentration semiconductor layer arranged underneath the fourth first-conductive-type high-concentration semiconductor layer, the fourth second-conductive-type high-concentration semiconductor layer and the sixth second-conductive-type high-concentration semiconductor layer; a first semiconductor-metal compound layer formed on a part of respective sidewalls of the second second-conductive-type high-concentration semiconductor layer and the fifth first-conductive-type high-concentration semiconductor layer; a second semiconductor-metal compound layer formed on the eighth second-conductive-type high-concentration semiconductor layer and the fifth first-conductive-type high-concentration semiconductor layer; a third semiconductor-metal compound layer formed on a part of respective sidewalls of the fourth second-conductive-type high-concentration semiconductor layer and the sixth first-conductive-type high-concentration semiconductor layer; a fourth semiconductor-metal compound layer formed on the sixth second-conductive-type high-concentration semiconductor layer and the sixth first-conductive-type high-concentration semiconductor layer; a fifth semiconductor-metal compound layer formed on the first first-conductive-type high-concentration semiconductor layer; a sixth semiconductor-metal compound layer formed on the first second-conductive-type high-concentration semiconductor layer; a seventh semiconductor-metal compound layer formed on the third first-conductive-type high-concentration semiconductor layer; an eighth semiconductor-metal compound layer formed on the third second-conductive-type high-concentration semiconductor layer; a ninth semiconductor-metal compound layer formed on the fifth second-conductive-type high-concentration semiconductor layer; a tenth semiconductor-metal compound layer formed on the seventh second-conductive-type high-concentration semiconductor layer; a first contact connecting the first gate electrode and the fourth semiconductor-metal compound layer; and a second contact connecting the second gate electrode and the second semiconductor-metal compound layer.

According to a fourth aspect of the present invention, there is provided a semiconductor device which comprises: a first inverter arranged at an intersection of the 1st row and the 1st column, wherein the first inverter includes a first island-shaped semiconductor layer, a first gate dielectric film surrounding a periphery of the first island-shaped semiconductor layer, a first gate electrode surrounding a periphery of the first gate dielectric film, a second gate dielectric film surrounding a part of a periphery of the first gate electrode, a first arc-shaped semiconductor layer in contact with a part of a periphery of the second gate dielectric film, a first p+-type semiconductor layer arranged on a top of the first island-shaped semiconductor layer, a second p+-type semiconductor layer arranged underneath the first island-shaped semiconductor layer, a first n+-type semiconductor layer arranged on a top of the first arc-shaped semiconductor layer and a second n+-type semiconductor layer arranged underneath the first arc-shaped semiconductor layer; a second inverter arranged at an intersection of the 2nd row and the 2nd column, wherein the second inverter includes a second island-shaped semiconductor layer, a third gate dielectric film surrounding a periphery of the second island-shaped semiconductor layer, a second gate electrode surrounding a periphery of the third gate dielectric film, a fourth gate dielectric film surrounding a part of a periphery of the second gate electrode, a second arc-shaped semiconductor layer in contact with a part of a periphery of the fourth gate dielectric film, a third p+-type semiconductor layer arranged on a top of the second island-shaped semiconductor layer, a fourth p+-type semiconductor layer arranged underneath the second island-shaped semiconductor layer, a third n+-type semiconductor layer arranged on a top of the second arc-shaped semiconductor layer, and a fourth n+-type semiconductor layer arranged underneath the second arc-shaped semiconductor layer; a first selection transistor arranged at an intersection of the 1st row and the 2nd column, wherein the first selection transistor includes a third island-shaped semiconductor layer, a fifth gate dielectric film surrounding a periphery of the third island-shaped semiconductor layer, a third gate electrode surrounding a periphery of the fifth gate dielectric film, a fifth n+-type semiconductor layer arranged on a top of the third island-shaped semiconductor layer, and a sixth n+-type semiconductor layer arranged underneath the third island-shaped semiconductor layer; and a second selection transistor arranged at an intersection of the 2nd row and the 1st column, wherein the second selection transistor includes a fourth island-shaped semiconductor layer, a sixth gate dielectric film surrounding a periphery of the fourth island-shaped semiconductor layer, a fourth gate electrode surrounding a periphery of the sixth gate dielectric film, a seventh n+-type semiconductor layer arranged on a top of the fourth island-shaped semiconductor layer, and an eighth n+-type semiconductor layer arranged underneath the fourth island-shaped semiconductor layer.

According to a fifth aspect of the present invention, there is provided a semiconductor device which comprises: a first inverter arranged at an intersection of the 1st row and the 1st column, wherein the first inverter includes a first island-shaped semiconductor layer, a first gate dielectric film surrounding a periphery of the first island-shaped semiconductor layer, a first gate electrode surrounding a periphery of the first gate dielectric film, a second gate dielectric film surrounding a part of a periphery of the first gate electrode, a first arc-shaped semiconductor layer in contact with a part of a periphery of the second gate dielectric film, a first p+-type semiconductor layer arranged on a top of the first island-shaped semiconductor layer, a second p+-type semiconductor layer arranged underneath the first island-shaped semiconductor layer, a first n+-type semiconductor layer arranged on a top of the first arc-shaped semiconductor layer and a second n+-type semiconductor layer arranged underneath the first arc-shaped semiconductor layer; a second inverter arranged at an intersection of the 2nd row and the 2nd column, wherein the second inverter includes a second island-shaped semiconductor layer, a third gate dielectric film surrounding a periphery of the second island-shaped semiconductor layer, a second gate electrode surrounding a periphery of the third gate dielectric film, a fourth gate dielectric film surrounding a part of a periphery of the second gate electrode, a second arc-shaped semiconductor layer in contact with a part of a periphery of the fourth gate dielectric film, a third p+-type semiconductor layer arranged on a top of the second island-shaped semiconductor layer, a fourth p+-type semiconductor layer arranged underneath the second island-shaped semiconductor layer, a third n+-type semiconductor layer arranged on a top of the second arc-shaped semiconductor layer, and a fourth n+-type semiconductor layer arranged underneath the second arc-shaped semiconductor layer; a first selection transistor arranged at an intersection of the 1st row and the 2nd column, wherein the first selection transistor includes a third island-shaped semiconductor layer, a fifth gate dielectric film surrounding a periphery of the third island-shaped semiconductor layer, a third gate electrode surrounding a periphery of the fifth gate dielectric film, a fifth n+-type semiconductor layer arranged on a top of the third island-shaped semiconductor layer, and a sixth n+-type semiconductor layer arranged underneath the third island-shaped semiconductor layer; a second selection transistor arranged at an intersection of the 2nd row and the 1st column, wherein the second selection transistor includes a fourth island-shaped semiconductor layer, a sixth gate dielectric film surrounding a periphery of the fourth island-shaped semiconductor layer, a fourth gate electrode surrounding a periphery of the sixth gate dielectric film, a seventh n+-type semiconductor layer arranged on a top of the fourth island-shaped semiconductor layer, and an eighth n+-type semiconductor layer arranged underneath the fourth island-shaped semiconductor layer; a fifth p+-type semiconductor layer arranged underneath the second p+-type semiconductor layer, the second n+-type semiconductor layer and the eighth n+-type semiconductor layer; a sixth p+-type semiconductor layer arranged underneath the fourth p+-type semiconductor layer, the fourth n+-type semiconductor layer and the sixth n+-type semiconductor layer; a first semiconductor-metal compound layer formed on a part of respective sidewalls of the second n+-type semiconductor layer and the fifth p+-type semiconductor layer; a second semiconductor-metal compound layer formed on the eighth n+-type semiconductor layer and the fifth p+-type semiconductor layer; a third semiconductor-metal compound layer formed on a part of respective sidewalls of the fourth n+-type semiconductor layer and the sixth p+-type semiconductor layer; a fourth semiconductor-metal compound layer formed on the sixth n+-type semiconductor layer and the sixth p+-type semiconductor layer; a fifth semiconductor-metal compound layer formed on the first p+-type semiconductor layer; a sixth semiconductor-metal compound layer formed on the first n+-type semiconductor layer; a seventh semiconductor-metal compound layer formed on the third p+-type semiconductor layer; an eighth semiconductor-metal compound layer formed on the third n+-type semiconductor layer; a ninth semiconductor-metal compound layer formed on the fifth n+-type semiconductor layer; a tenth semiconductor-metal compound layer formed on the seventh n+-type semiconductor layer; a first contact connecting the first gate electrode and the fourth semiconductor-metal compound layer; and a second contact connecting the second gate electrode and the second semiconductor-metal compound layer.

Preferably, the semiconductor device of the present invention is configured to satisfy the following condition: $Wp1 \approx 2Wn1$, wherein $Wp1$ is an outer peripheral length of the first island-shaped semiconductor layer, and $Wn1$ is a length of an arc of the first arc-shaped semiconductor layer in contact with a part of the periphery of the second gate dielectric film.

Preferably, the semiconductor device of the present invention is configured to satisfy the following condition: $Wp2 \approx 2Wn2$, wherein $Wp2$ is an outer peripheral length of the second island-shaped semiconductor layer, and $Wn2$ is a length of an arc of the second arc-shaped semiconductor layer in contact with a part of the periphery of the fourth gate dielectric film.

Preferably, the semiconductor device of the present invention is configured to satisfy the following condition: $Ln1 \approx Lp1$, wherein $Ln1$ is a channel length of the first arc-shaped semiconductor layer, and $Lp1$ is a channel length of the first island-shaped semiconductor layer.

Preferably, the semiconductor device of the present invention is configured to satisfy the following condition: $Ln2 \approx Lp2$, wherein $Ln2$ is a channel length of the second arc-shaped semiconductor layer, and $Lp2$ is a channel length of the second island-shaped semiconductor layer.

Preferably, in the semiconductor device of the present invention, a first pMOS transistor, a first nMOS transistor, a second pMOS transistor and a second nMOS transistor are made up of a combination of the first island-shaped semiconductor layer, the first gate dielectric film surrounding the periphery of the first island-shaped semiconductor layer, the first gate electrode surrounding the periphery of the first gate dielectric film, the first p+-type semiconductor layer arranged on the top of the first island-shaped semiconductor layer, and the second p+-type semiconductor layer arranged underneath the first island-shaped semiconductor layer, a combination of the first gate electrode, the second gate dielectric film surrounding a part of the periphery of the first gate electrode, the first arc-shaped semiconductor layer in contact with a part of a periphery of the second gate dielectric film, a first n+-type semiconductor layer arranged on the top of the first arc-shaped semiconductor layer, and the second n+-type semiconductor layer arranged underneath the first arc-shaped semiconductor layer, a combination of the second island-shaped semiconductor layer, the third gate dielectric film surrounding the periphery of the second island-shaped semiconductor layer, the second gate electrode surrounding the periphery of the third gate dielectric film, the third p+-type semiconductor layer arranged on the top of the second island-shaped semiconductor layer, and the fourth p+-type semiconductor layer arranged underneath the second island-shaped semiconductor layer, and a combination of the second gate electrode, the fourth gate dielectric film surrounding a part of the periphery of the second gate electrode, the second arc-shaped semiconductor layer in contact with a part of the periphery of the fourth gate dielectric film, the third n+-type semiconductor layer arranged on the top of the second arc-shaped semiconductor layer, and the fourth n+-type semiconductor layer arranged underneath the second arc-shaped semiconductor layer, respectively, wherein: the first gate dielectric film is adapted to allow the first pMOS transistor to operate as an enhancement type; the second gate dielectric film is adapted to allow the first nMOS transistor to operate as an enhancement type; the first electrode is made of a material allowing the first pMOS transistor and the first nMOS transistor to operate as an enhancement type; the third gate dielectric film is adapted to allow the second nMOS transistor to operate as an enhancement type, and the first electrode is made of a material allowing the second pMOS transistor and the second nMOS transistor to operate as an enhancement type.

Preferably, in the semiconductor device according to the fifth aspect of the present invention, each of the first to tenth semiconductor-metal compound layers is a silicon-metal compound layer.

In the semiconductor device of the present invention, the first island-shaped semiconductor layer, the first arc-shaped semiconductor layer, the second island-shaped semiconductor layer, the second arc-shaped semiconductor layer, the third island-shaped semiconductor layer and the fourth island-shaped semiconductor layer may be a first island-shaped silicon layer, a first arc-shaped silicon layer, a second island-shaped silicon layer, a second arc-shaped silicon layer, a third island-shaped silicon layer and a fourth island-shaped silicon layer, respectively. Further, each of the n+-type semiconductor layers may be a p+-type silicon layer, and each of the p+-type semiconductor layers may be a p+-type silicon layer.

Preferably, in the above semiconductor device, the first island-shaped silicon layer, the first arc-shaped silicon layer, the second island-shaped silicon layer, the second arc-shaped silicon layer, the third island-shaped silicon layer and the fourth island-shaped silicon layer are a first n-type or non-doped island-shaped silicon layer, a first p-type or non-doped arc-shaped silicon layer, a second n-type or non-doped island-shaped silicon layer, a second p-type or non-doped arc-shaped silicon layer, a third p-type or non-doped island-shaped silicon layer and a fourth p-type or non-doped island-shaped silicon layer, respectively.

As above, the semiconductor device according to the first aspect of the present invention comprises: a first inverter arranged at an intersection of the 1st row and the 1st column, wherein the first inverter includes a first island-shaped semiconductor layer, a first gate dielectric film in contact with at least a part of a periphery of the first island-shaped semiconductor layer, a first gate electrode having one surface in contact with the first gate dielectric film, a second gate dielectric film in contact with another surface of the first gate electrode, a first arc-shaped semiconductor layer in contact with at least a part of the second gate dielectric film, a first first-conductive-type high-concentration semiconductor layer arranged on a top of the first island-shaped semiconductor layer, a second first-conductive-type high-concentration semiconductor layer arranged underneath the first island-shaped semiconductor layer, a first second-conductive-type high-concentration semiconductor layer arranged on a top of the first arc-shaped semiconductor layer, and a second second-conductive-type high-concentration semiconductor layer arranged underneath the first arc-shaped semiconductor layer; a second inverter arranged at an intersection of the 2nd row and the 2nd column, wherein the second inverter includes a second island-shaped semiconductor layer, a third gate dielectric film in contact with at least a part of a periphery of the second island-shaped semiconductor layer, a second gate electrode having one surface in contact with the third gate dielectric film, a fourth gate dielectric film in contact with another surface of the second gate electrode, a second arc-shaped semiconductor layer in contact with at least a part of the fourth gate dielectric film, a third first-conductive-type high-concentration semiconductor layer arranged on a top of the second island-shaped semiconductor layer, a fourth first-conductive-type high-concentration semiconductor layer arranged underneath the second island-shaped semiconductor layer, a third second-conductive-type high-concentration semiconductor layer arranged on a top of the second arc-shaped semiconductor layer, and a fourth second-conductive-type high-concentration semiconductor layer arranged underneath the second arc-shaped semiconductor layer; a first selection transistor arranged at an intersection of the 1st row and the 2nd column, wherein the first selection transistor includes a third island-shaped semiconductor layer, a fifth gate dielectric film in contact with at least a part of a periphery of the third island-shaped semiconductor layer, a third gate electrode partially in contact with the fifth gate dielectric film, a fifth second-conductive-type high-concentration semiconductor layer arranged on a top of the third island-shaped semiconductor layer, and a sixth second-conductive-type high-concentration semiconductor layer arranged underneath the third island-shaped semiconductor layer; and a second selection transistor arranged at an intersection of the 2nd row and the 1st column, wherein the second selection transistor includes a fourth island-shaped semiconductor layer, a sixth gate dielectric film in contact with at least a part of a periphery of the fourth island-shaped semiconductor layer, a fourth gate electrode partially in contact with the sixth gate dielectric film, a seventh second-conductive-type high-concentration semiconductor layer arranged on a top of the fourth island-shaped semiconductor layer, and an eighth second-conductive-type high-concentration semiconductor layer arranged underneath the fourth island-shaped semiconductor layer. This makes it possible to provide a semiconductor device comprising a highly-integrated SGT-based SRAM.

The semiconductor device according to the second aspect of the present invention comprises: a first inverter arranged at an intersection of the 1st row and the 1st column, wherein the first inverter includes a first island-shaped semiconductor layer, a first gate dielectric film surrounding a periphery of the first island-shaped semiconductor layer, a first gate electrode surrounding a periphery of the first gate dielectric film, a second gate dielectric film surrounding a part of a periphery of the first gate electrode, a first arc-shaped semiconductor layer in contact with a part of a periphery of the second gate dielectric film, a first first-conductive-type high-concentration semiconductor layer arranged on a top of the first island-shaped semiconductor layer, a second first-conductive-type high-concentration semiconductor layer arranged underneath the first island-shaped semiconductor layer, a first second-conductive-type high-concentration semiconductor layer arranged on a top of the first arc-shaped semiconductor layer, and a second second-conductive-type high-concentration semiconductor layer arranged underneath the first arc-shaped semiconductor layer; a second inverter arranged at an intersection of the 2nd row and the 2nd column, wherein the second inverter includes a second island-shaped semiconductor layer, a third gate dielectric film surrounding a periphery of the second island-shaped semiconductor layer, a second gate electrode surrounding a periphery of the third gate dielectric film, a fourth gate dielectric film surrounding a part of a periphery of the second gate electrode, a second arc-shaped semiconductor layer in contact with a part of a periphery of the fourth gate dielectric film, a third first-conductive-type high-concentration semiconductor layer arranged on a top of the second island-shaped semiconductor layer, a fourth first-conductive-type high-concentration semiconductor layer arranged underneath the second island-shaped semiconductor layer, a third second-conductive-type high-concentration semiconductor layer arranged on a top of the second arc-shaped semiconductor layer, and a fourth second-conductive-type high-concentration semiconductor layer arranged underneath the second arc-shaped semiconductor layer; a first selection transistor arranged at an intersection of the 1st row and the 2nd column, wherein the first selection transistor includes a third island-shaped semiconductor layer, a fifth gate dielectric film surrounding a periphery of the third island-shaped semiconductor layer, a third gate electrode surrounding a periphery of the fifth gate dielectric film, a fifth second-conductive-type high-concentration semiconductor layer arranged on a top of the third island-shaped semiconductor layer, and a sixth second-conductive-type high-concentration semiconductor layer arranged underneath the third island-shaped semiconductor layer; and a second selection transistor arranged at an intersection of the 2nd row and the 1st column, wherein the second selection transistor includes a fourth island-shaped semiconductor layer, a sixth gate dielectric film surrounding a periphery of the fourth island-shaped semiconductor layer, a fourth gate electrode surrounding a periphery of the sixth gate dielectric film, a seventh second-conductive-type high-concentration semiconductor layer arranged on a top of the fourth island-shaped semiconductor layer, and an eighth second-conductive-type high-concentration semiconductor layer arranged underneath the fourth island-shaped semiconductor layer. This makes it possible to provide a semiconductor device comprising a highly-integrated SGT-based SRAM.

The semiconductor device according to the third aspect of the present invention comprises: a first inverter arranged at an intersection of the 1st row and the 1st column, wherein the first inverter includes a first island-shaped semiconductor layer, a first gate dielectric film surrounding a periphery of the first island-shaped semiconductor layer, a first gate electrode surrounding a periphery of the first gate dielectric film, a second gate dielectric film surrounding a part of a periphery of the first gate electrode, a first arc-shaped semiconductor layer in contact with a part of a periphery of the second gate dielectric film, a first first-conductive-type high-concentration semiconductor layer arranged on a top of the first island-shaped semiconductor layer, a second first-conductive-type high-concentration semiconductor layer arranged underneath the first island-shaped semiconductor layer, a first second-conductive-type high-concentration semiconductor layer arranged on a top of the first arc-shaped semiconductor layer, and a second second-conductive-type high-concentration semiconductor layer arranged underneath the first arc-shaped semiconductor layer; a second inverter arranged at an intersection of the 2nd row and the 2nd column, wherein the second inverter includes a second island-shaped semiconductor layer, a third gate dielectric film surrounding a periphery of the second island-shaped semiconductor layer, a second gate electrode surrounding a periphery of the third gate dielectric film, a fourth gate dielectric film surrounding a part of a periphery of the second gate electrode, a second arc-shaped semiconductor layer in contact with a part of a periphery of the fourth gate dielectric film, a third first-conductive-type high-concentration semiconductor layer arranged on a top of the second island-shaped semiconductor layer, a fourth first-conductive-type high-concentration semiconductor layer arranged underneath the second island-shaped semiconductor layer, a third second-conductive-type high-concentration semiconductor layer arranged on a top of the second arc-shaped semiconductor layer, and a fourth second-conductive-type high-concentration semiconductor layer arranged underneath the second arc-shaped semiconductor layer; a first selection transistor arranged at an intersection of the 1st row and the 2nd column, wherein the first selection transistor includes a third island-shaped semiconductor layer, a fifth gate dielectric film surrounding a periphery of the third island-shaped semiconductor layer, a third gate electrode surrounding a periphery of the fifth gate dielectric film, a fifth second-conductive-type high-concentration semiconductor layer arranged on a top of the third island-shaped semiconductor layer, and a sixth second-conductive-type high-concentration semiconductor layer arranged underneath the third island-shaped semiconductor layer; a second selection transistor arranged at an intersection of the 2nd row and the 1st column, wherein the second selection transistor includes a fourth island-shaped semiconductor layer, a sixth gate dielectric film surrounding a periphery of the fourth island-shaped semiconductor layer, a fourth gate electrode surrounding a periphery of the sixth gate dielectric film, a seventh second-conductive-type high-concentration semiconductor layer arranged on a top of the fourth island-shaped semiconductor layer, and an eighth second-conductive-type high-concentration semiconductor layer arranged underneath the fourth island-shaped semiconductor layer; a fifth first-conductive-type high-concentration semiconductor layer arranged underneath the second first-conductive-type high-concentration semiconductor layer, the second second-conductive-type high-concentration semiconductor layer and the eighth second-conductive-type high-concentration semiconductor layer; a sixth first-conductive-type high-concentration semiconductor layer arranged underneath the fourth first-conductive-type high-concentration semiconductor layer, the fourth second-conductive-type high-concentration semiconductor layer and the sixth second-conductive-type high-concentration semiconductor layer; a first semiconductor-metal compound layer formed on a part of respective sidewalls of the second second-conductive-type high-concentration semiconductor layer and the fifth first-conductive-type high-concentration semiconductor layer; a second semiconductor-metal compound layer formed on the eighth second-conductive-type high-concentration semiconductor layer and the fifth first-conductive-type high-concentration semiconductor layer; a third semiconductor-metal compound layer formed on a part of respective sidewalls of the fourth second-conductive-type high-concentration semiconductor layer and the sixth first-conductive-type high-concentration semiconductor layer; a fourth semiconductor-metal compound layer formed on the sixth second-conductive-type high-concentration semiconductor layer and the sixth first-conductive-type high-concentration semiconductor layer; a fifth semiconductor-metal compound layer formed on the first first-conductive-type high-concentration semiconductor layer; a sixth semiconductor-metal compound layer formed on the first second-conductive-type high-concentration semiconductor layer; a seventh semiconductor-metal compound layer formed on the third first-conductive-type high-concentration semiconductor layer; an eighth semiconductor-metal compound layer formed on the third second-conductive-type high-concentration semiconductor layer; a ninth semiconductor-metal compound layer formed on the fifth second-conductive-type high-concentration semiconductor layer; a tenth semiconductor-metal compound layer formed on the seventh second-conductive-type high-concentration semiconductor layer; a first contact connecting the first gate electrode and the fourth semiconductor-metal compound layer; and a second contact connecting the second gate electrode and the second semiconductor-metal compound layer. This makes it possible to provide a semiconductor device comprising a highly-integrated SGT-based SRAM.

The semiconductor device according to the fourth aspect of the present invention comprises: a first inverter arranged at an intersection of the 1st row and the 1st column, wherein the first inverter includes a first island-shaped semiconductor layer, a first gate dielectric film surrounding a periphery of the first island-shaped semiconductor layer, a first gate electrode surrounding a periphery of the first gate dielectric film, a second gate dielectric film surrounding a part of a periphery of the first gate electrode, a first arc-shaped semiconductor layer in contact with a part of a periphery of the second gate dielectric film, a first p+-type semiconductor layer arranged on a top of the first island-shaped semiconductor layer, a second p+-type semiconductor layer arranged underneath the first island-shaped semiconductor layer, a first n+-type semiconductor layer arranged on a top of the first arc-shaped semiconductor layer and a second n+-type semiconductor layer arranged underneath the first arc-shaped semiconductor layer; a second inverter arranged at an intersection of the 2nd row and the 2nd column, wherein the second inverter includes a second island-shaped semiconductor layer, a third gate dielectric film surrounding a periphery of the second island-shaped semiconductor layer, a second gate electrode surrounding a periphery of the third gate dielectric film, a fourth gate dielectric film surrounding a part of a periphery of the second gate electrode, a second arc-shaped semiconductor layer in contact with a part of a periphery of the fourth gate dielectric film, a third p+-type semiconductor layer arranged on a top of the second island-shaped semiconductor layer, a fourth p+-type semiconductor layer arranged underneath the second island-shaped semiconductor layer, a third n+-type semiconductor layer arranged on a top of the second arc-shaped semiconductor layer, and a fourth n+-type semiconductor layer arranged underneath the second arc-shaped semiconductor layer; a first selection transistor arranged at an intersection of the 1st row and the 2nd column, wherein the first selection transistor includes a third island-shaped semiconductor layer, a fifth gate dielectric film surrounding a periphery of the third island-shaped semiconductor layer, a third gate electrode surrounding a periphery of the fifth gate dielectric film, a fifth n+-type semiconductor layer arranged on a top of the third island-shaped semiconductor layer, and a sixth n+-type semiconductor layer arranged underneath the third island-shaped semiconductor layer; and a second selection transistor arranged at an intersection of the 2nd row and the 1st column, wherein the second selection transistor includes a fourth island-shaped semiconductor layer, a sixth gate dielectric film surrounding a periphery of the fourth island-shaped semiconductor layer, a fourth gate electrode surrounding a periphery of the sixth gate dielectric film, a seventh n+-type semiconductor layer arranged on a top of the fourth island-shaped semiconductor layer, and an eighth n+-type semiconductor layer arranged underneath the fourth island-shaped semiconductor layer. This makes it possible to provide a semiconductor device comprising a highly-integrated SGT-based SRAM.

The semiconductor device according to the fifth aspect of the present invention comprises: a first inverter arranged at an intersection of the 1st row and the 1st column, wherein the first inverter includes a first island-shaped semiconductor layer, a first gate dielectric film surrounding a periphery of the first island-shaped semiconductor layer, a first gate electrode surrounding a periphery of the first gate dielectric film, a second gate dielectric film surrounding a part of a periphery of the first gate electrode, a first arc-shaped semiconductor layer in contact with a part of a periphery of the second gate dielectric film, a first p+-type semiconductor layer arranged on a top of the first island-shaped semiconductor layer, a second p+-type semiconductor layer arranged underneath the first island-shaped semiconductor layer, a first n+-type semiconductor layer arranged on a top of the first arc-shaped semiconductor layer and a second n+-type semiconductor layer arranged underneath the first arc-shaped semiconductor layer; a second inverter arranged at an intersection of the 2nd row and the 2nd column, wherein the second inverter includes a second island-shaped semiconductor layer, a third gate dielectric film surrounding a periphery of the second island-shaped semiconductor layer, a second gate electrode surrounding a periphery of the third gate dielectric film, a fourth gate dielectric film surrounding a part of a periphery of the second gate electrode, a second arc-shaped semiconductor layer in contact with a part of a periphery of the fourth gate dielectric film, a third p+-type semiconductor layer arranged on a top of the second island-shaped semiconductor layer, a fourth p+-type semiconductor layer arranged underneath the second island-shaped semiconductor layer, a third n+-type semiconductor layer arranged on a top of the second arc-shaped semiconductor layer, and a fourth n+-type semiconductor layer arranged underneath the second arc-shaped semiconductor layer; a first selection transistor arranged at an intersection of the 1st row and the 2nd column, wherein the first selection transistor includes a third island-shaped semiconductor layer, a fifth gate dielectric film surrounding a periphery of the third island-shaped semiconductor layer, a third gate electrode surrounding a periphery of the fifth gate dielectric film, a fifth n+-type semiconductor layer arranged on a top of the third island-shaped semiconductor layer, and a sixth n+-type semiconductor layer arranged underneath the third island-shaped semiconductor layer; a second selection transistor arranged at an intersection of the 2nd row and the 1st column, wherein the second selection transistor includes a fourth island-shaped semiconductor layer, a sixth gate dielectric film surrounding a periphery of the fourth island-shaped semiconductor layer, a fourth gate electrode surrounding a periphery of the sixth gate dielectric film, a seventh n+-type semiconductor layer arranged on a top of the fourth island-shaped semiconductor layer, and an eighth n+-type semiconductor layer arranged underneath the fourth island-shaped semiconductor layer; a fifth p+-type semiconductor layer arranged underneath the second p+-type semiconductor layer, the second n+-type semiconductor layer and the eighth n+-type semiconductor layer; a sixth p+-type semiconductor layer arranged underneath the fourth p+-type semiconductor layer, the fourth n+-type semiconductor layer and the sixth n+-type semiconductor layer; a first semiconductor-metal compound layer formed on a part of respective sidewalls of the second n+-type semiconductor layer and the fifth p+-type semiconductor layer; a second semiconductor-metal compound layer formed on the eighth n+-type semiconductor layer and the fifth p+-type semiconductor layer; a third semiconductor-metal compound layer formed on a part of respective sidewalls of the fourth n+-type semiconductor layer and the sixth p+-type semiconductor layer; a fourth semiconductor-metal compound layer formed on the sixth n+-type semiconductor layer and the sixth p+-type semiconductor layer; a fifth semiconductor-metal compound layer formed on the first p+-type semiconductor layer; a sixth semiconductor-metal compound layer formed on the first n+-type semiconductor layer; a seventh semiconductor-metal compound layer formed on the third p+-type semiconductor layer; an eighth semiconductor-metal compound layer formed on the third n+-type semiconductor layer; a ninth semiconductor-metal compound layer formed on the fifth n+-type semiconductor layer; a tenth semiconductor-metal compound layer formed on the seventh n+-type semiconductor layer; a first contact connecting the first gate electrode and the fourth semiconductor-metal compound layer; and a second contact connecting the second gate electrode and the second semiconductor-metal compound layer. This makes it possible to provide a semiconductor device comprising a highly-integrated SGT-based SRAM.

In a preferred embodiment of the present invention, the semiconductor device is configured to satisfy the following condition: $Wp1 \approx 2Wn1$, wherein $Wp1$ is an outer peripheral length of the first island-shaped semiconductor layer, and $Wn1$ is a length of an arc of the first arc-shaped semiconductor layer in contact with a part of the periphery of the second gate dielectric film. In this case, a gate length of a pMOS transistor can be set to be twice as large as that of an nMOS transistor. This makes it possible to provide a semiconductor device comprising a highly-integrated SGT-based SRAM.

In a preferred embodiment of the present invention, the semiconductor device is configured to satisfy the following condition: $Wp2 \approx 2Wn2$, wherein $Wp2$ is an outer peripheral length of the second island-shaped semiconductor layer, and $Wn2$ is a length of an arc of the second arc-shaped semiconductor layer in contact with a part of the periphery of the fourth gate dielectric film. In this case, a gate length of a pMOS transistor can be set to be twice as large as that of an nMOS transistor. This makes it possible to provide a semiconductor device comprising a highly-integrated SGT-based SRAM.

In a preferred embodiment of the present invention, the semiconductor device is configured to satisfy the following condition: $Ln1 \approx Lp1$, wherein $Ln1$ is a channel length of the first arc-shaped semiconductor layer, and $Lp1$ is a channel length of the first island-shaped semiconductor layer. This makes it possible to provide a semiconductor device comprising a highly-integrated SGT-based SRAM In a preferred embodiment of the present invention, the semiconductor device is configured to satisfy the following condition: $Ln2 \approx Lp2$, wherein $Ln2$ is a channel length of the second arc-shaped semiconductor layer, and $Lp2$ is a channel length of the second island-shaped semiconductor layer. This makes it possible to provide a semiconductor device comprising a highly-integrated SGT-based SRAM.

In a preferred embodiment of the present invention, a first pMOS transistor, a first nMOS transistor, a second pMOS transistor and a second nMOS transistor are made up of a combination of the first island-shaped semiconductor layer, the first gate dielectric film surrounding the periphery of the first island-shaped semiconductor layer, the first gate electrode surrounding the periphery of the first gate dielectric film, the first p+-type semiconductor layer arranged on the top of the first island-shaped semiconductor layer, and the second p+-type semiconductor layer arranged underneath the first island-shaped semiconductor layer, a combination of the first gate electrode, the second gate dielectric film surrounding a part of the periphery of the first gate electrode, the first arc-shaped semiconductor layer in contact with a part of a periphery of the second gate dielectric film, a first n+-type semiconductor layer arranged on the top of the first arc-shaped semiconductor layer, and the second n+-type semiconductor layer arranged underneath the first arc-shaped semiconductor layer, a combination of the second island-shaped semiconductor layer, the third gate dielectric film surrounding the periphery of the second island-shaped semiconductor layer, the second gate electrode surrounding the periphery of the third gate dielectric film, the third p+-type semiconductor layer arranged on the top of the second island-shaped semiconductor layer, and the fourth p+-type semiconductor layer arranged underneath the second island-shaped semiconductor layer, and a combination of the second gate electrode, the fourth gate dielectric film surrounding a part of the periphery of the second gate electrode, the second arc-shaped semiconductor layer in contact with a part of the periphery of the fourth gate dielectric film, the third n+-type semiconductor layer arranged on the top of the second arc-shaped semiconductor layer, and the fourth n+-type semiconductor layer arranged underneath the second arc-shaped semiconductor layer, respectively, wherein: the first gate dielectric film is adapted to allow the first pMOS transistor to operate as an enhancement type; the second gate dielectric film is adapted to allow the first nMOS transistor to operate as an enhancement type; the first electrode is made of a material allowing the first pMOS transistor and the first nMOS transistor to operate as an enhancement type; the third gate dielectric film is adapted to allow the second nMOS transistor to operate as an enhancement type, and the first electrode is made of a material allowing the second pMOS transistor and the second nMOS transistor to operate as an enhancement type. In this case, each of the pMOS and nMOS transistors can be formed as an enhancement type.

In a preferred embodiment of the present invention, each of the first to tenth semiconductor-metal compound layers is a silicon-metal compound layer.

BRIEF DESCRIPTION OF THE DRAWINGS

FIG. 1(a)-1(d) illustrates a semiconductor device according to one embodiment of the present invention, wherein FIG. 1(a) is a schematic diagram of the semiconductor device in a plan view, FIG. 1(b) is a sectional view taken along the line X-X' in FIG. 1(a), FIG. 1(c) is a sectional view taken along the line Y-Y' in FIG. 1(a), and FIG. 1(d) is a sectional view taken along the line Z-Z' in FIG. 1(a).

FIG. 72 is a diagram showing a fourth level metal layer, and a third level via (a contact between the third level metal layer and the fourth level metal layer), in the semiconductor device structure formed by arranging the semiconductor device according to the embodiment in a three-row by three-column array.

DETAILED DESCRIPTION

Figure 1:
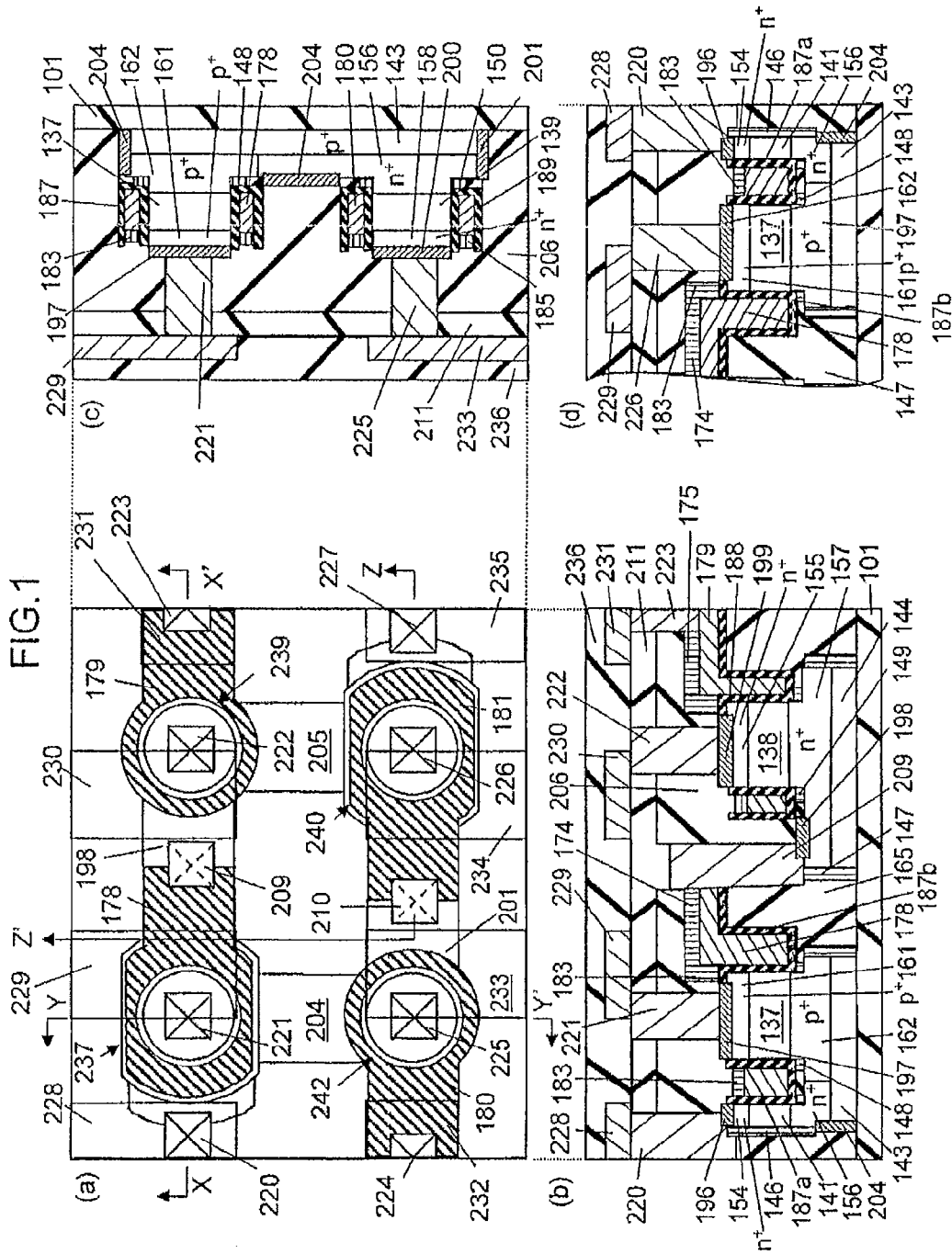

FIG. 1 shows a semiconductor device according to one embodiment of the present invention, wherein (a), (b) and (c) are a schematic diagram of the semiconductor device in a plane view, a sectional view taken along the line X-X' in (a) and a sectional view taken along the line Y-Y' in (a), respectively. (a) is a top plan view in which some part is hatched for distinguishing regions. Some components are hatched in a plane view for distinguishing regions. Only two sectional views of the semiconductor device are shown for the easy of viewing.

The semiconductor device according to this embodiment comprises: a first inverter 237 arranged at an intersection of the 1st row and the 1st column, wherein the first inverter 237 includes a first island-shaped silicon layer 137, a first gate dielectric film 187(a) surrounding a periphery of the first island-shaped silicon layer 137, a first gate electrode 178 surrounding a periphery of the first gate dielectric film 187(a), a second gate dielectric film 187(b) surrounding a part of a periphery of the first gate electrode 178, a first arc-shaped silicon layer 141 in contact with a part of a periphery of the second gate dielectric film, a first p+-type silicon layer 161 arranged on a top of the first island-shaped silicon layer 137, a second p+-type silicon layer 162 arranged underneath the first island-shaped silicon layer 137, a first n+-type silicon layer 154 arranged on a top of the first arc-shaped silicon layer 141, and a second n+-type silicon layer 156 arranged underneath the first arc-shaped silicon layer 141; a second inverter 240 arranged at an intersection of the 2nd row and the 2nd column, wherein the second inverter 240 includes a second island-shaped silicon layer, a third gate dielectric film surrounding a periphery of the second island-shaped silicon layer, a second gate electrode 181 surrounding a periphery of the third gate dielectric film, a fourth gate dielectric film surrounding a part of a periphery of the second gate electrode 181, a second arc-shaped silicon layer in contact with a part of a periphery of the fourth gate dielectric film, a third p+-type silicon layer arranged on a top of the second island-shaped silicon layer, a fourth p+-type silicon layer arranged underneath the second island-shaped silicon layer, a third n+-type silicon layer arranged on a top of the second arc-shaped silicon layer, and a fourth n+-type silicon layer arranged underneath the second arc-shaped silicon layer; a first selection transistor 239 arranged at an intersection of the 1st row and the 2nd column, wherein the first selection transistor 239 includes a third island-shaped silicon layer 138, a fifth gate dielectric film 188 surrounding a periphery of the third island-shaped silicon layer 138, a third gate electrode 179 surrounding a periphery of the fifth gate dielectric film 188, a fifth n+-type silicon layer 155 arranged on a top of the third island-shaped silicon layer 138, and a sixth n+-type silicon layer 157 arranged underneath the third island-shaped silicon layer 138; a second selection transistor 242 arranged at an intersection of the 2nd row and the 1st column, wherein the second selection transistor 242 includes a fourth island-shaped silicon layer 139, a sixth gate dielectric film 189 surrounding a periphery of the fourth island-shaped silicon layer 139, a fourth gate electrode 180 surrounding a periphery of the sixth gate dielectric film 189, a seventh n+-type silicon layer 158 arranged on a top of the fourth island-shaped silicon layer 139, and an eighth n+-type silicon layer 156 arranged underneath the fourth island-shaped silicon layer 139; a fifth p+-type silicon layer 143 arranged underneath the second p+-type silicon layer 162, the second n+-type silicon layer 156 and the eighth n+-type silicon layer 156; a sixth p+-type silicon layer 144 arranged underneath the fourth p+-type silicon layer, the fourth n+-type silicon layer and the sixth n+-type silicon layer 157; a first silicon-metal compound layer 204 formed on a part of respective sidewalls of the second n+-type silicon layer 156 and the fifth p+-type silicon layer 143; a second silicon-metal compound layer 201 formed on the eighth n+-type silicon layer 156 and the fifth p+-type silicon layer 143; a third silicon-metal compound layer 205 formed on a part of respective sidewalls of the fourth n+-type silicon layer and the sixth p+-type silicon layer 144; a fourth silicon-metal compound layer 198 formed on the sixth n+-type silicon layer 157 and the sixth p+-type silicon layer 144; a fifth silicon-metal compound layer 197 formed on the first p+-type silicon layer 161; a sixth silicon-metal compound layer 196 formed on the first n+-type silicon layer 154; a seventh silicon-metal compound layer formed on the third p+-type silicon layer; an eighth silicon-metal compound layer formed on the third n+-type silicon layer; a ninth silicon-metal compound layer 199 formed on the fifth n+-type silicon layer 155; a tenth silicon-metal compound layer 200 formed on the seventh n+-type silicon layer 158; a first contact 209 connecting the first gate electrode 178 and the fourth silicon-metal compound layer 198; and a second contact 210 connecting the second gate electrode 181 and the second silicon-metal compound layer 201.

A contact 221 is formed on the fifth silicon-metal compound layer 197. A contact 220 is formed on the sixth silicon-metal compound layer 196. A contact 226 is formed on the seventh silicon-metal compound layer. A contact 227 is formed on the eighth silicon-metal compound layer. A contact 222 is formed on the ninth silicon-metal compound layer 199. A contact 225 is formed on the tenth silicon-metal compound layer 200. A contact 223 is formed on the third gate electrode 179. A contact 224 is formed on the fourth gate electrode 180.

A first level metal 228 is formed on the contact 220. A first level metal 229 is formed on the contact 221. A first level metal 230 is formed on the contact 222. A first level metal 231 is formed on the contact 223. A first level metal 232 is formed on the contact 224. A first level metal 233 is formed on the contact 225. A first level metal 234 is formed on the contact 226. A first level metal 235 is formed on the contact 227. In the above manner, an SRAM memory cell is formed.

The above semiconductor device is configured to satisfy the following condition: $Wp1 \approx 2Wn1$, wherein $Wp1$ is an outer peripheral length of the first island-shaped silicon layer 137, and $Wn1$ is a length of an arc of the first arc-shaped silicon layer 141 in contact with a part of the periphery of the second gate dielectric film 187 (b). Thus, a gate width of a pMOS transistor can be set to be twice as large as that of an nMOS transistor. In this case, it is preferable to satisfy the following condition: $Ln1 \approx Lp1$, wherein $Ln1$ is a channel length of the first arc-shaped silicon layer 141, and $Lp1$ is a channel length of the first island-shaped silicon layer 137. The above semiconductor device is also configured to satisfy the following condition: $Wp2 \approx 2Wn2$, wherein $Wp2$ is an outer peripheral length of the second island-shaped silicon layer, and $Wn2$ is a length of an arc of the second arc-shaped silicon layer in contact with a part of the periphery of the fourth gate dielectric film. Thus, a gate width of a pMOS transistor can be set to be twice as large as that of an nMOS transistor. In this case, it is preferable to satisfy the following condition: $Ln2 \approx Lp2$, wherein $Ln2$ is a channel length of the second arc-shaped silicon layer, and $Lp2$ is a channel length of the second island-shaped silicon layer.

Figure 2:
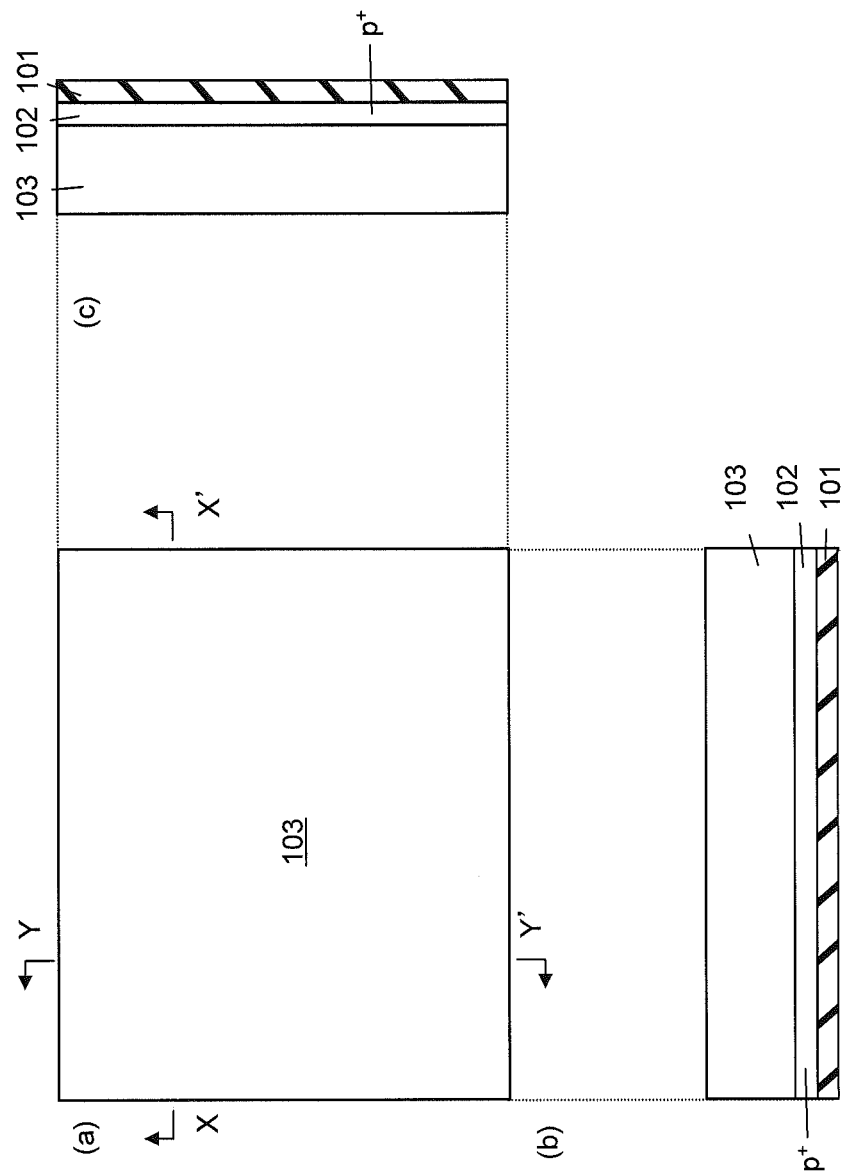
FIG. 2 shows a step in one example of a production process for the semiconductor device according to the embodiment, wherein (a), (b) and (c) are a top plan view, a sectional view taken along the line X-X' in (a), and a sectional view taken along the line Y-Y' in (a), respectively.
Figure 65:
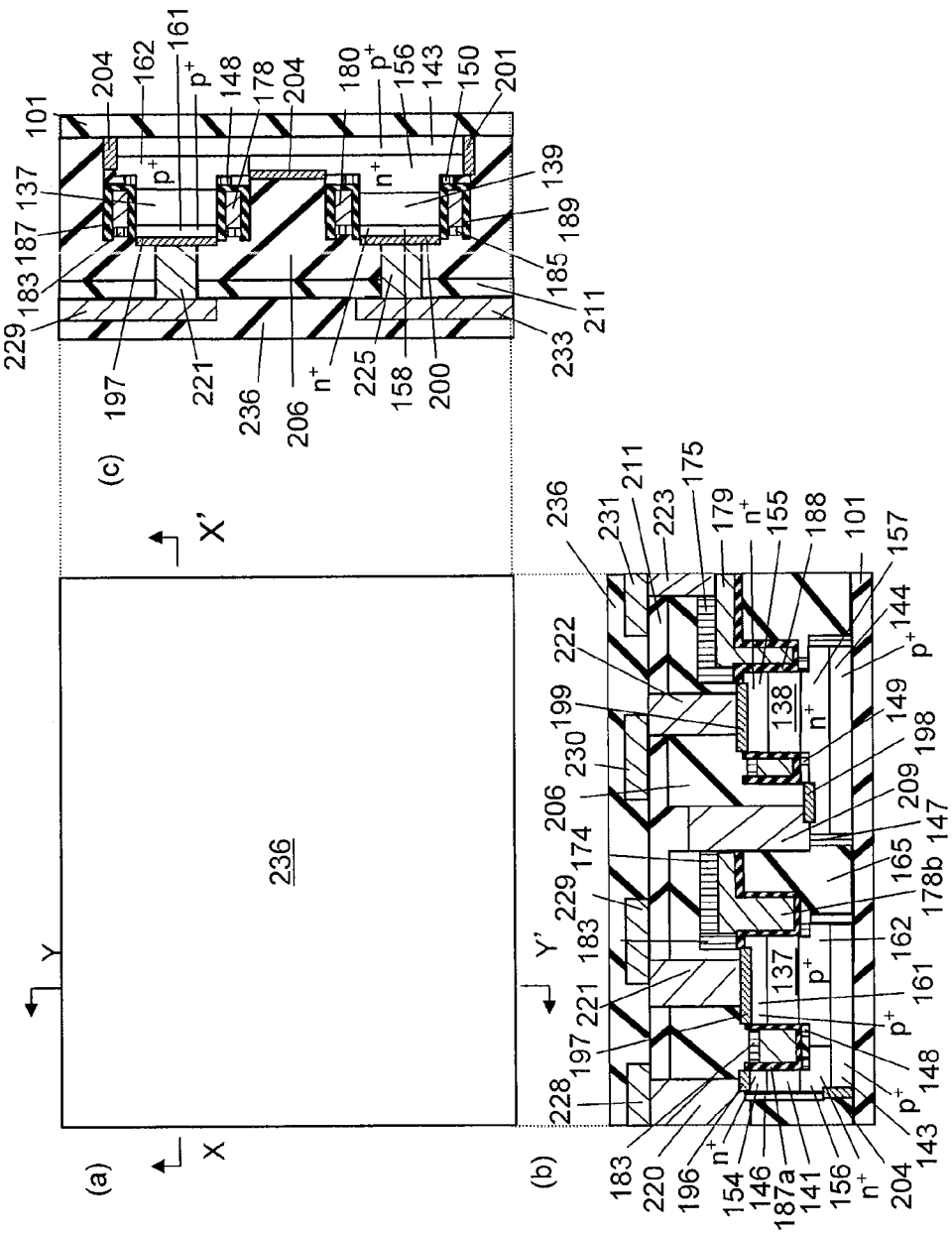
FIG. 65 shows a step in the example of the production process, wherein (a), (b) and (c) are a top plan view, a sectional view taken along the line X-X' in (a), and a sectional view taken along the line Y-Y' in (a), respectively.

With reference to FIG. 2, one example of a production process for forming a structure of the semiconductor device according to this embodiment will be described below. In these figures, the same elements or components are defined by a common reference numeral or code. Each of FIG. 2 to FIG. 65 shows a step in the example of the production process, wherein the figure suffixed with (a), the figure suffixed with (b) and the figure suffixed with (c) are a top plan view, a sectional view taken along the line X-X' in the figure suffixed with (a), and a sectional view taken along the line Y-Y' in the figure suffixed with (a), respectively. (a) are top plan views in which some part is hatched for distinguishing regions.

Referring to FIG. 2, boron (B) is implanted into a p-type or non-doped silicon layer 103 formed on an oxide layer 101 to form a p+-type silicon layer 102 therein.

Figure 3:
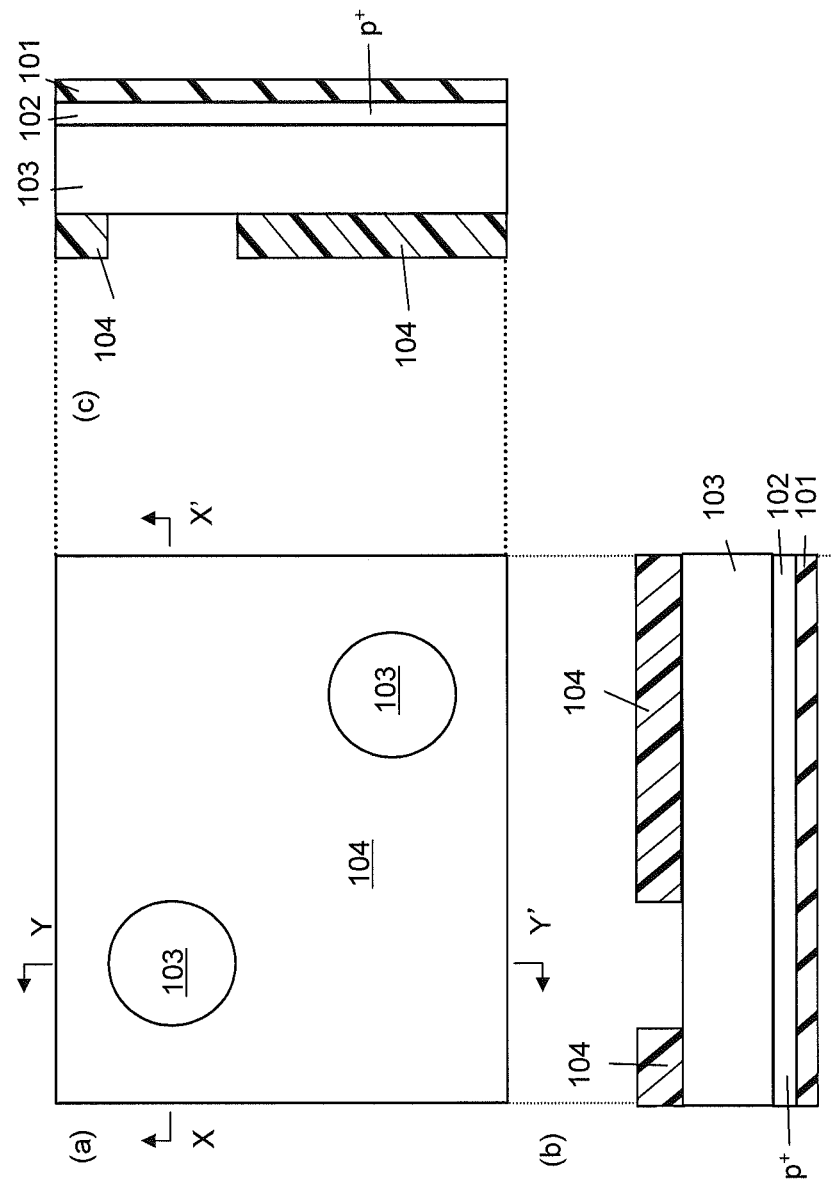
FIG. 3 shows a step in the example of the production process, wherein (a), (b) and (c) are a top plan view, a sectional view taken along the line X-X' in (a), and a sectional view taken along the line Y-Y' in (a), respectively.

Referring to FIG. 3, a resist 104 for forming an n-type silicon layer is formed. In cases where after-mentioned silicon layers 105, 106 are formed as a non-doped type, this step is unnecessary.

Figure 4:
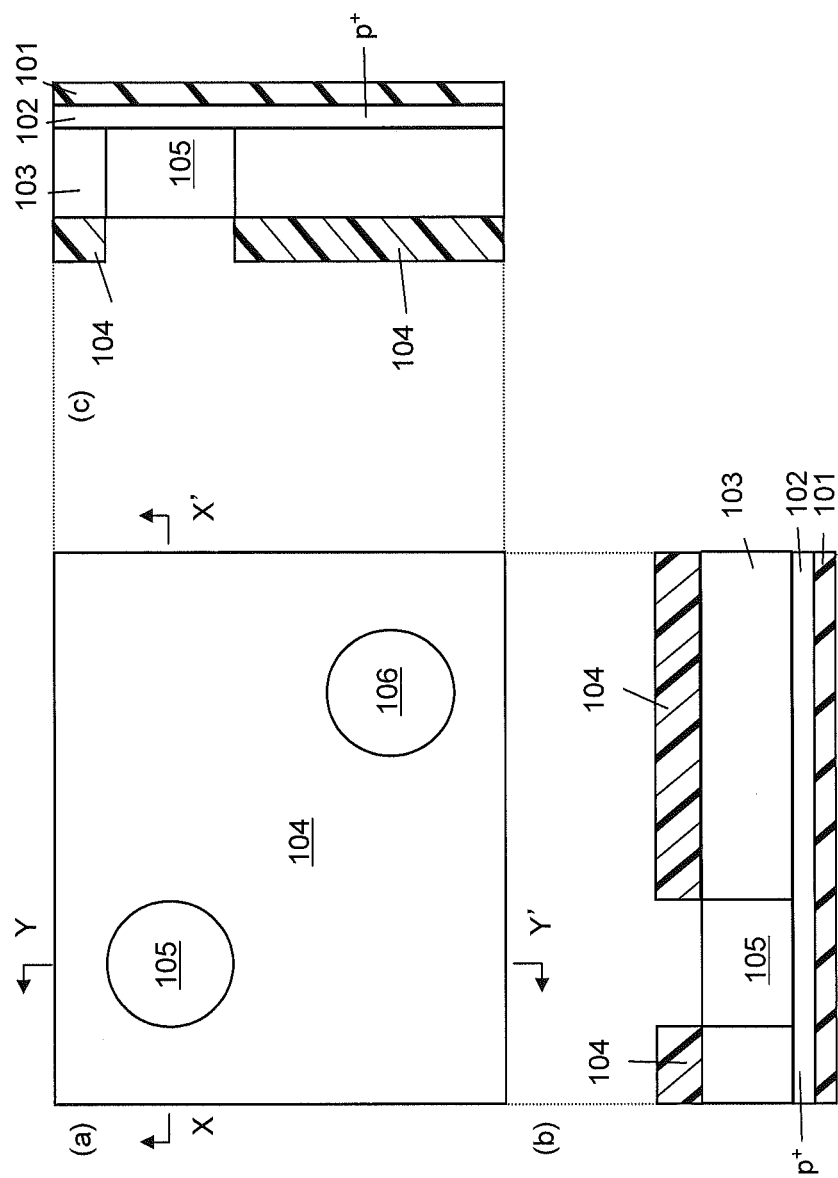
FIG. 4 shows a step in the example of the production process, wherein (a), (b) and (c) are a top plan view, a sectional view taken along the line X-X' in (a), and a sectional view taken along the line Y-Y' in (a), respectively.

Referring to FIG. 4, two n-type silicon layers 105, 106 are formed by implantation of phosphorus (P). In cases where these silicon layers 105, 106 are formed as a non-doped type, this step is unnecessary.

Figure 5:
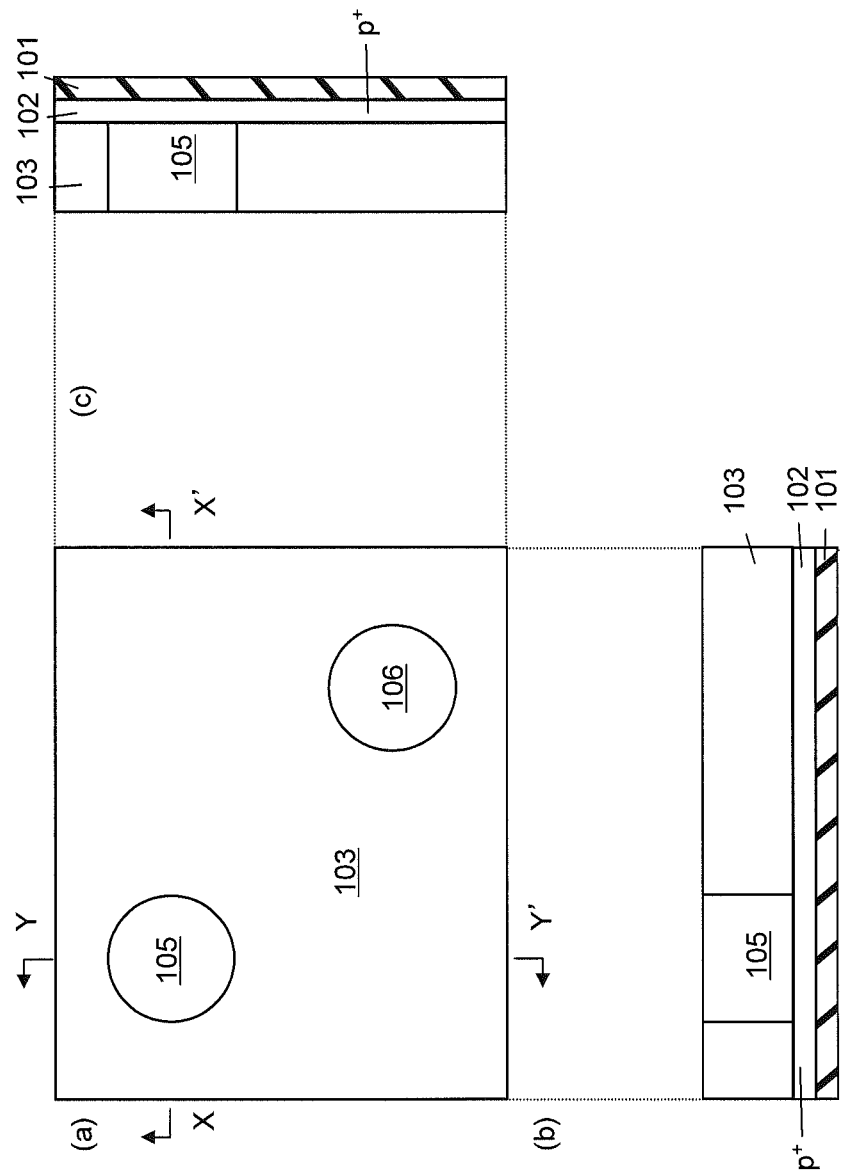
FIG. 5 shows a step in the example of the production process, wherein (a), (b) and (c) are a top plan view, a sectional view taken along the line X-X' in (a), and a sectional view taken along the line Y-Y' in (a), respectively.

Referring to FIG. 5, the resist 104 is stripped away, and then a heat treatment is performed. In cases where the silicon layers 105, 106 are formed as a non-doped type, this step is unnecessary.

Figure 6:
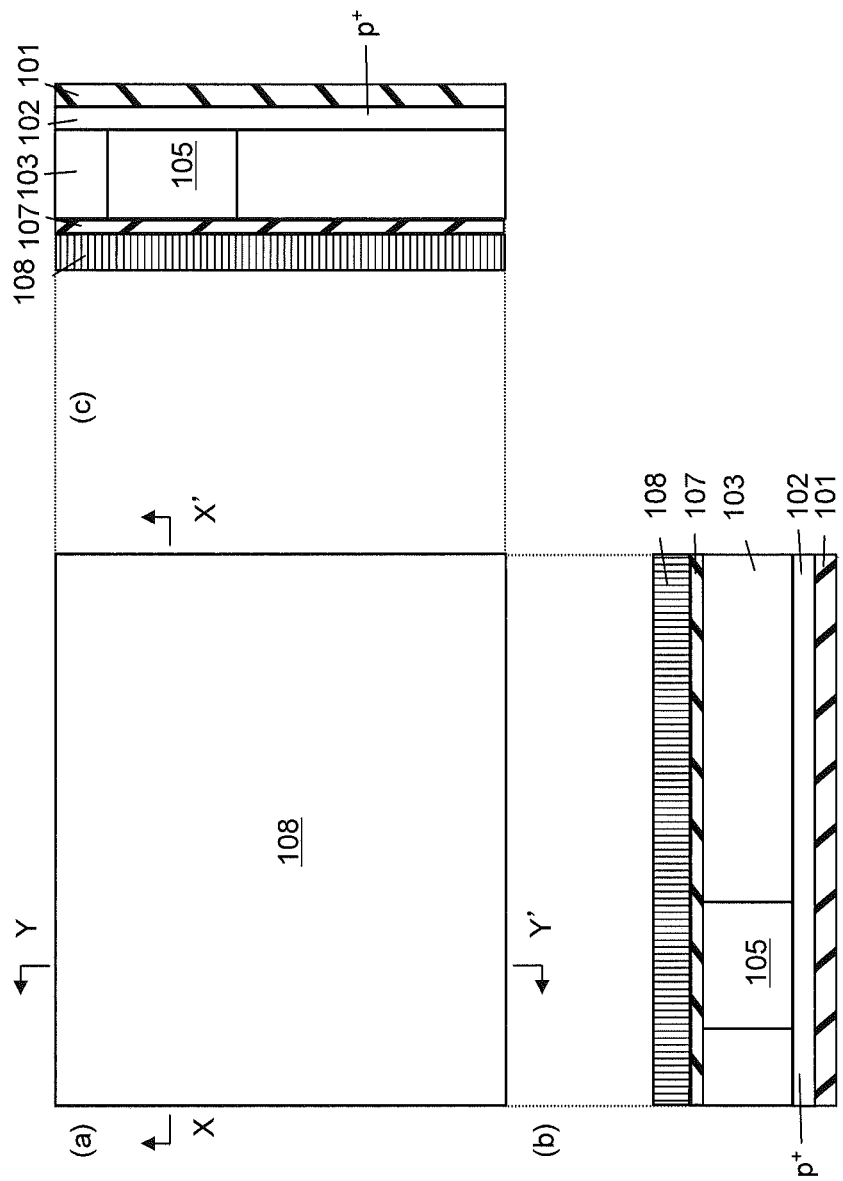
FIG. 6 shows a step in the example of the production process, wherein (a), (b) and (c) are a top plan view, a sectional view taken along the line X-X' in (a), and a sectional view taken along the line Y-Y' in (a), respectively.

Referring to FIG. 6, an oxide film 107 is deposited, and then a nitride film 108 is deposited.

Figure 7:
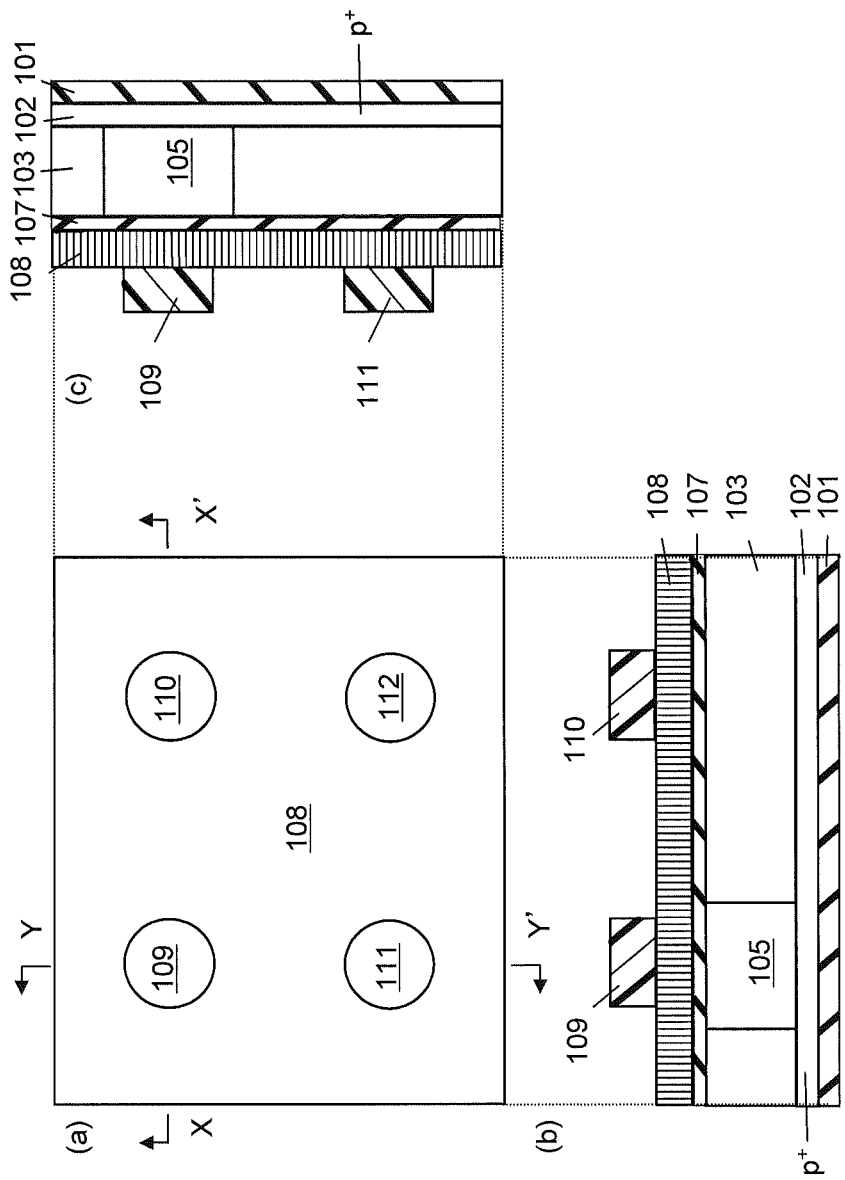
FIG. 7 shows a step in the example of the production process, wherein (a), (b) and (c) are a top plan view, a sectional view taken along the line X-X' in (a), and a sectional view taken along the line Y-Y' in (a), respectively.

Referring to FIG. 7, four resists 109, 110, 111, 112 for forming four (first, second, third, and fourth) island-shaped silicon layers is formed.

Figure 8:
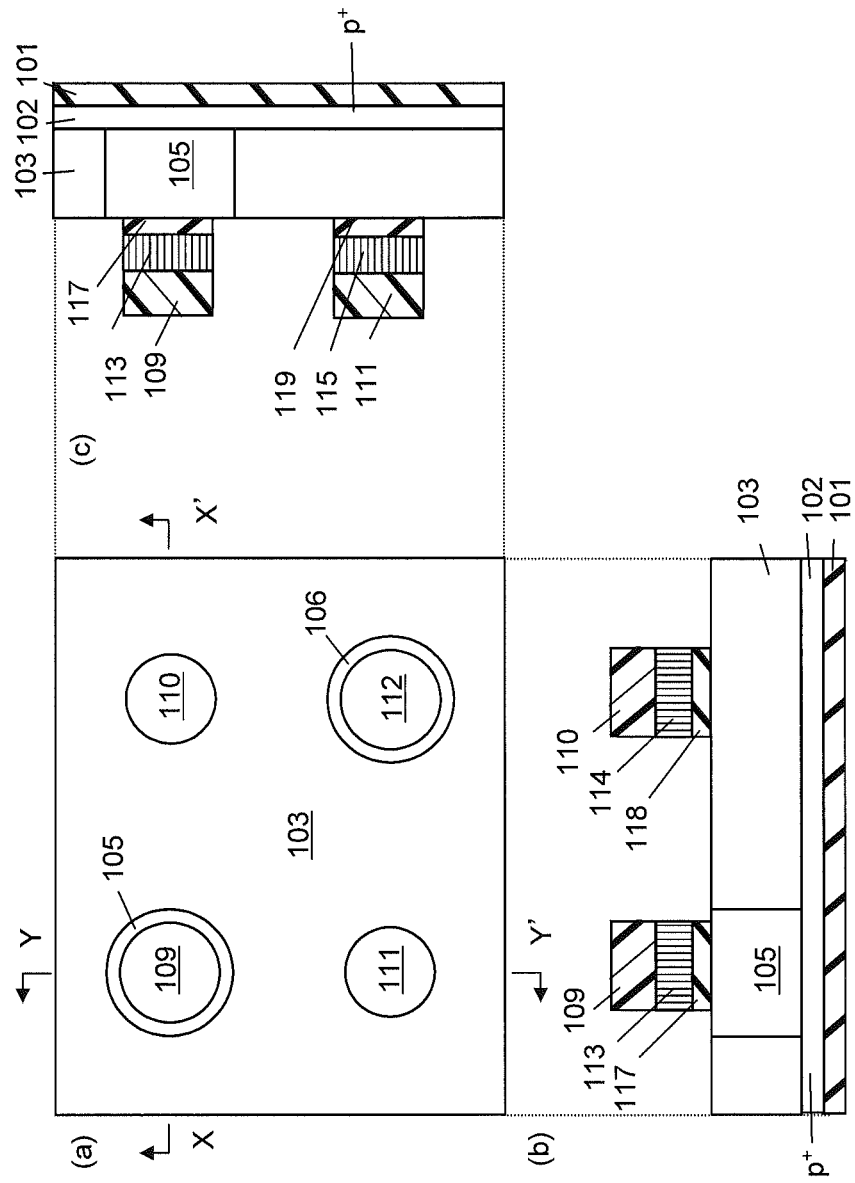
FIG. 8 shows a step in the example of the production process, wherein (a), (b) and (c) are a top plan view, a sectional view taken along the line X-X' in (a), and a sectional view taken along the line Y-Y' in (a), respectively.
Figure 9:
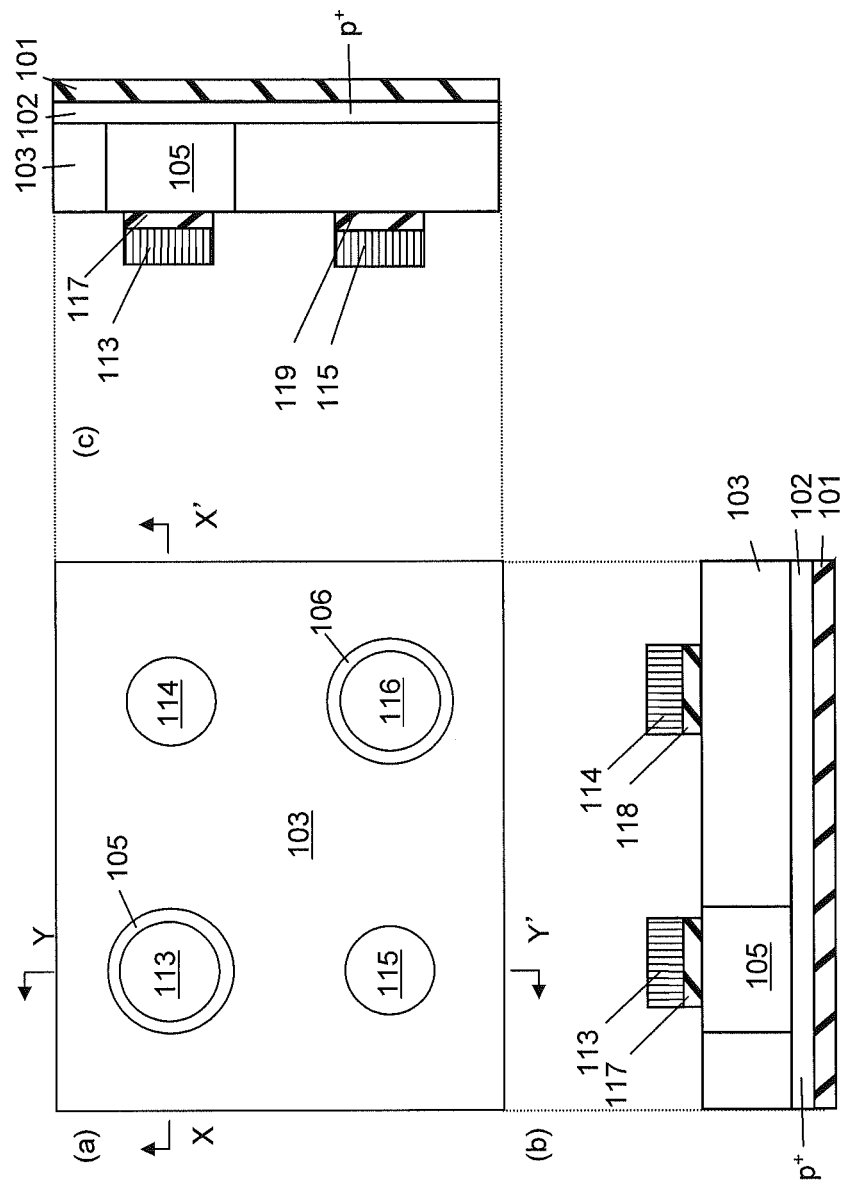
FIG. 9 shows a step in the example of the production process, wherein (a), (b) and (c) are a top plan view, a sectional view taken along the line X-X' in (a), and a sectional view taken along the line Y-Y' in (a), respectively.

Referring to FIG. 8, the nitride film 108 and the oxide film 107 are etched to form four nitride films 113, 114, 115 (one of the nitride films is indicated by the reference numeral 116 in FIG. 9, etc.) and four oxide films 117, 118, 119 (one of the oxide films is not indicated by a reference numeral).

Referring to FIG. 9, the resists 109, 110, 111, 112 are stripped away.

Figure 10:
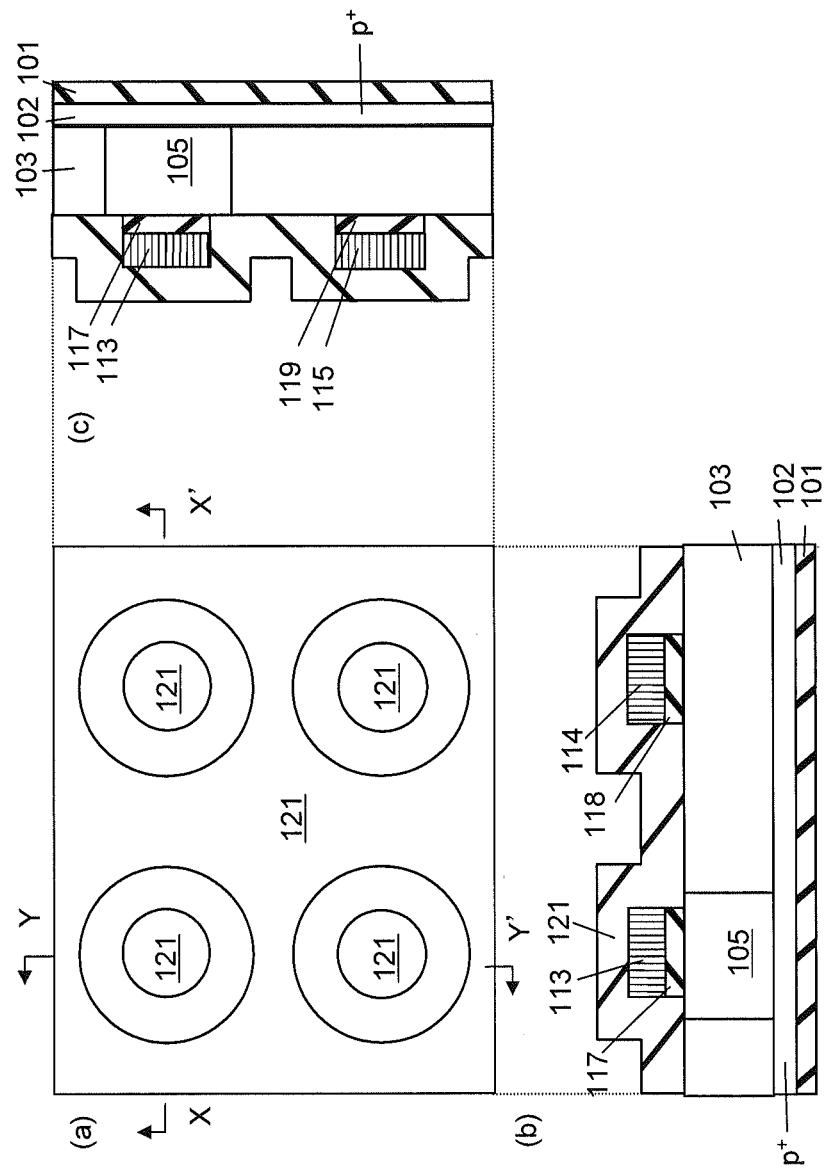
FIG. 10 shows a step in the example of the production process, wherein (a), (b) and (c) are a top plan view, a sectional view taken along the line X-X' in (a), and a sectional view taken along the line Y-Y' in (a), respectively.

Referring to FIG. 10, an oxide film 121 is deposited.

Figure 11:
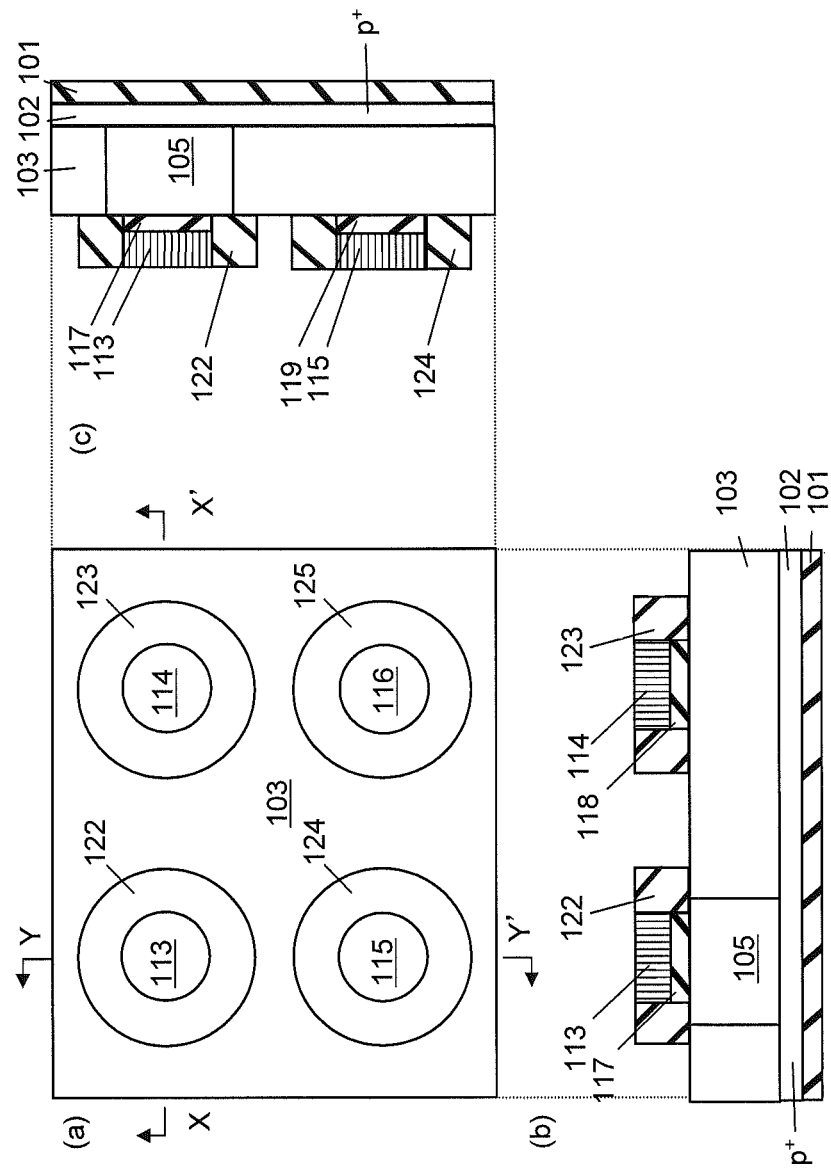
FIG. 11 shows a step in the example of the production process, wherein (a), (b) and (c) are a top plan view, a sectional view taken along the line X-X' in (a), and a sectional view taken along the line Y-Y' in (a), respectively.

Referring to FIG. 11, the oxide film 121 is etched to form four oxide film-based sidewalls 122, 123, 124, 125.

Figure 12:
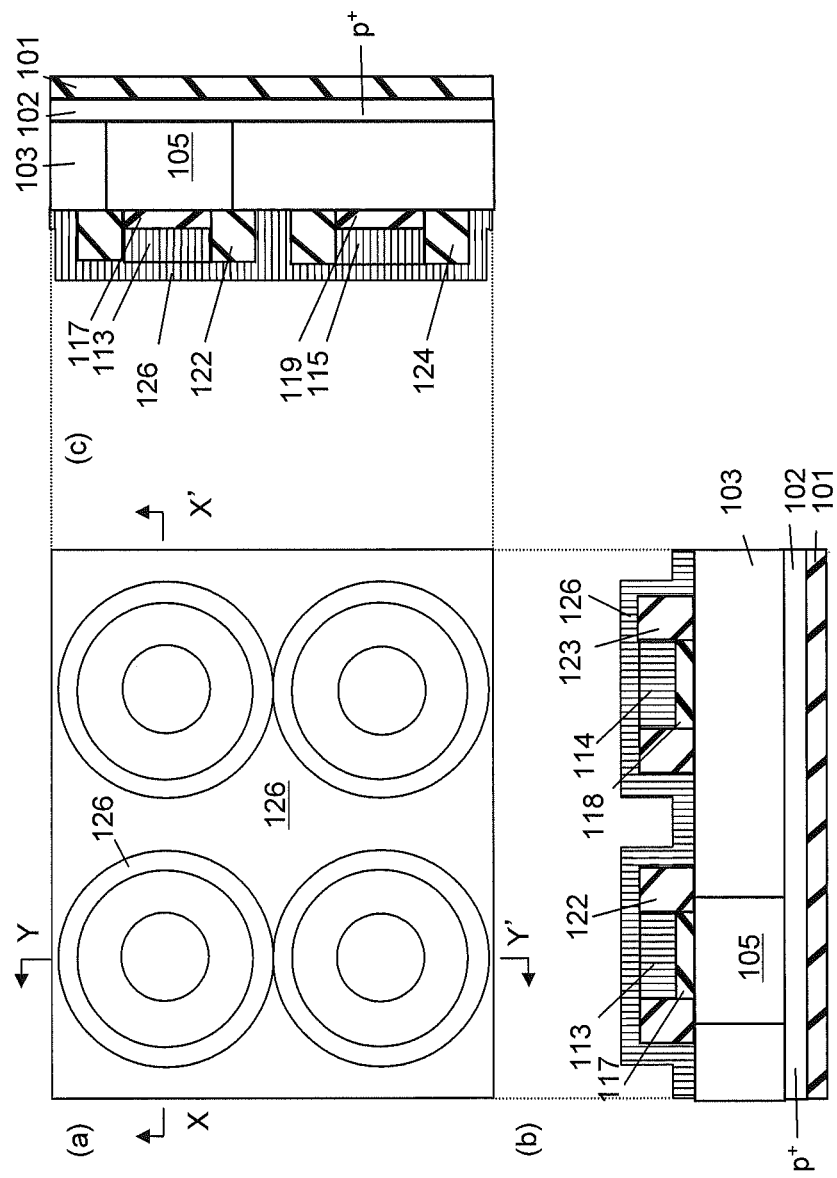
FIG. 12 shows a step in the example of the production process, wherein (a), (b) and (c) are a top plan view, a sectional view taken along the line X-X' in (a), and a sectional view taken along the line Y-Y' in (a), respectively.

Referring to FIG. 12, a nitride film 126 is deposited.

Figure 13:
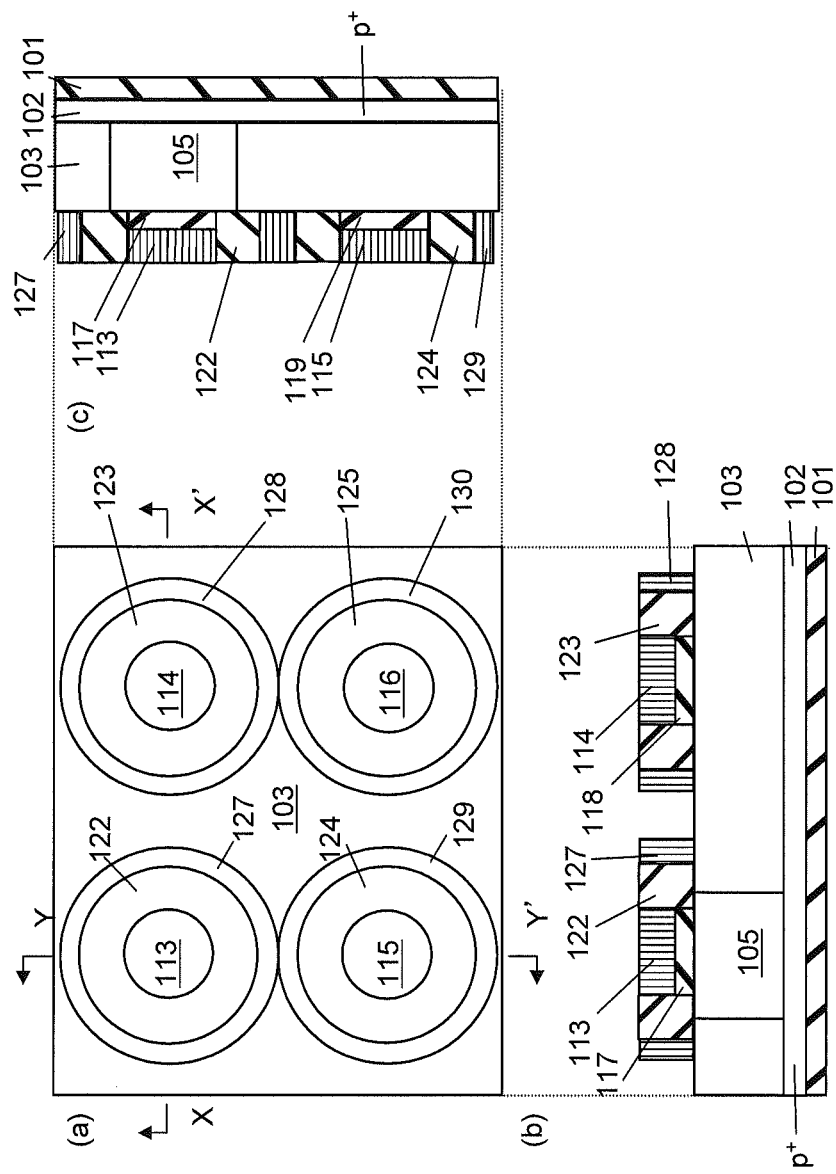
FIG. 13 shows a step in the example of the production process, wherein (a), (b) and (c) are a top plan view, a sectional view taken along the line X-X' in (a), and a sectional view taken along the line Y-Y' in (a), respectively.

Referring to FIG. 13, the nitride film 126 is etched to form four nitride film-based sidewalls 127, 128, 129, 130.

Figure 14:
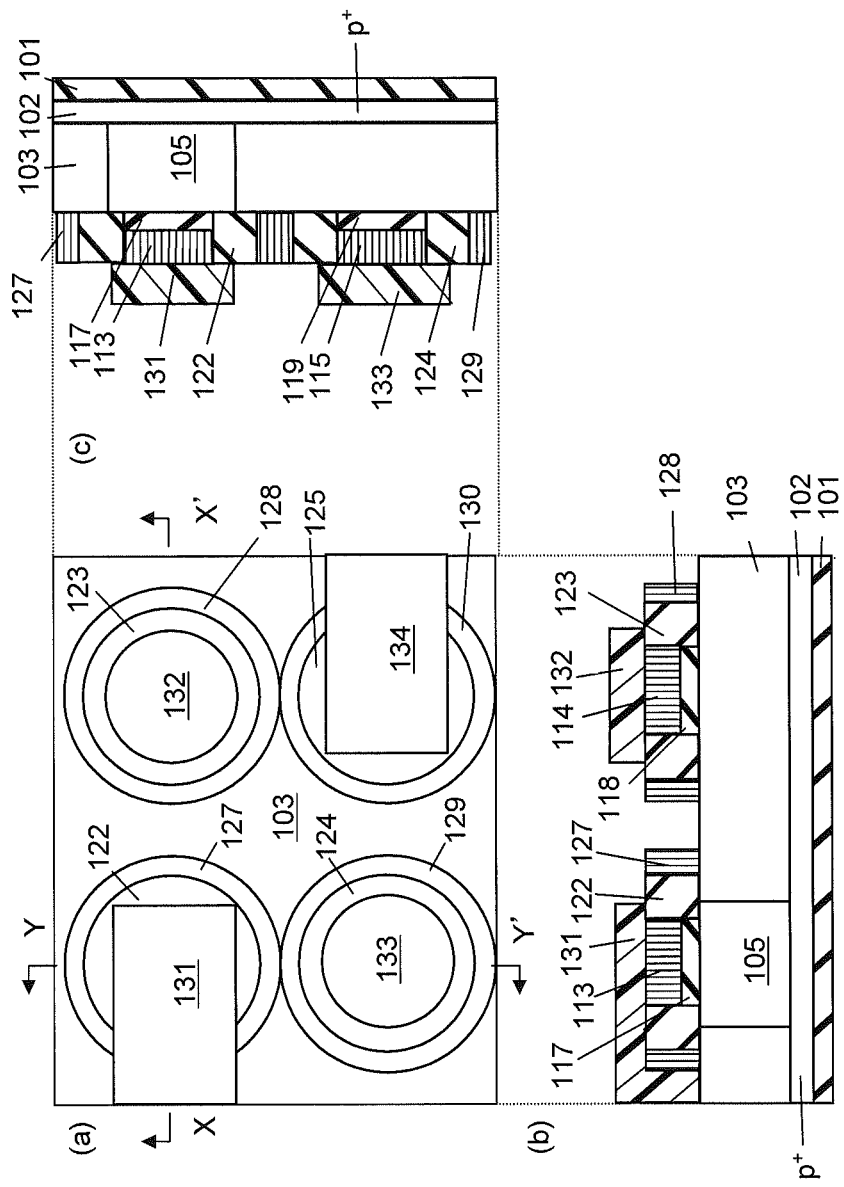
FIG. 14 shows a step in the example of the production process, wherein (a), (b) and (c) are a top plan view, a sectional view taken along the line X-X' in (a), and a sectional view taken along the line Y-Y' in (a), respectively.

Referring to FIG. 14, four resists 131, 132, 133, 134 are formed.

Figure 15:
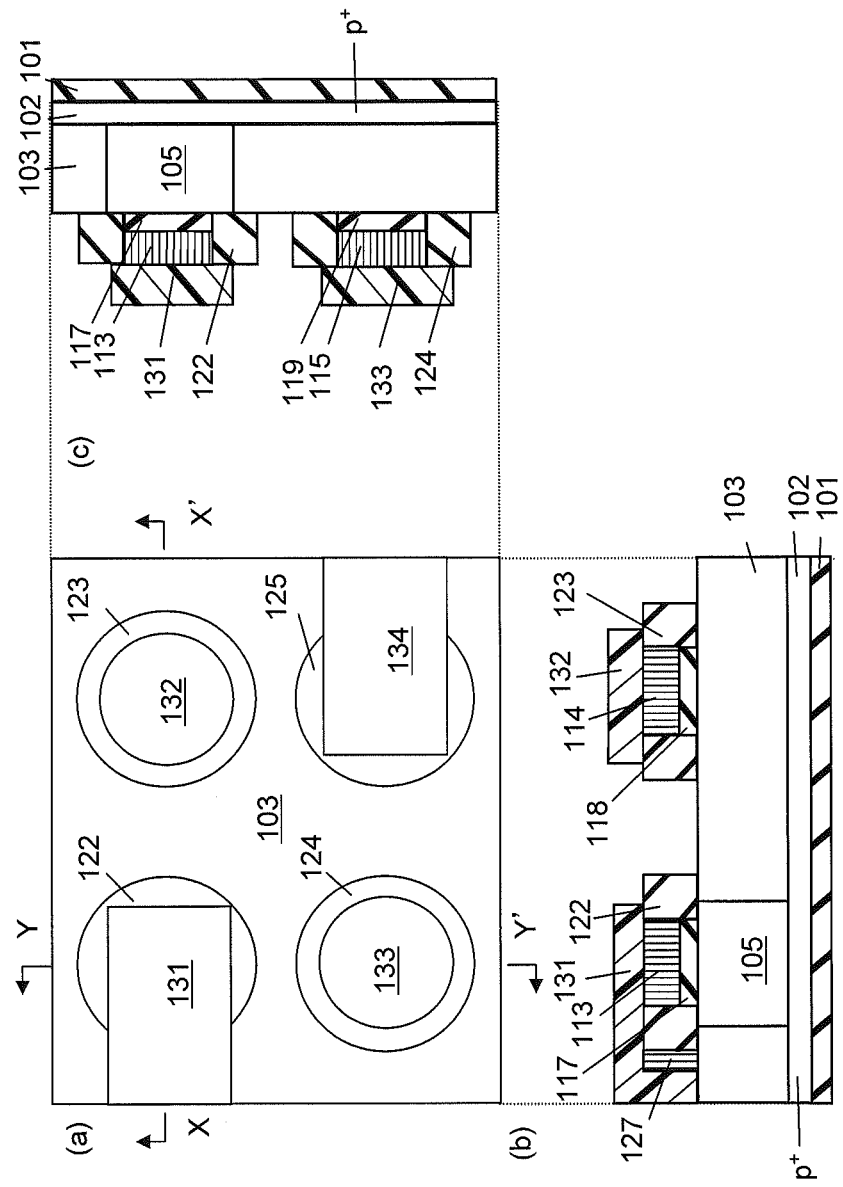
FIG. 15 shows a step in the example of the production process, wherein (a), (b) and (c) are a top plan view, a sectional view taken along the line X-X' in (a), and a sectional view taken along the line Y-Y' in (a), respectively.
Figure 17:
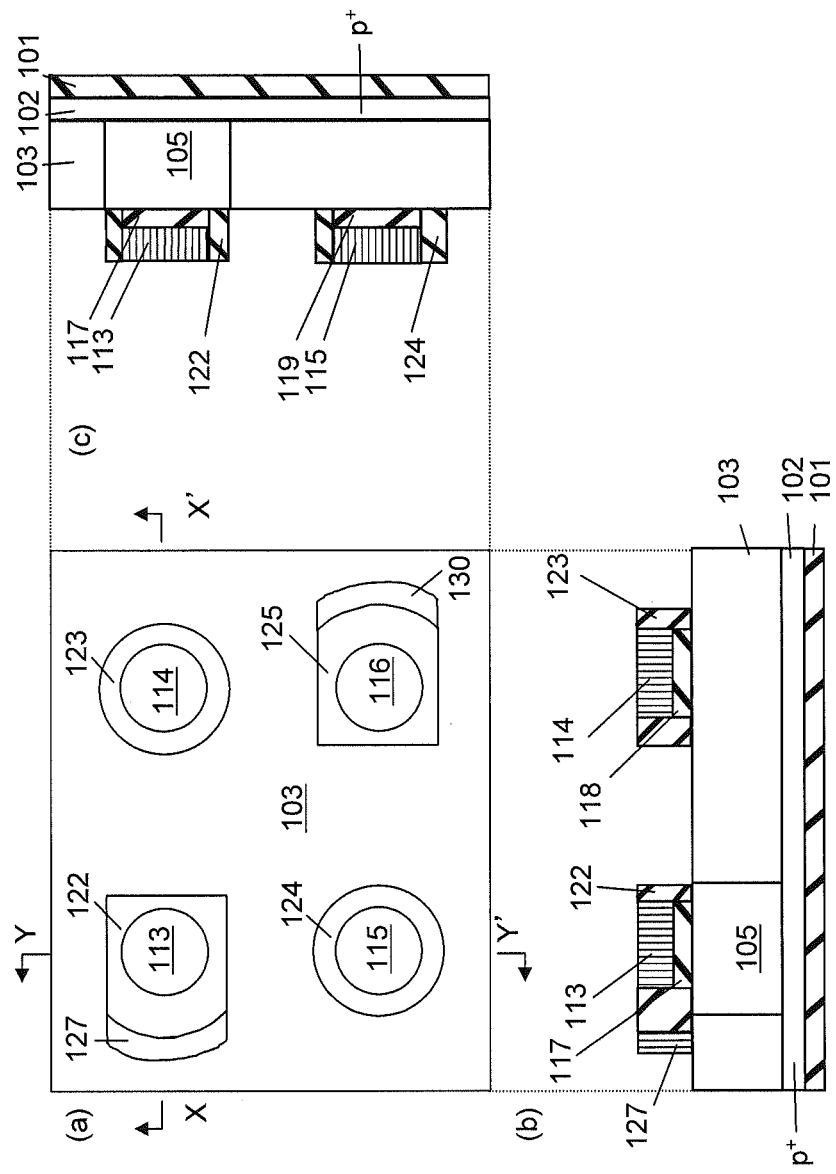
FIG. 17 shows a step in the example of the production process, wherein (a), (b) and (c) are a top plan view, a sectional view taken along the line X-X' in (a), and a sectional view taken along the line Y-Y' in (a), respectively.

Referring to FIG. 15, the nitride film-based sidewalls 127, 128, 129, 130 are etched to form two nitride film-based hard masks 127 (one of the nitride film-based hard masks is indicated by the reference numeral 130 in FIG. 17, etc.) for forming first and second arc-shaped silicon layers.

Figure 16:
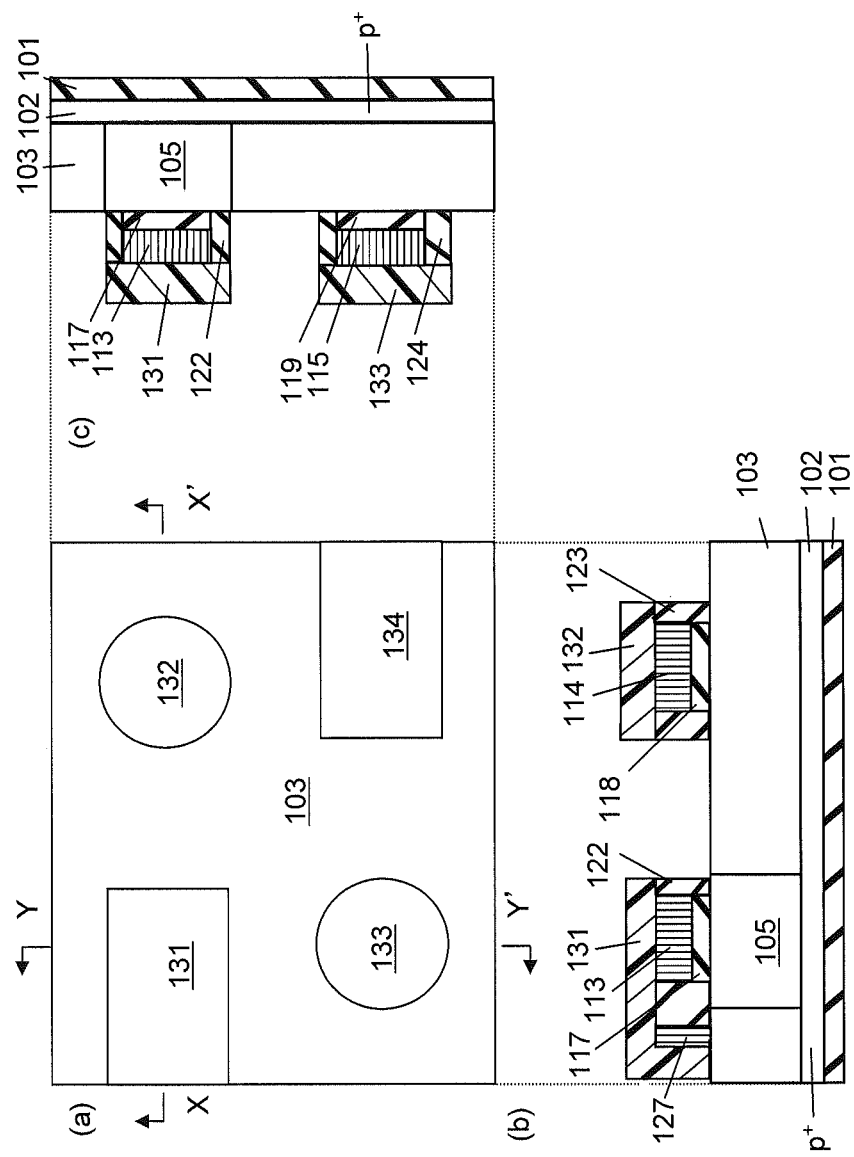
FIG. 16 shows a step in the example of the production process, wherein (a), (b) and (c) are a top plan view, a sectional view taken along the line X-X' in (a), and a sectional view taken along the line Y-Y' in (a), respectively.

Referring to FIG. 16, the oxide film-based sidewalls 122, 123, 124, 125 are etched.

Referring to FIG. 17, the resists 131, 132, 133, 134 are stripped away.

Figure 18:
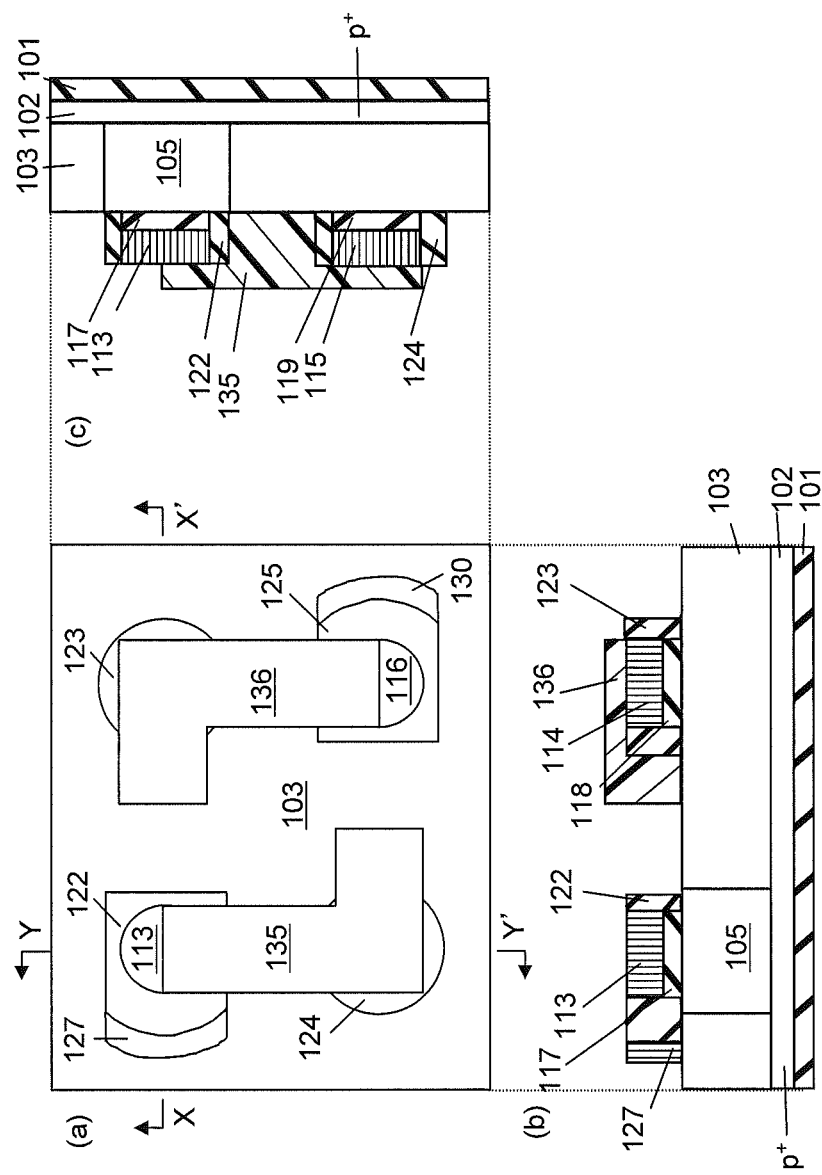
FIG. 18 shows a step in the example of the production process, wherein (a), (b) and (c) are a top plan view, a sectional view taken along the line X-X' in (a), and a sectional view taken along the line Y-Y' in (a), respectively.

Referring to FIG. 18, two resists 135, 136 for forming a diffusion-layer interconnection section is formed.

Figure 19:
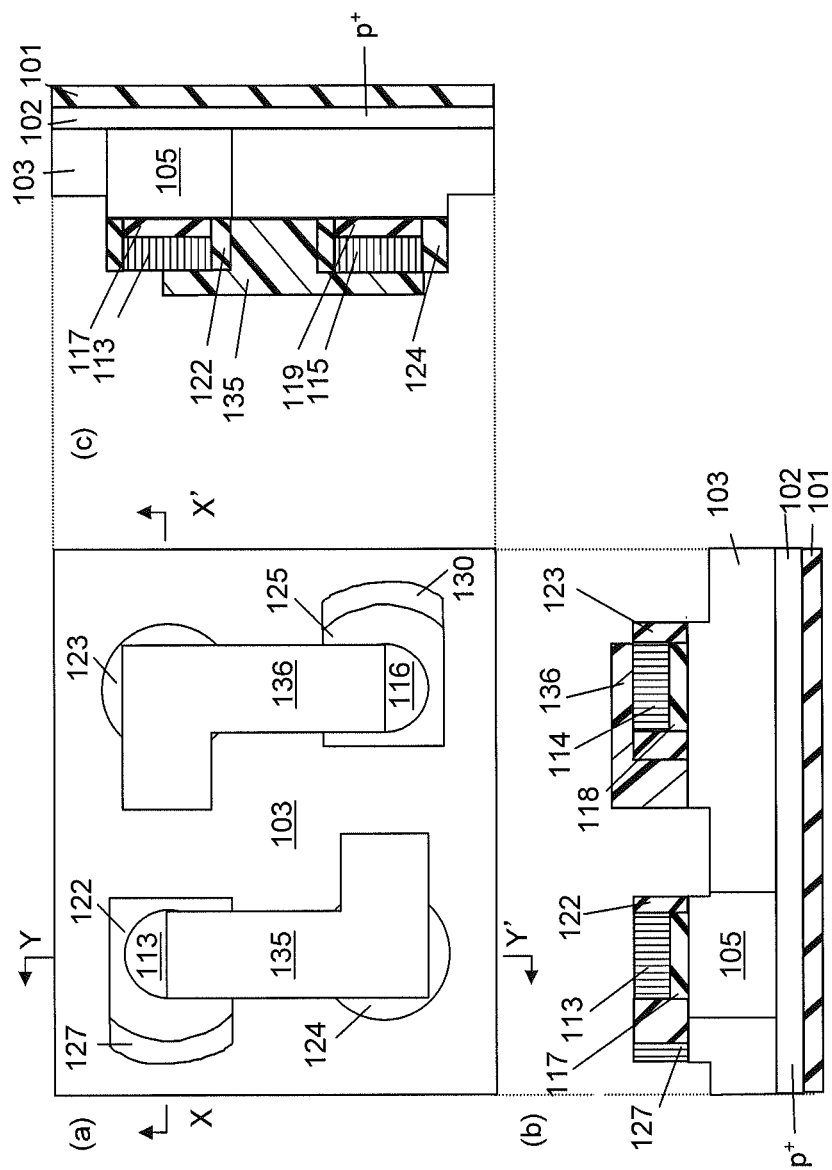
FIG. 19 shows a step in the example of the production process, wherein (a), (b) and (c) are a top plan view, a sectional view taken along the line X-X' in (a), and a sectional view taken along the line Y-Y' in (a), respectively.

Referring to FIG. 19, the silicon layer 103 is etched to form a diffusion-layer interconnection section thereon.

Figure 20:
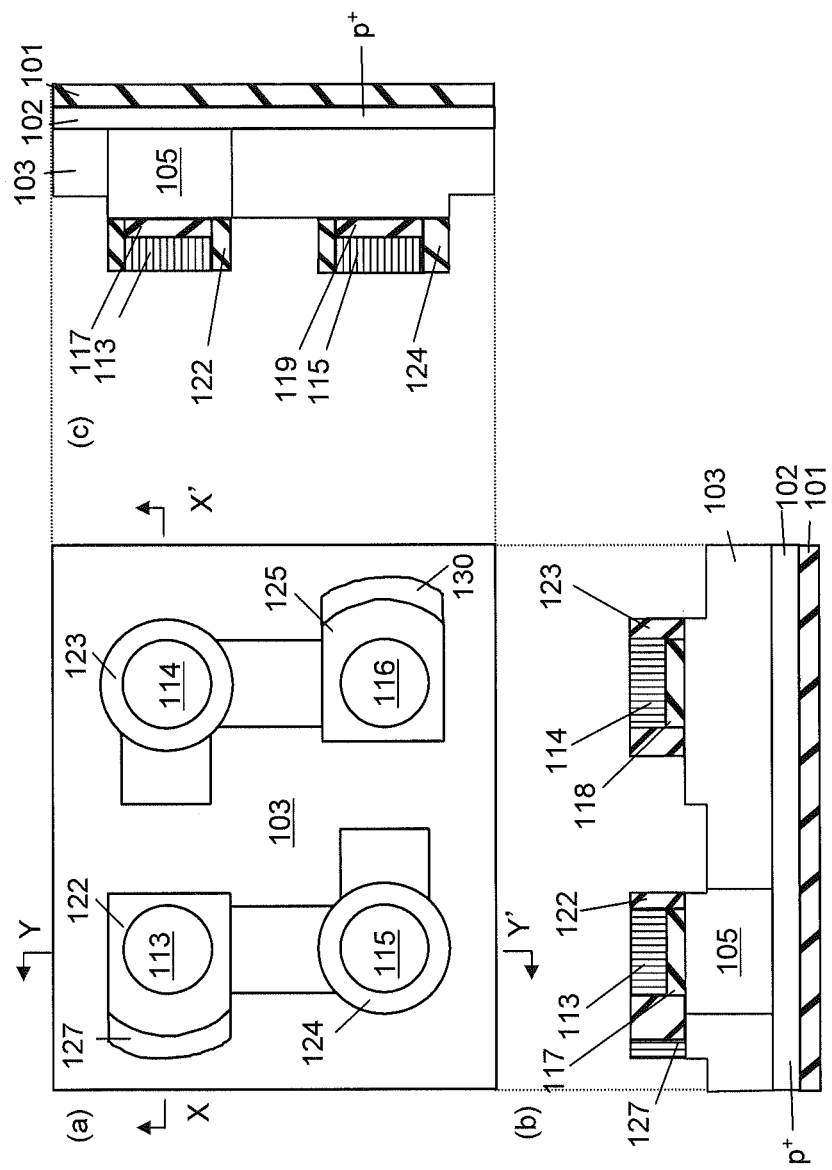
FIG. 20 shows a step in the example of the production process, wherein (a), (b) and (c) are a top plan view, a sectional view taken along the line X-X' in (a), and a sectional view taken along the line Y-Y' in (a), respectively.

Referring to FIG. 20, the resists 135, 136 are stripped away.

Figure 21:
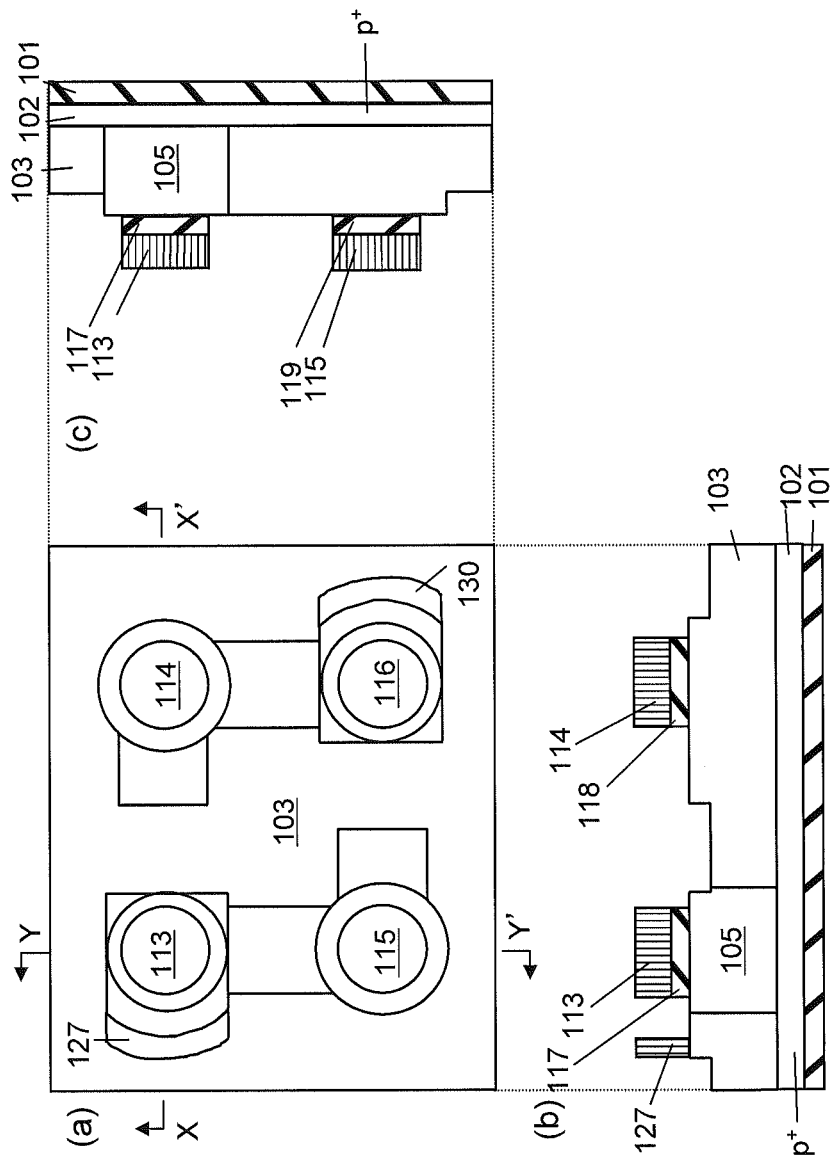
FIG. 21 shows a step in the example of the production process, wherein (a), (b) and (c) are a top plan view, a sectional view taken along the line X-X' in (a), and a sectional view taken along the line Y-Y' in (a), respectively.

Referring to FIG. 21, the oxide film-based sidewalls 122, 123, 124, 125 are etched away.

Figure 22:
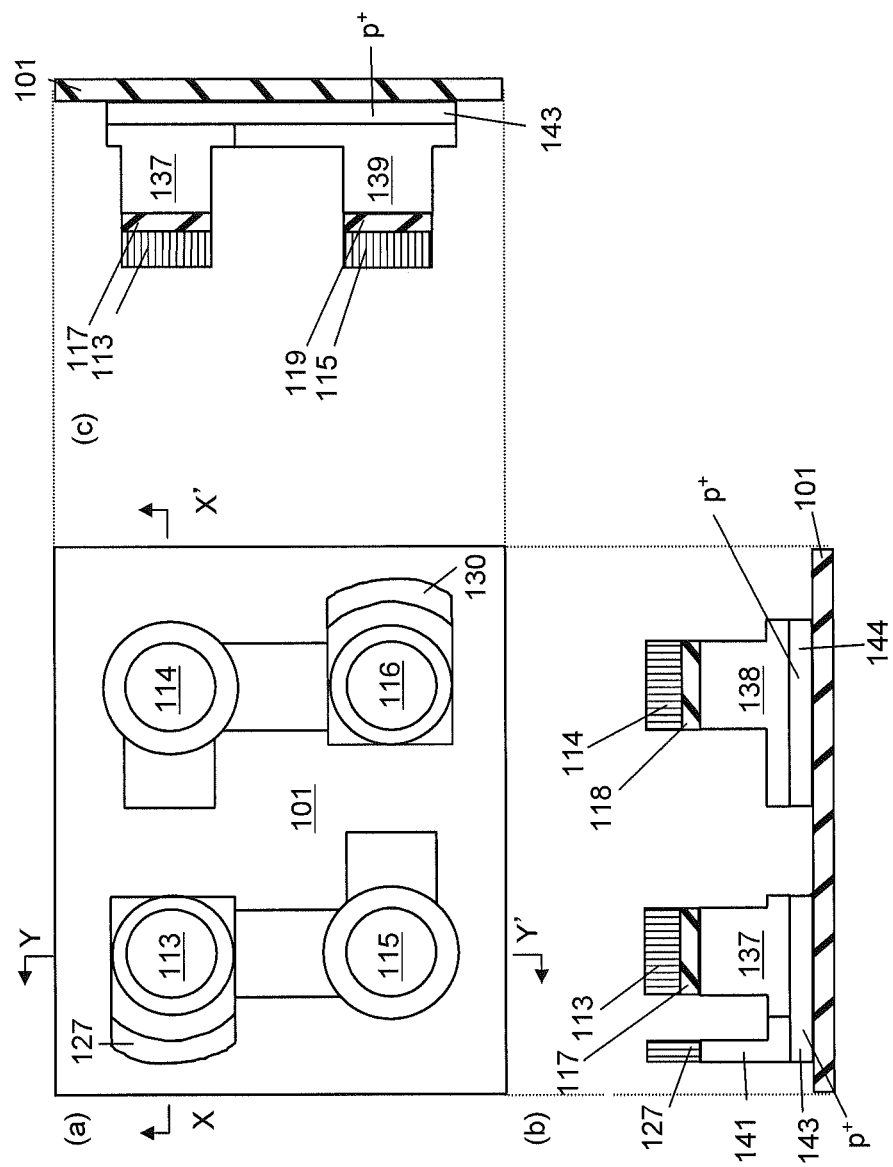
FIG. 22 shows a step in the example of the production process, wherein (a), (b) and (c) are a top plan view, a sectional view taken along the line X-X' in (a), and a sectional view taken along the line Y-Y' in (a), respectively.

Referring to FIG. 22, the silicon layer 103 and silicon layers 105, 106 are etched to form a first island-shaped silicon layer 137, a third island-shaped silicon layer 138, a fourth island-shaped silicon layer 139, a second island-shaped silicon layer (indicated by the reference numeral 140 in FIG. 23, etc), a first arc-shaped silicon layer 141, a second arc-shaped silicon layer (indicated by the reference numeral 142 in FIG. 23, etc), and fifth and sixth p+-type silicon layers 143, 144.

Figure 23:
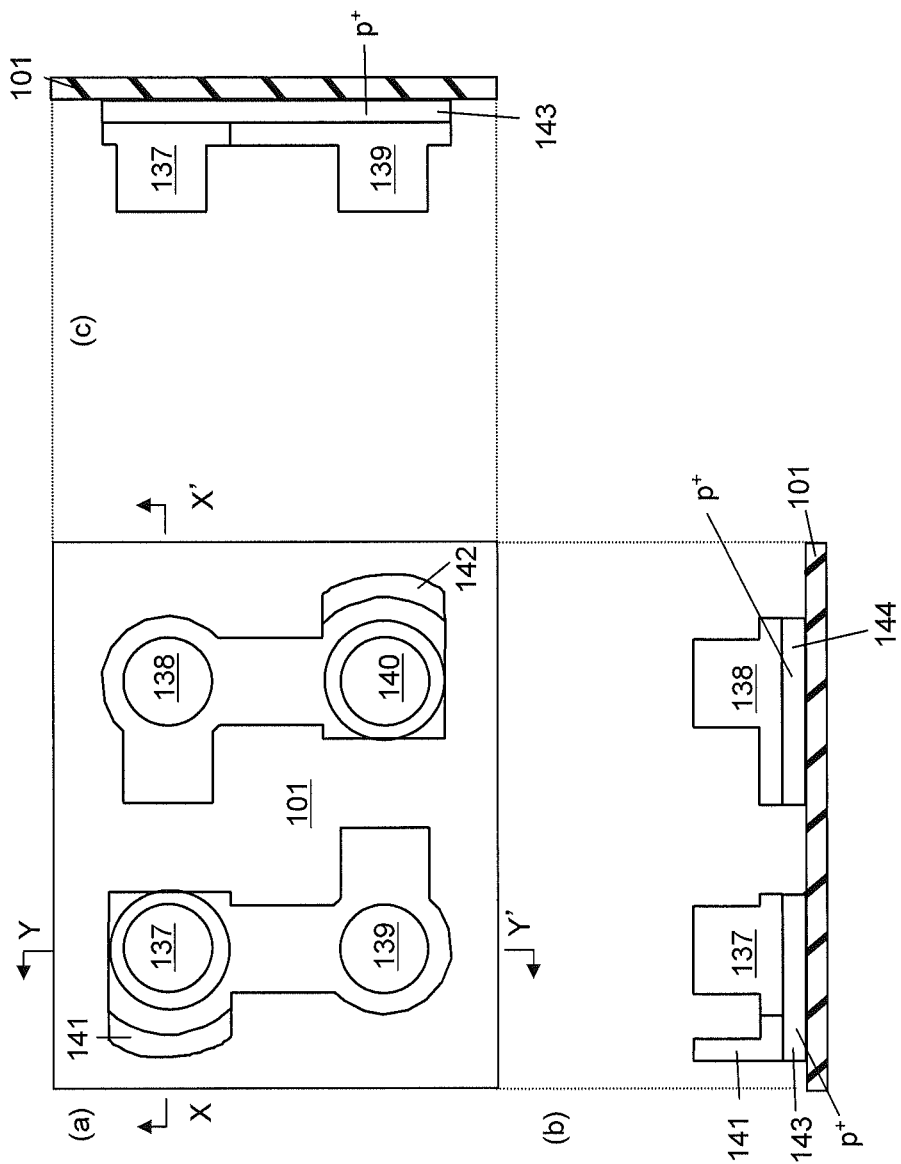
FIG. 23 shows a step in the example of the production process, wherein (a), (b) and (c) are a top plan view, a sectional view taken along the line X-X' in (a), and a sectional view taken along the line Y-Y' in (a), respectively.

Referring to FIG. 23, the nitride films 113, 114, 115, 116 and the oxide films 117, 118, 119 are stripped away.

Figure 24:
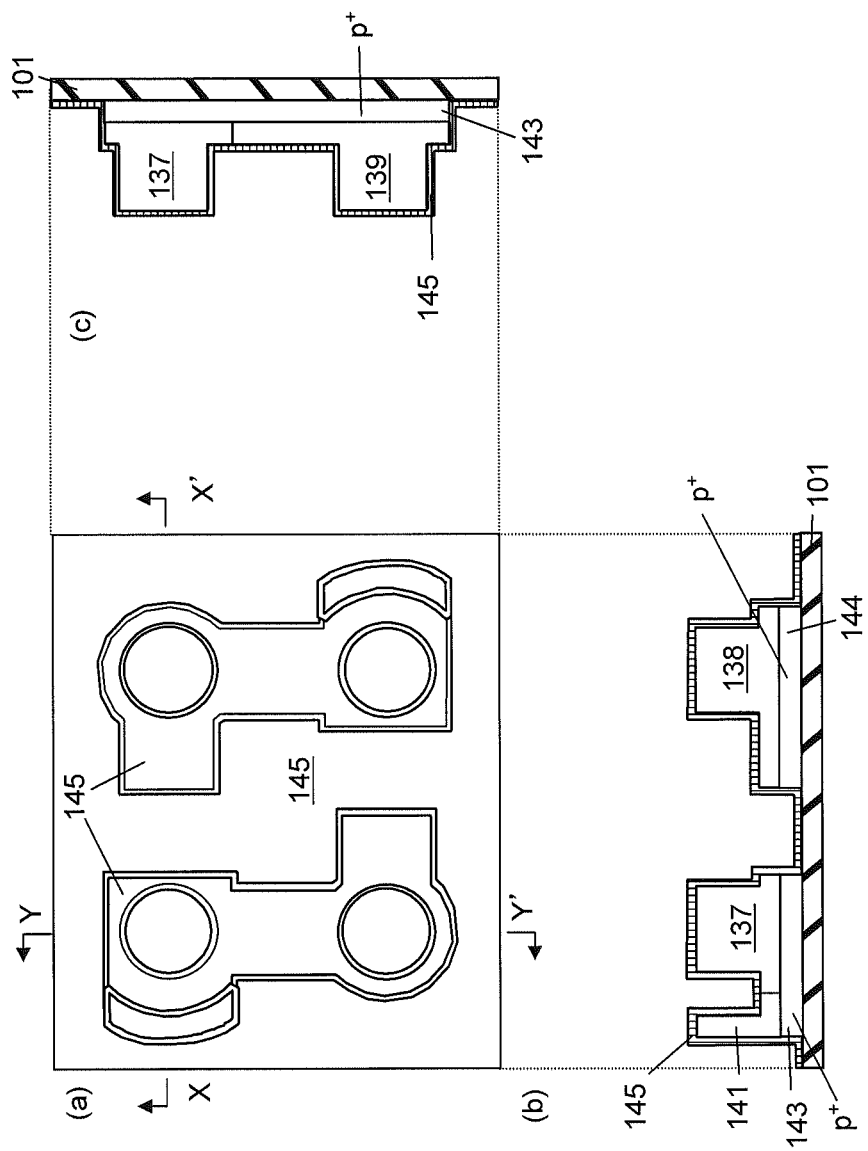
FIG. 24 shows a step in the example of the production process, wherein (a), (b) and (c) are a top plan view, a sectional view taken along the line X-X' in (a), and a sectional view taken along the line Y-Y' in (a), respectively.

Referring to FIG. 24, a nitride film 145 is deposited.

Figure 25:
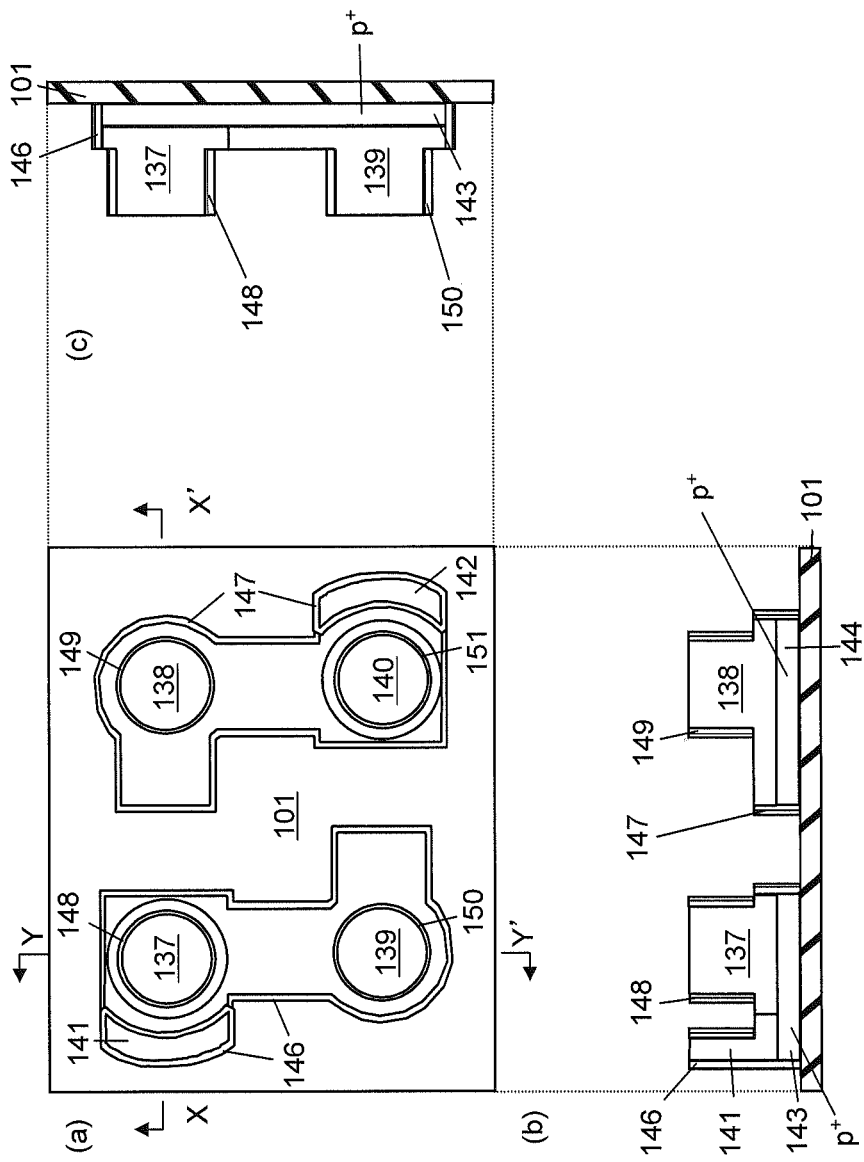
FIG. 25 shows a step in the example of the production process, wherein (a), (b) and (c) are a top plan view, a sectional view taken along the line X-X' in (a), and a sectional view taken along the line Y-Y' in (a), respectively.

Referring to FIG. 25, the nitride film 145 is etched to form six nitride film-based sidewalls 146, 147, 148, 149, 150, 151 for protecting channel regions during ion implantation in a subsequent step.

Figure 26:
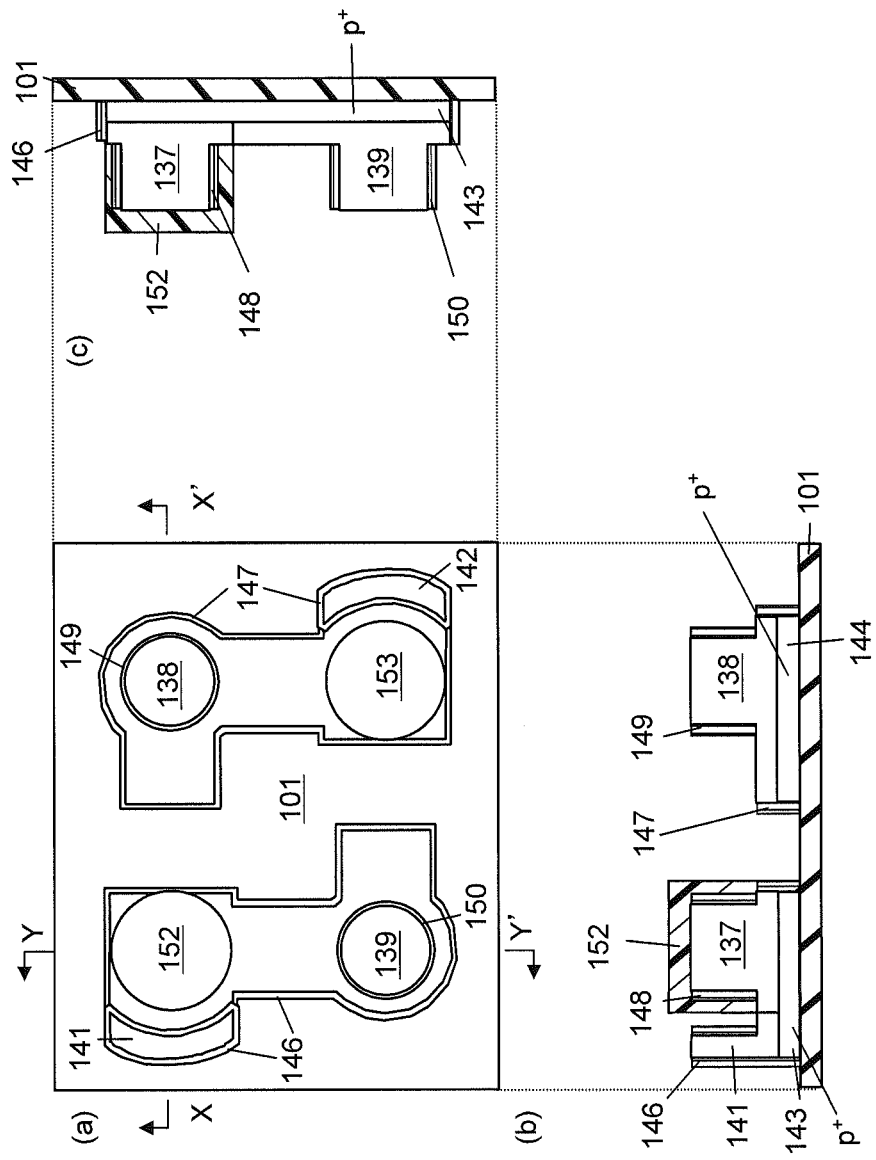
FIG. 26 shows a step in the example of the production process, wherein (a), (b) and (c) are a top plan view, a sectional view taken along the line X-X' in (a), and a sectional view taken along the line Y-Y' in (a), respectively.

Referring to FIG. 26, two resists 152, 153 for forming an n+-type silicon layer are formed.

Figure 27:
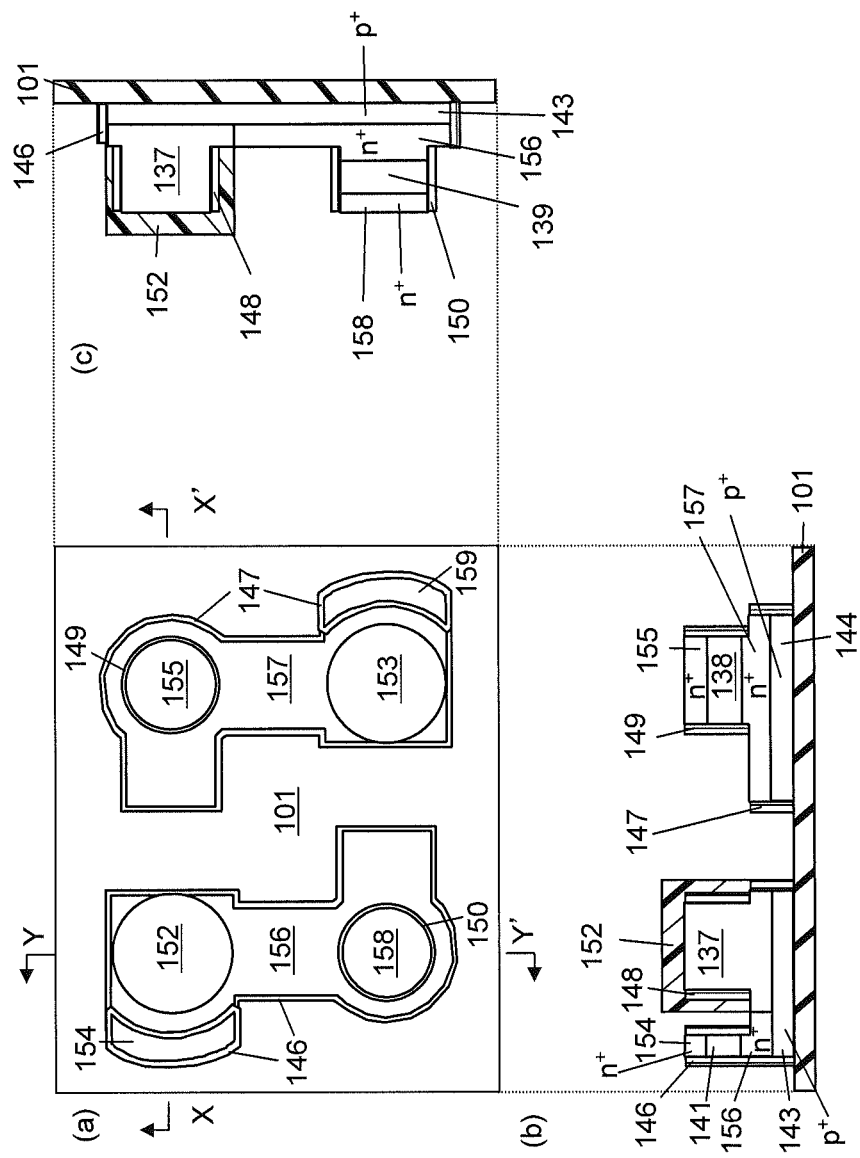
FIG. 27 shows a step in the example of the production process, wherein (a), (b) and (c) are a top plan view, a sectional view taken along the line X-X' in (a), and a sectional view taken along the line Y-Y' in (a), respectively.

Referring to FIG. 27, arsenic (As) is implanted to form a first n+-type silicon layer 154, a second n+-type silicon layer 156, a third n+-type silicon layer 159, a fourth n+-type silicon layer 157, a fifth n+-type silicon layer 155, a sixth n+-type silicon layer 157, a seventh n+-type silicon layer 158 and an eighth n+-type silicon layer 156.

Figure 28:
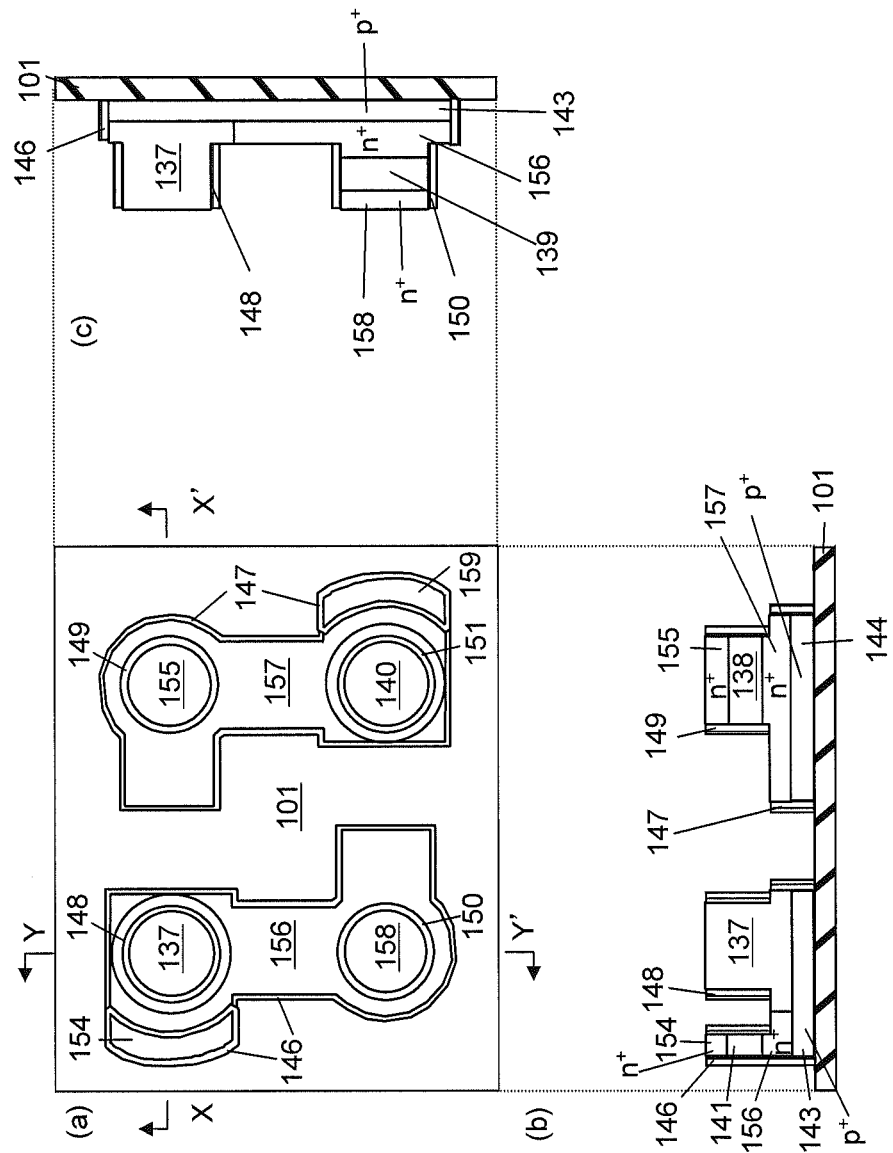
FIG. 28 shows a step in the example of the production process, wherein (a), (b) and (c) are a top plan view, a sectional view taken along the line X-X' in (a), and a sectional view taken along the line Y-Y' in (a), respectively.

Referring to FIG. 28, the resists 152, 153 are stripped away.

Figure 29:
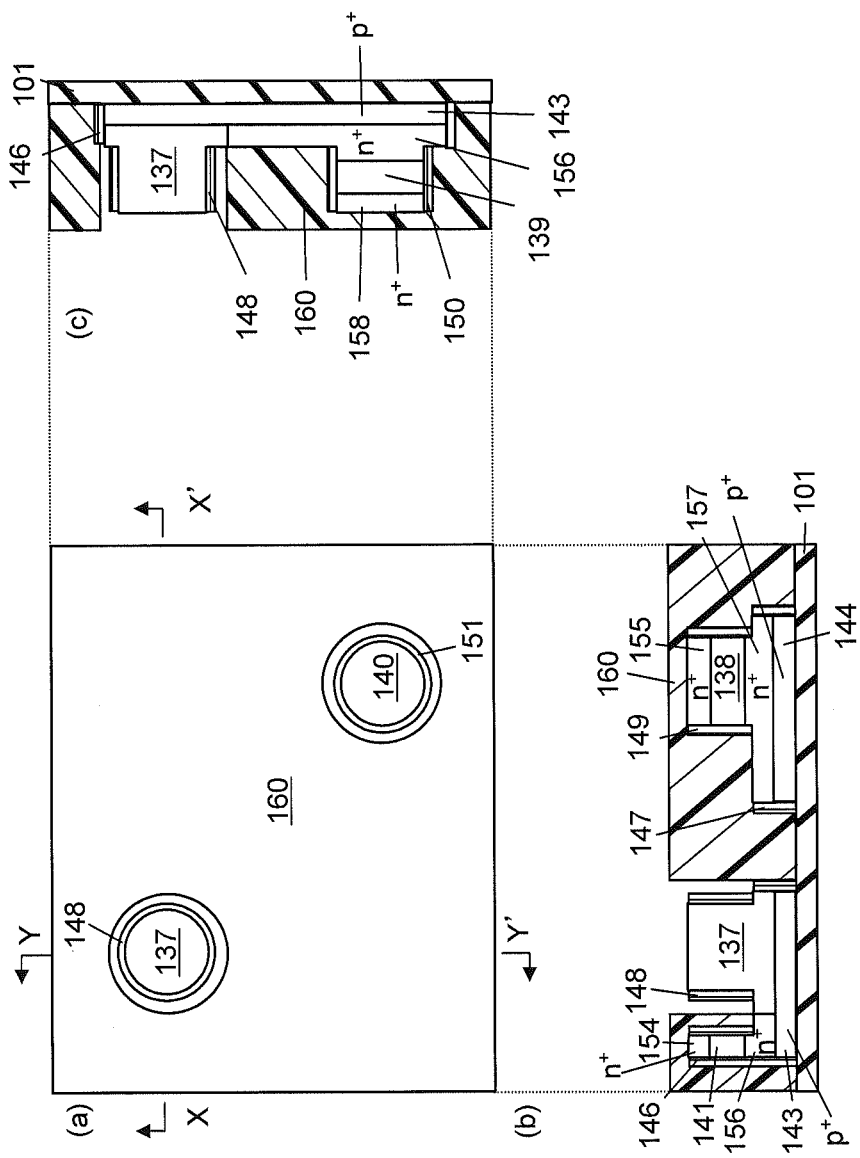
FIG. 29 shows a step in the example of the production process, wherein (a), (b) and (c) are a top plan view, a sectional view taken along the line X-X' in (a), and a sectional view taken along the line Y-Y' in (a), respectively.

Referring to FIG. 29, a resist 160 for forming a p+-type silicon layer is formed.

Figure 30:
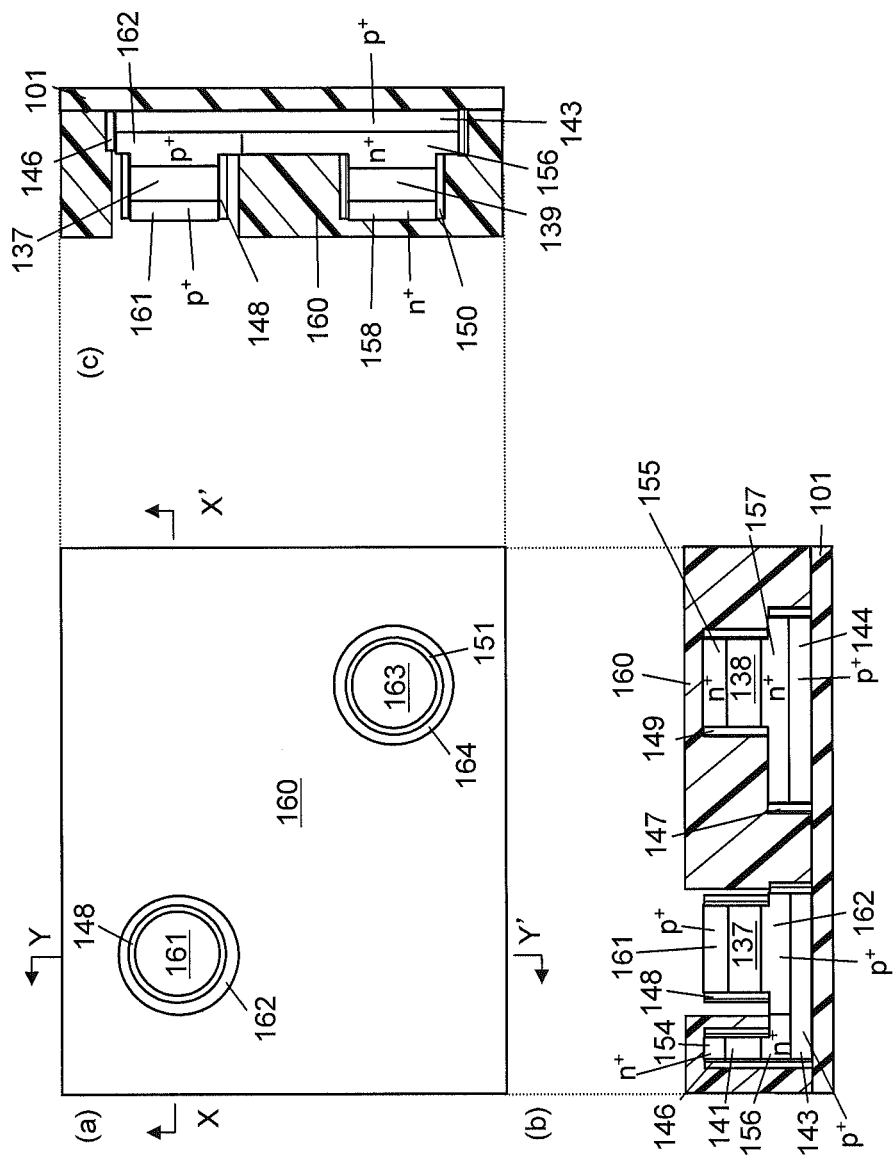
FIG. 30 shows a step in the example of the production process, wherein (a), (b) and (c) are a top plan view, a sectional view taken along the line X-X' in (a), and a sectional view taken along the line Y-Y' in (a), respectively.

Referring to FIG. 30, boron (B) is implanted to form a first p+-type silicon layer 161, a second p+-type silicon layer 162, a third p+-type silicon layer 163 and a fourth p+-type silicon layer 164.

Figure 31:
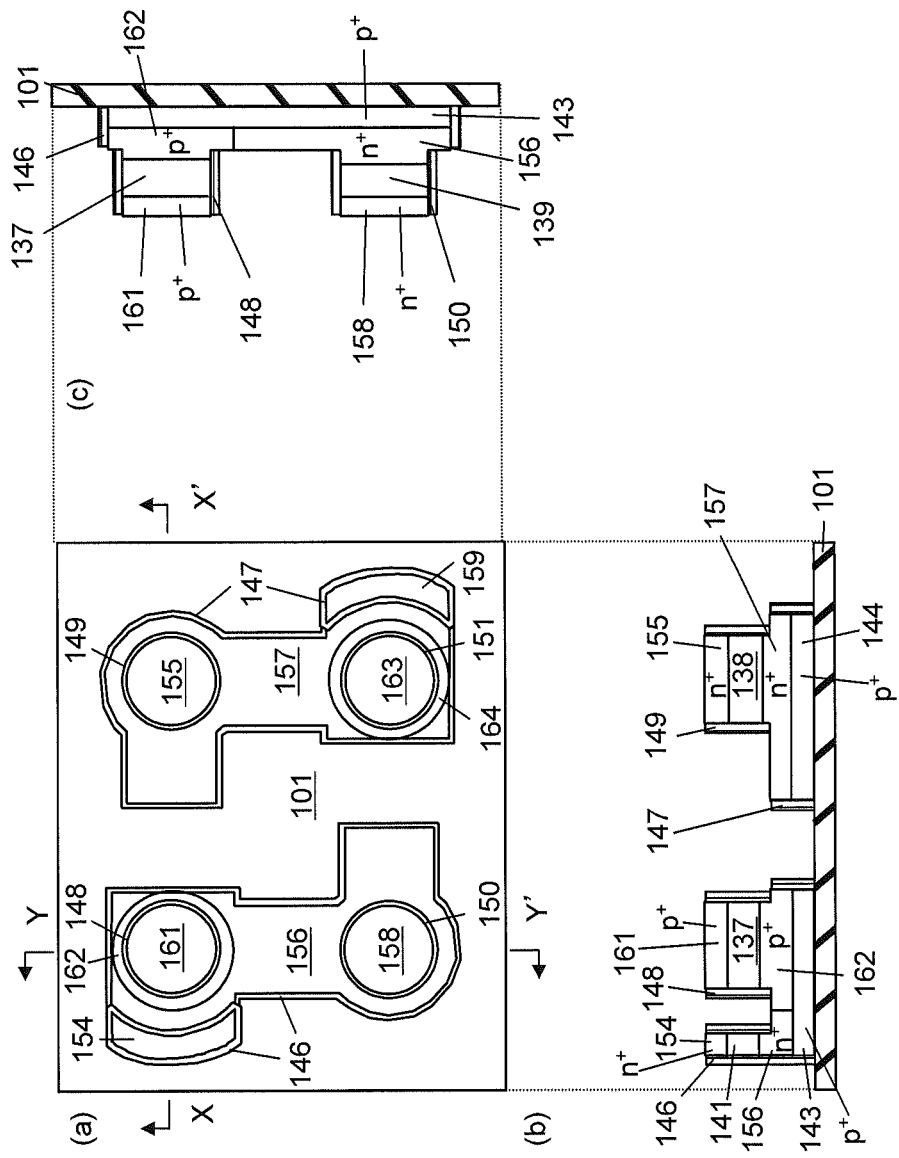
FIG. 31 shows a step in the example of the production process, wherein (a), (b) and (c) are a top plan view, a sectional view taken along the line X-X' in (a), and a sectional view taken along the line Y-Y' in (a), respectively.

Referring to FIG. 31, the resist 160 is stripped away, and then a heat treatment is performed.

Figure 32:
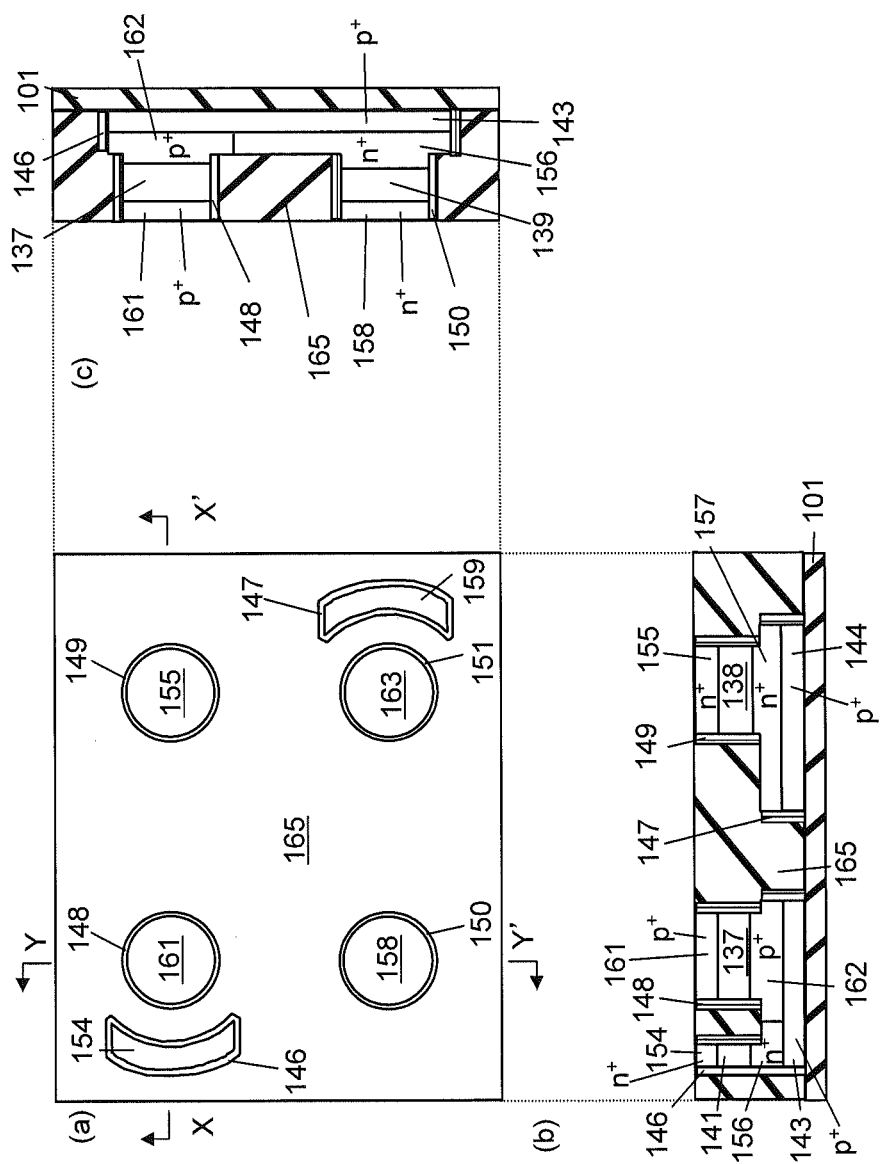
FIG. 32 shows a step in the example of the production process, wherein (a), (b) and (c) are a top plan view, a sectional view taken along the line X-X' in (a), and a sectional view taken along the line Y-Y' in (a), respectively.

Referring to FIG. 32, an oxide film 165 is deposited, and then subjected to flattening and etching-back to expose the first n+-type silicon layer 154, the third n+-type silicon layer 159, the fifth n+-type silicon layer 155, the seventh n+-type silicon layer 158, the first p+-type silicon layer 161 and the third p+-type silicon layer 163.

Figure 33:
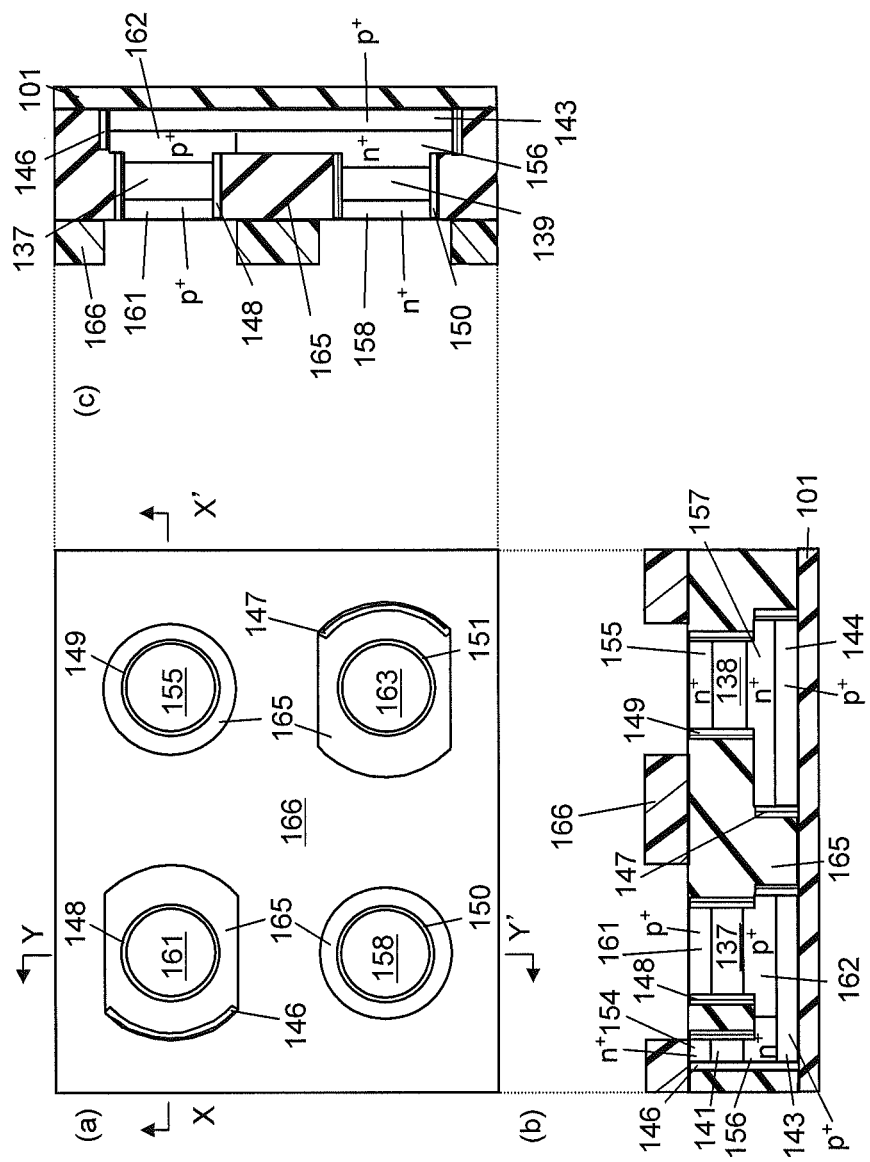
FIG. 33 shows a step in the example of the production process, wherein (a), (b) and (c) are a top plan view, a sectional view taken along the line X-X' in (a), and a sectional view taken along the line Y-Y' in (a), respectively.

Referring to FIG. 33, a resist 166 for forming a gate section is formed.

Figure 34:
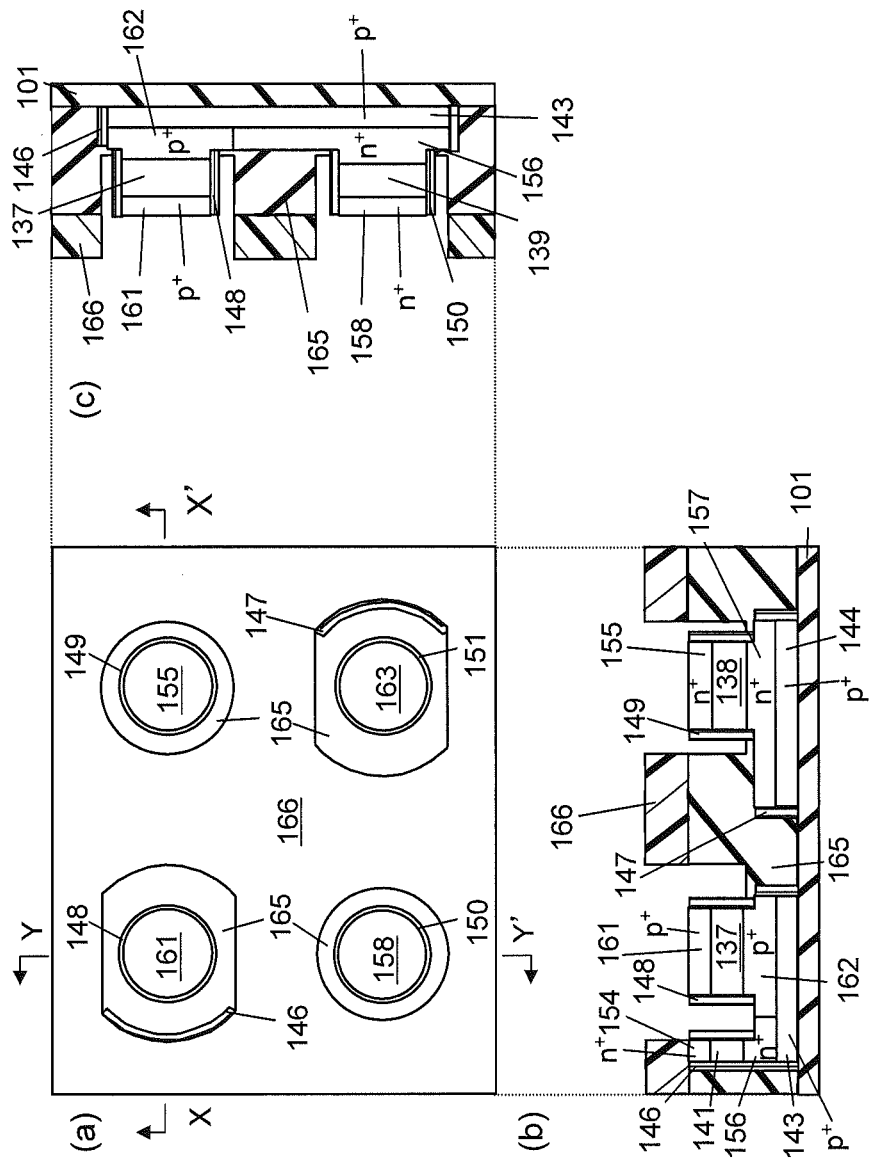
FIG. 34 shows a step in the example of the production process, wherein (a), (b) and (c) are a top plan view, a sectional view taken along the line X-X' in (a), and a sectional view taken along the line Y-Y' in (a), respectively.

Referring to FIG. 34, a portion of the oxide film 165 corresponding to the gate section is etched.

Figure 35:
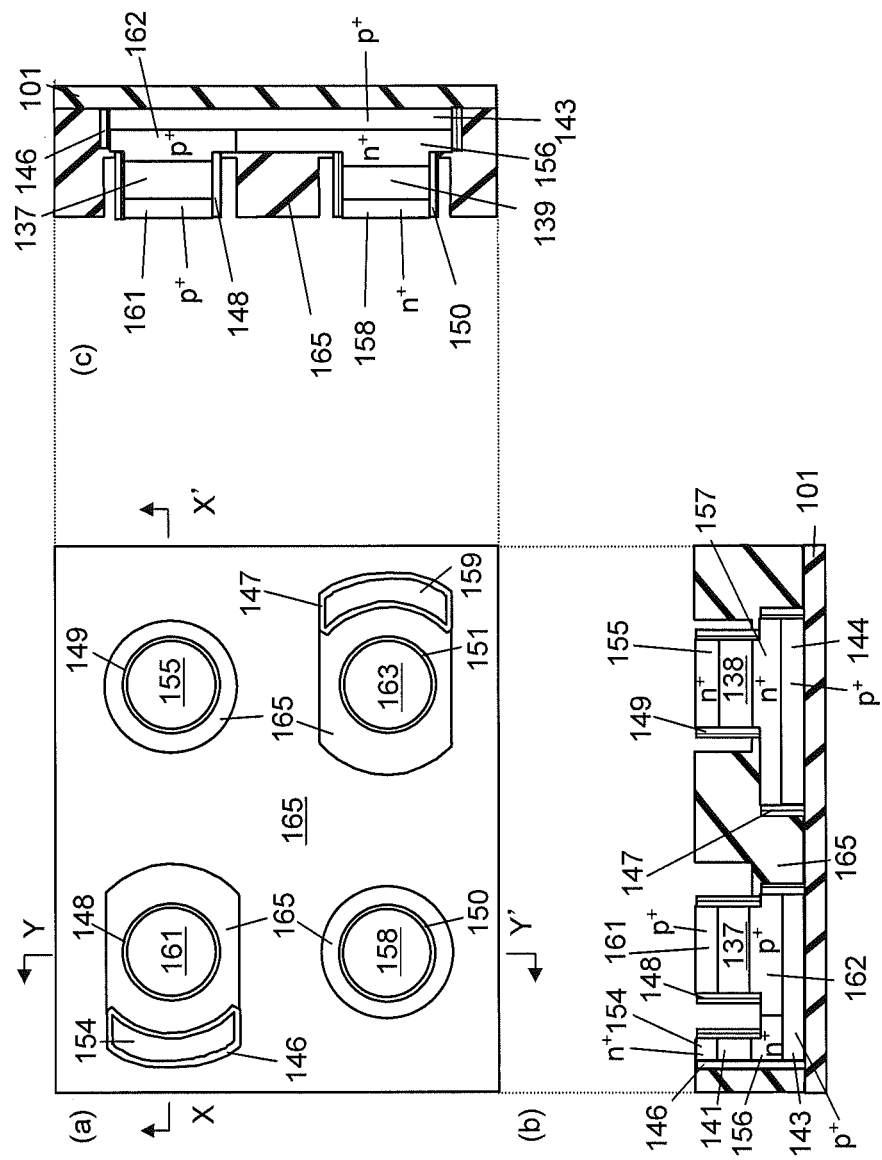
FIG. 35 shows a step in the example of the production process, wherein (a), (b) and (c) are a top plan view, a sectional view taken along the line X-X in (a), and a sectional view taken along the line Y-Y' in (a), respectively.

Referring to FIG. 35, the resist 166 is stripped away.

Figure 36:
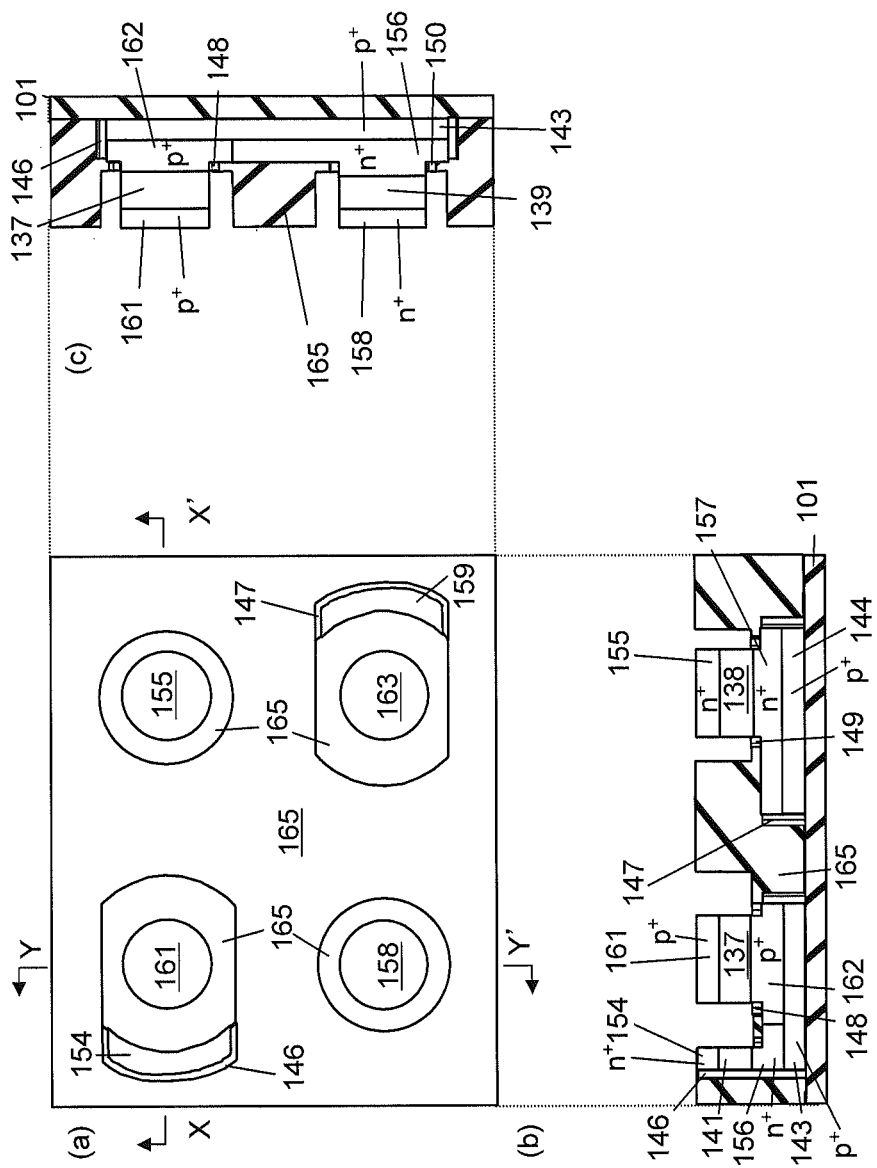
FIG. 36 shows a step in the example of the production process, wherein (a), (b) and (c) are a top plan view, a sectional view taken along the line X-X' in (a), and a sectional view taken along the line Y-Y' in (a), respectively.

Referring to FIG. 36, the nitride film-based sidewalls 148, 149, 150, 151 are etched away.

Figure 37:
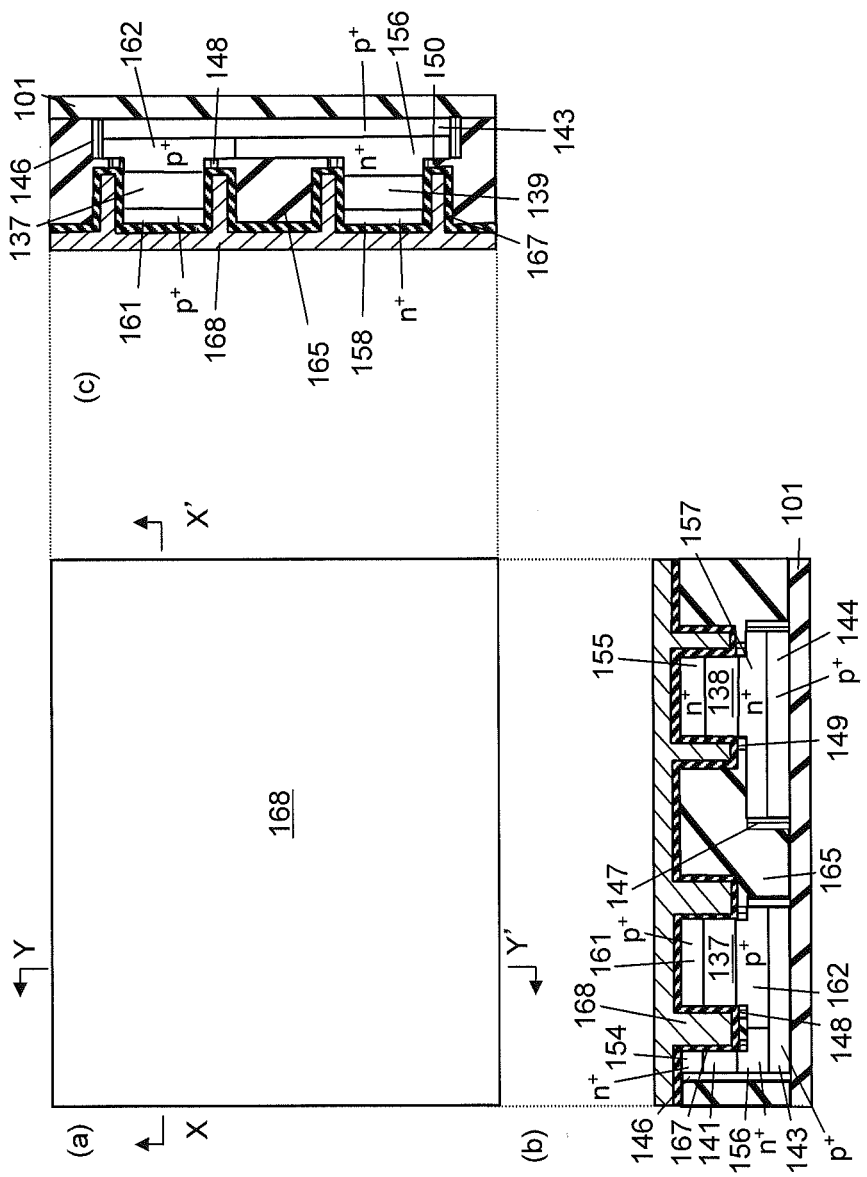
FIG. 37 shows a step in the example of the production process, wherein (a), (b) and (c) are a top plan view, a sectional view taken along the line X-X' in (a), and a sectional view taken along the line Y-Y' in (a), respectively.

Referring to FIG. 37, a high-K (high-dielectric constant) film 167 is deposited, and then a metal 168, such as titanium nitride (TiN), is deposited.

Figure 38:
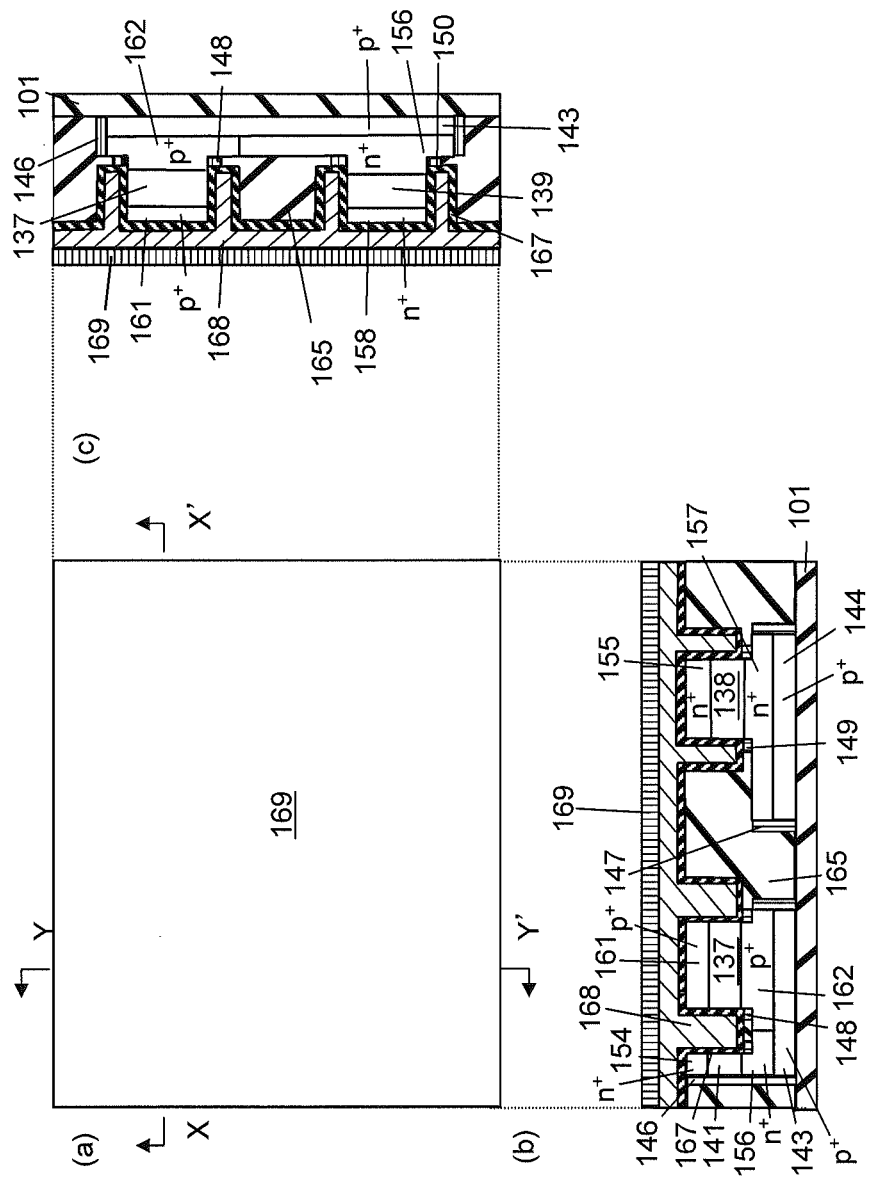
FIG. 38 shows a step in the example of the production process, wherein (a), (b) and (c) are a top plan view, a sectional view taken along the line X-X' in (a), and a sectional view taken along the line Y-Y' in (a), respectively.

Referring to FIG. 38, a nitride film 169 is deposited.

Figure 39:
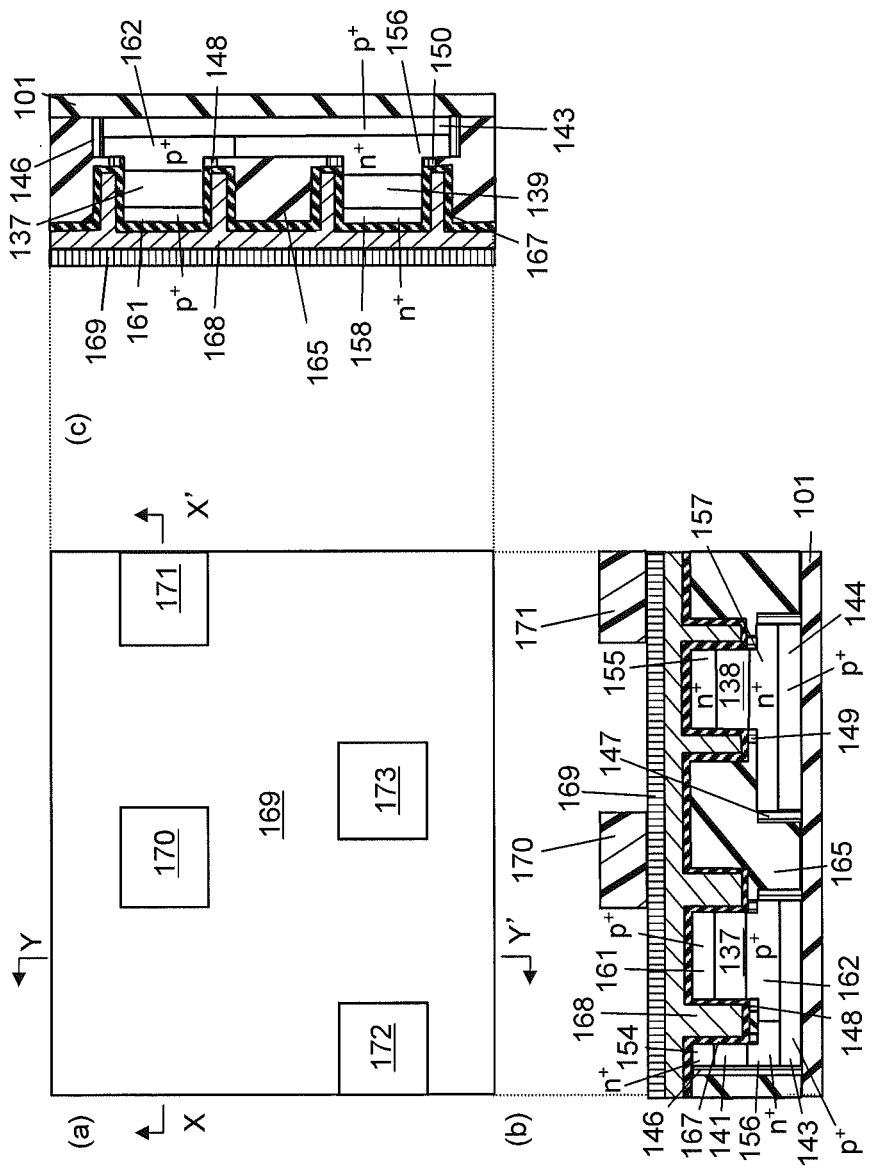
FIG. 39 shows a step in the example of the production process, wherein (a), (b) and (c) are a top plan view, a sectional view taken along the line X-X' in (a), and a sectional view taken along the line Y-Y' in (a), respectively.

Referring to FIG. 39, four resists 170, 171, 172, 173 for forming a gate pad is formed.

Figure 40:
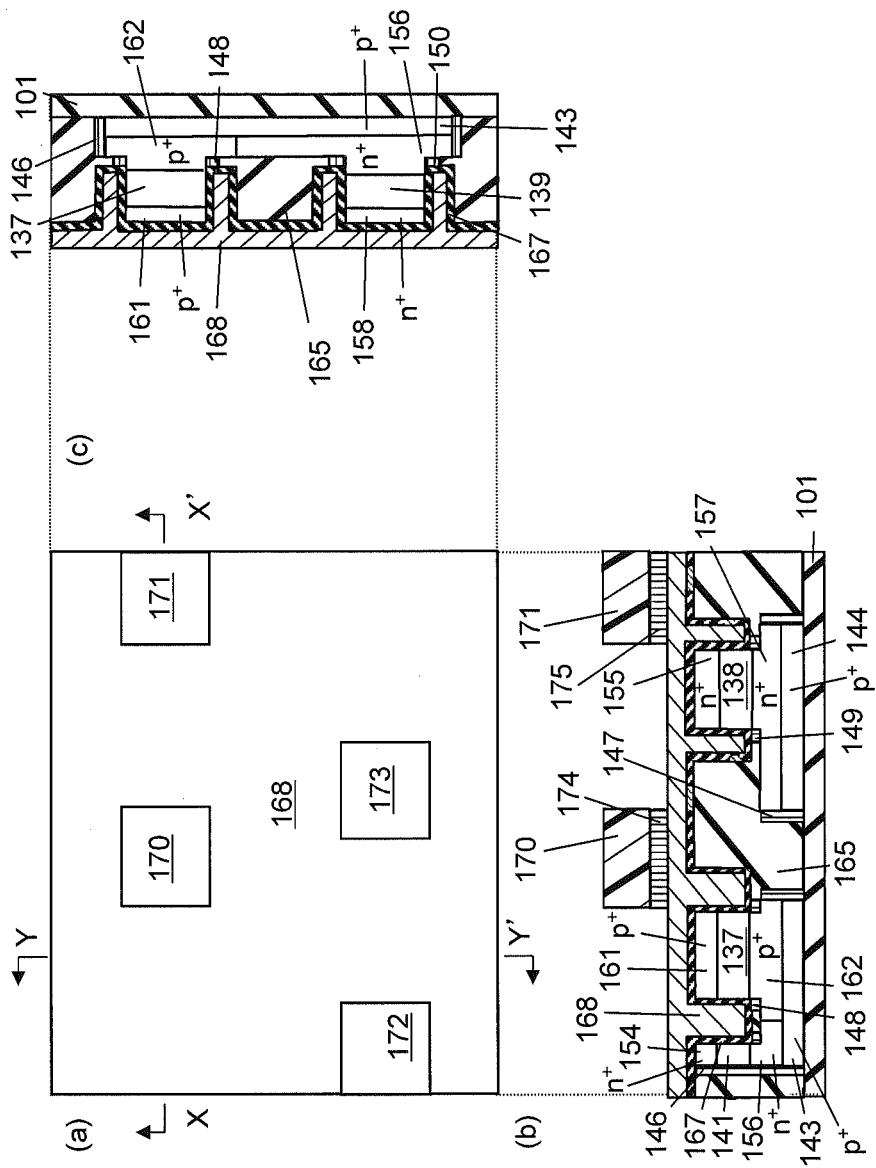
FIG. 40 shows a step in the example of the production process, wherein (a), (b) and (c) are a top plan view, a sectional view taken along the line X-X' in (a), and a sectional view taken along the line Y-Y' in (a), respectively.
Figure 41:
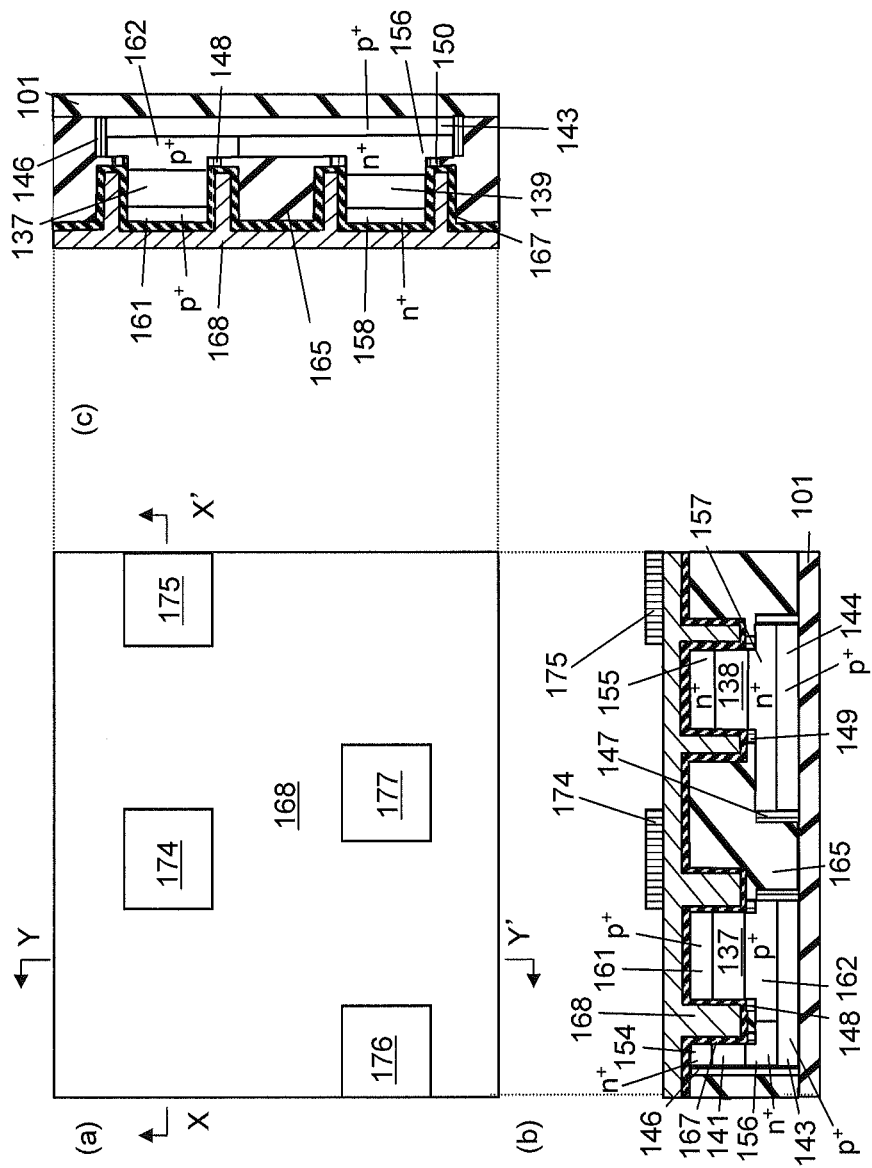
FIG. 41 shows a step in the example of the production process, wherein (a), (b) and (c) are a top plan view, a sectional view taken along the line X-X' in (a), and a sectional view taken along the line Y-Y' in (a), respectively.

Referring to FIG. 40, the nitride film 169 is etched to form four nitride film-based hard masks 174, 175 (two of the nitride film-based hard masks are indicated by the reference numerals 176, 177 in FIG. 41, etc.)

Referring to FIG. 41, the resists 170, 171, 172, 173 are stripped away.

Figure 42:
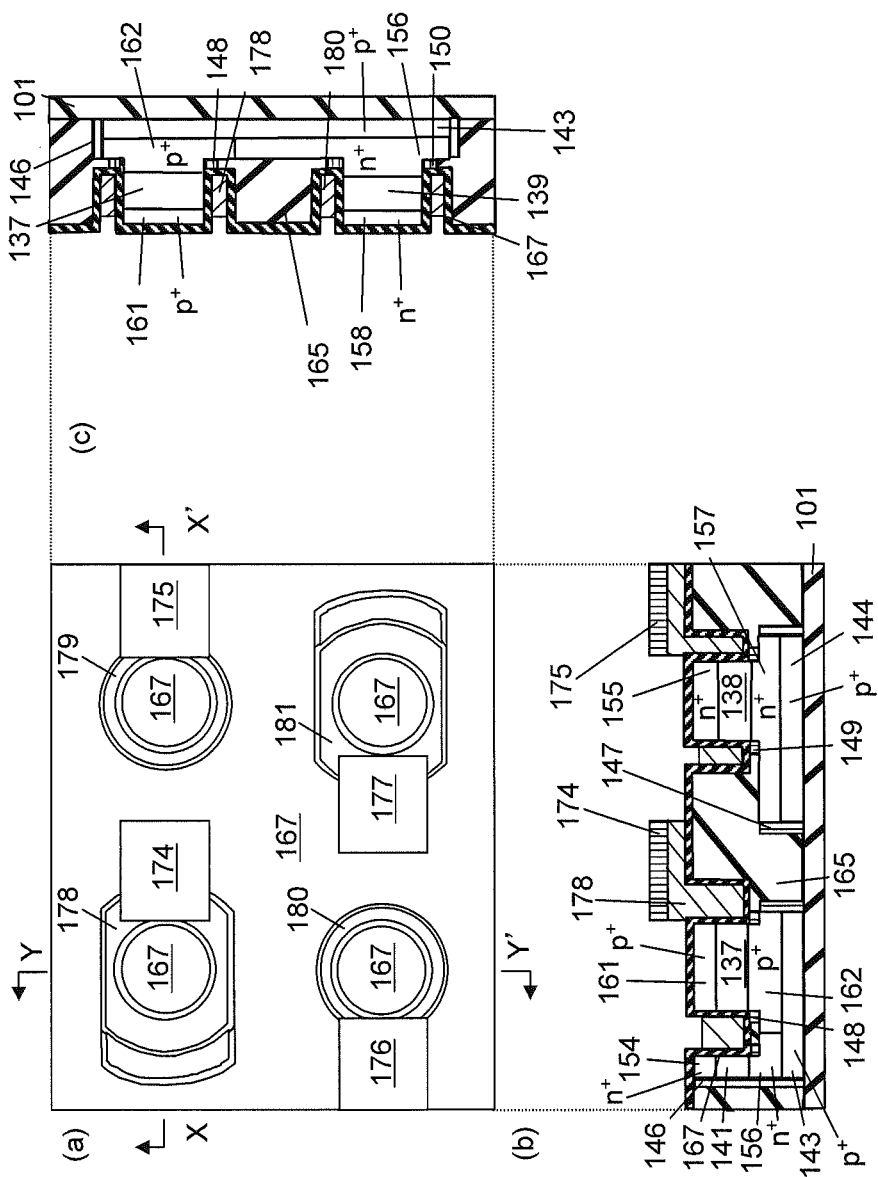
FIG. 42 shows a step in the example of the production process, wherein (a), (b) and (c) are a top plan view, a sectional view taken along the line X-X' in (a), and a sectional view taken along the line Y-Y' in (a), respectively.

Referring to FIG. 42, the metal 168 is etched to form first to fourth gate electrodes 178, 181, 179, 180.

Figure 43:
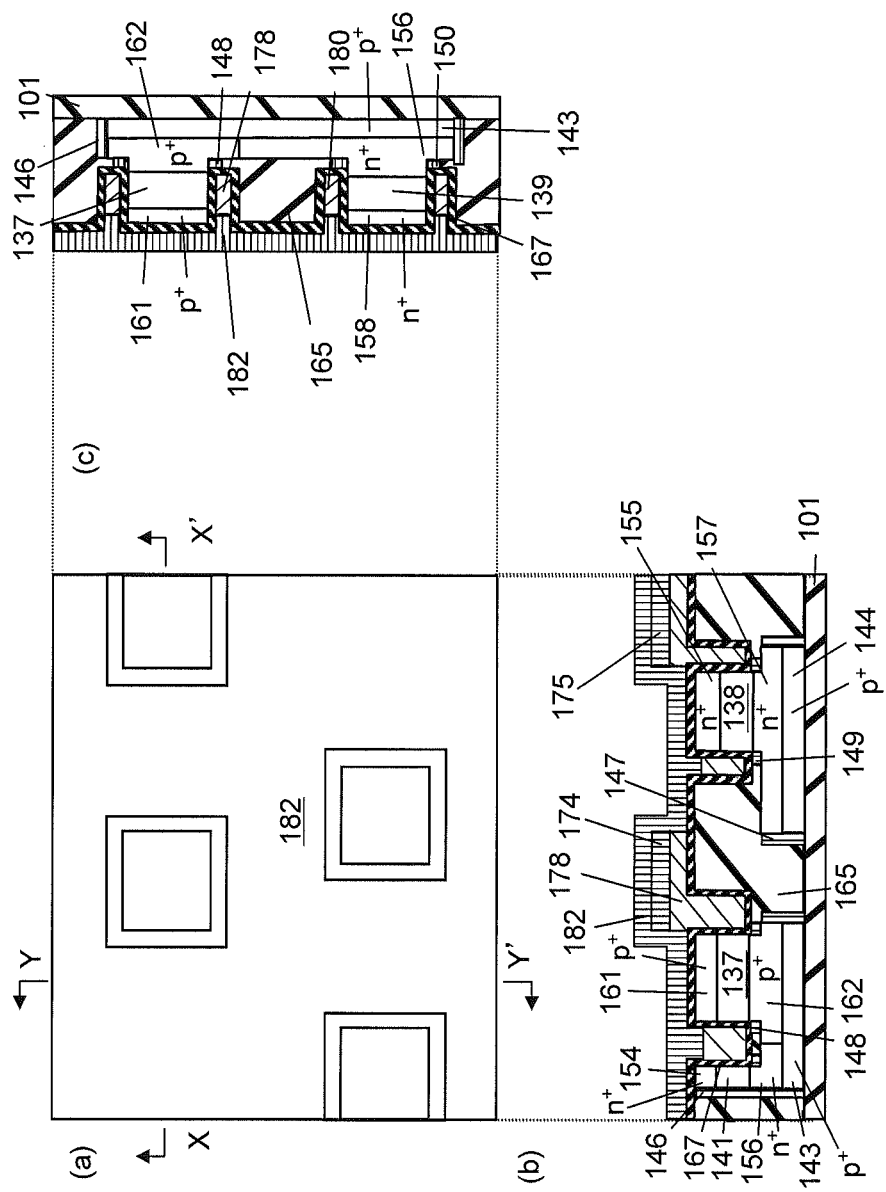
FIG. 43 shows a step in the example of the production process, wherein (a), (b) and (c) are a top plan view, a sectional view taken along the line X-X' in (a), and a sectional view taken along the line Y-Y' in (a), respectively.

Referring to FIG. 43, a nitride film 182 is deposited.

Figure 44:
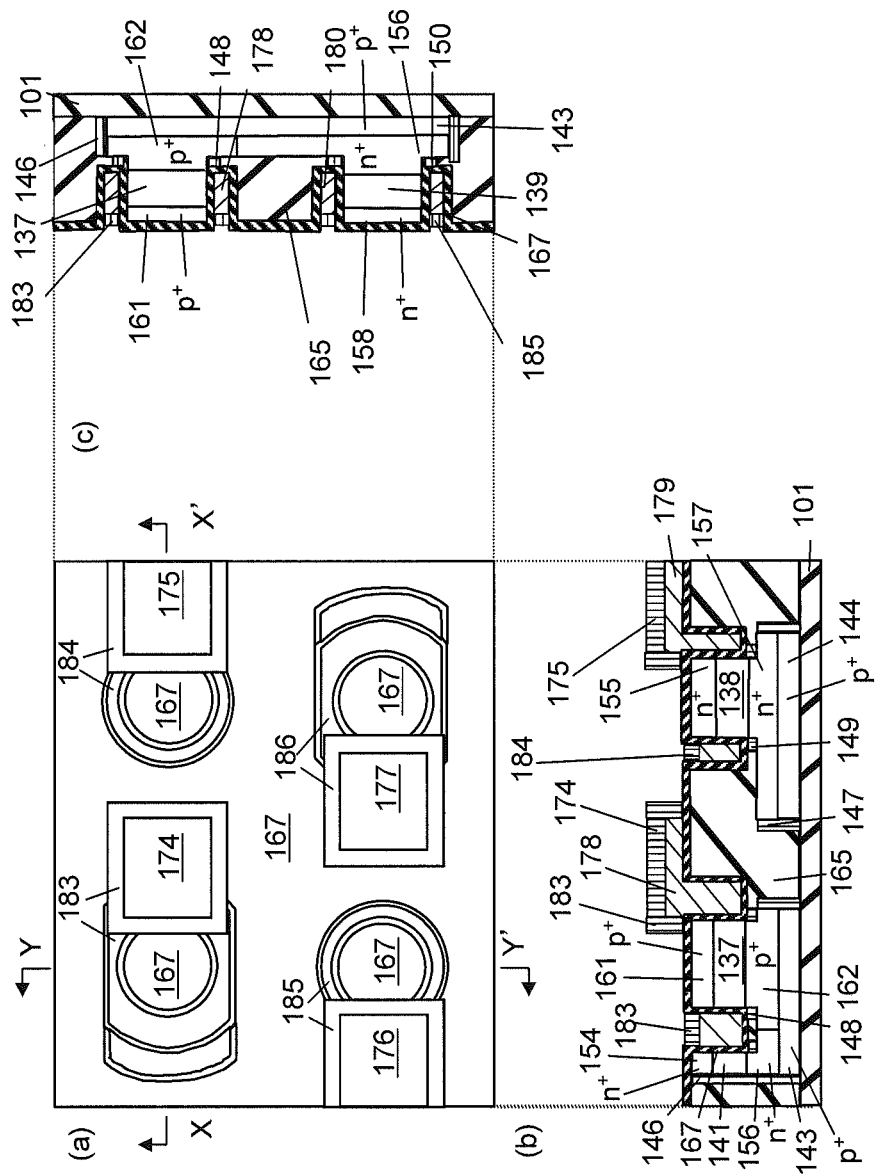
FIG. 44 shows a step in the example of the production process, wherein (a), (b) and (c) are a top plan view, a sectional view taken along the line X-X' in (a), and a sectional view taken along the line Y-Y' in (a), respectively.

Referring to FIG. 44, the nitride film 182 is etched to form four nitride film-based sidewalls 183, 184, 185, 186.

Figure 45:
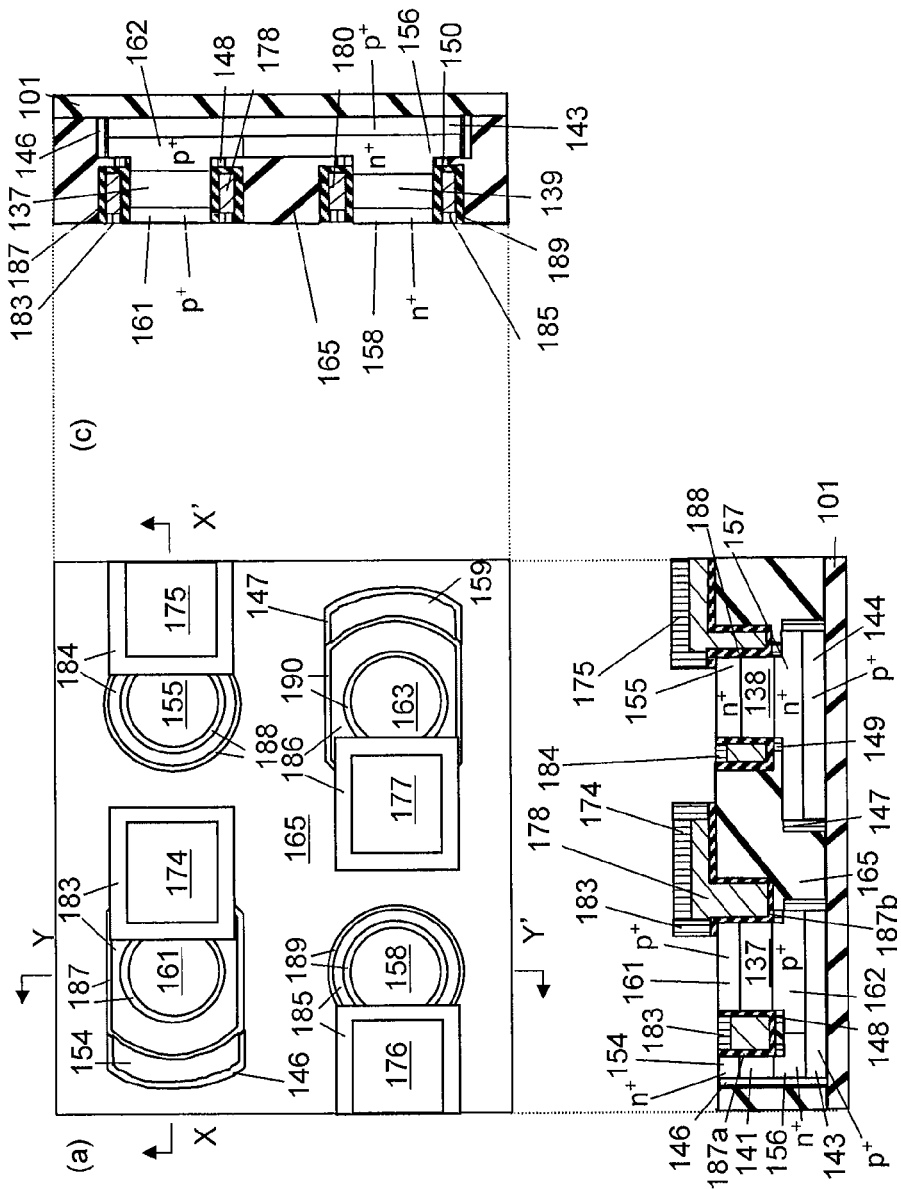
FIG. 45 shows a step in the example of the production process, wherein (a), (b) and (c) are a top plan view, a sectional view taken along the line X-X' in (a), and a sectional view taken along the line Y-Y' in (a), respectively.

Referring to FIG. 45, the high-K film is etched to form first to six high-K films (gate dielectric films) 187(a), 187(b), 190, 190, 188, 189.

Figure 46:
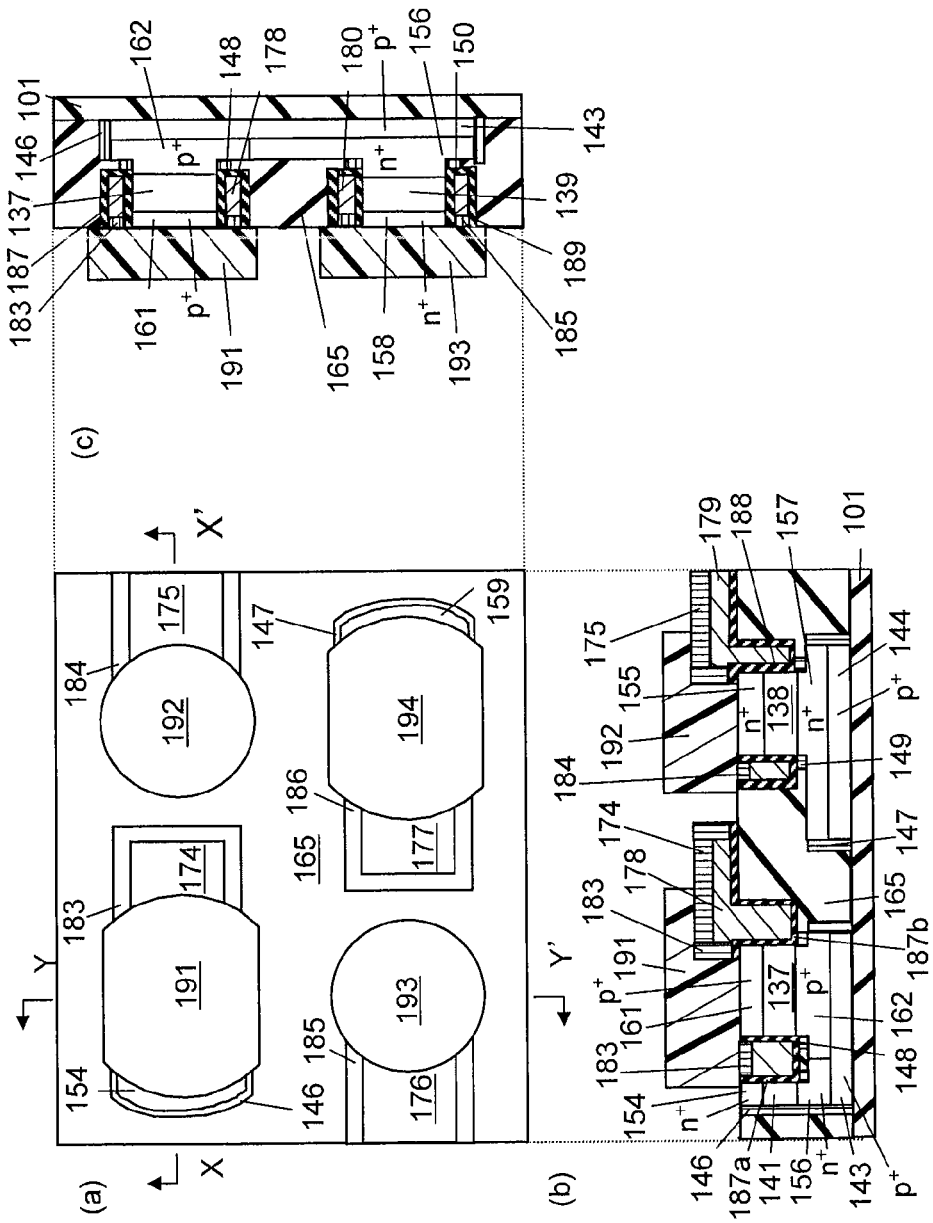
FIG. 46 shows a step in the example of the production process, wherein (a), (b) and (c) are a top plan view, a sectional view taken along the line X-X' in (a), and a sectional view taken along the line Y-Y' in (a), respectively.

Referring to FIG. 46, for resists 191, 192, 193, 194 for etching the oxide film 165 is formed.

Figure 47:
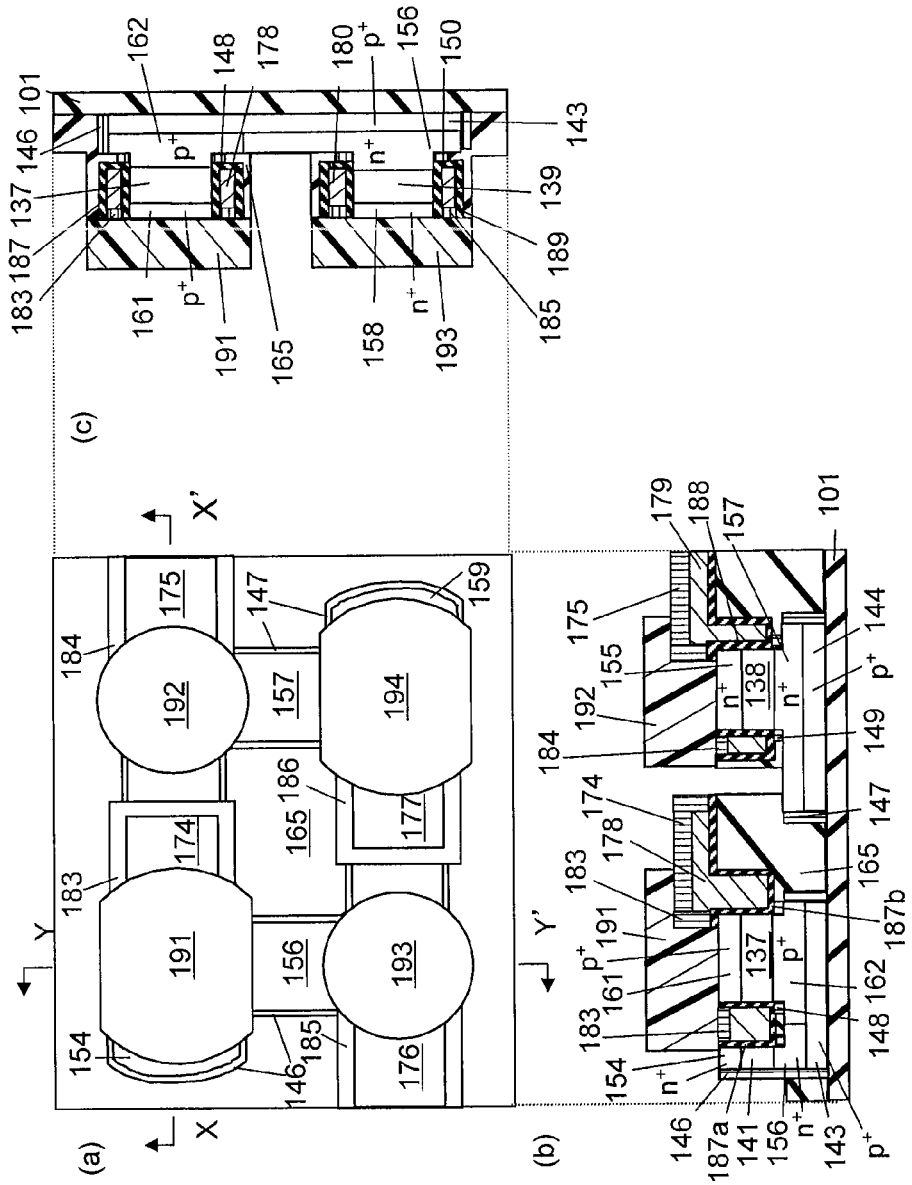
FIG. 47 shows a step in the example of the production process, wherein (a), (b) and (c) are a top plan view, a sectional view taken along the line X-X' in (a), and a sectional view taken along the line Y-Y' in (a), respectively.

Referring to FIG. 47, the oxide film 165 is dry-etched.

Figure 48:
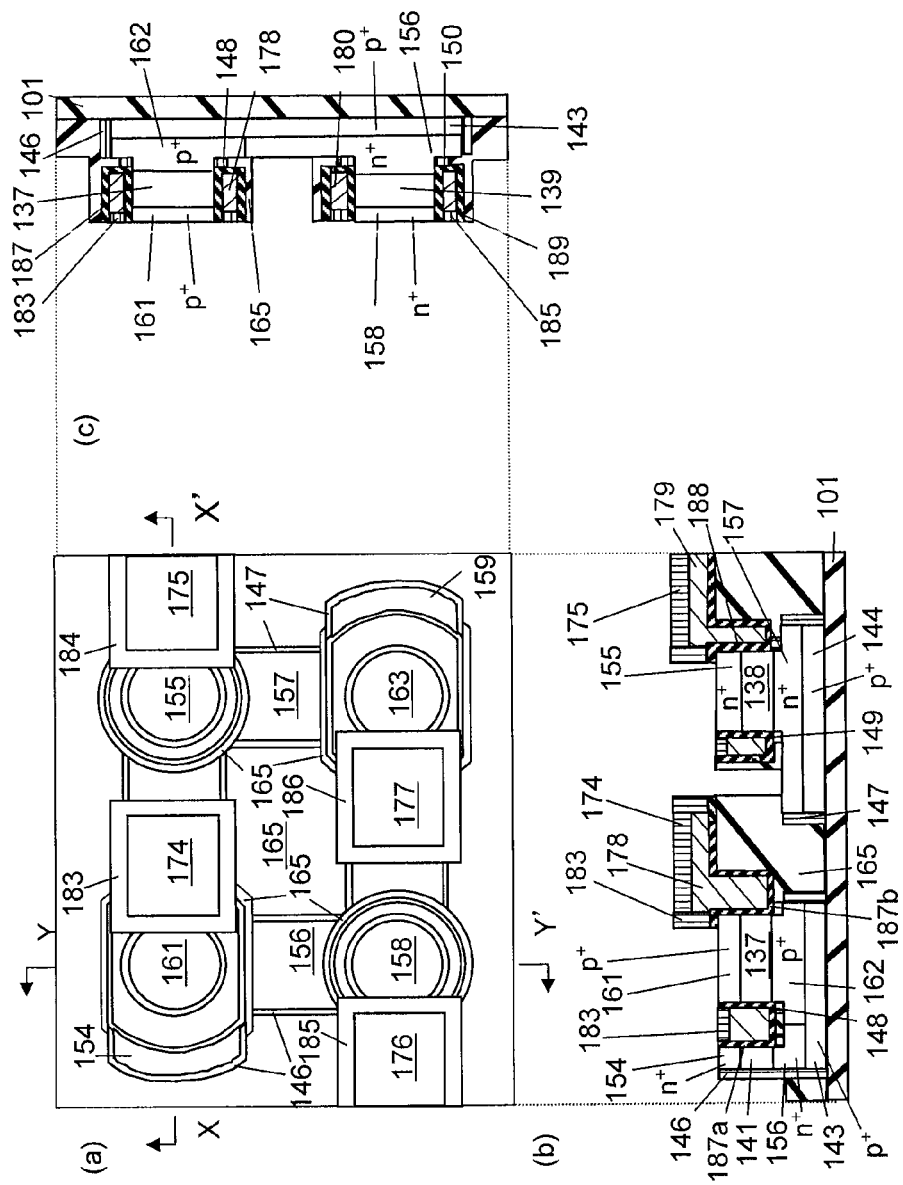
FIG. 48 shows a step in the example of the production process, wherein (a), (b) and (c) are a top plan view, a sectional view taken along the line X-X' in (a), and a sectional view taken along the line Y-Y' in (a), respectively.

Referring to FIG. 48, the resists 191, 192, 193, 194 are stripped away.

Figure 49:
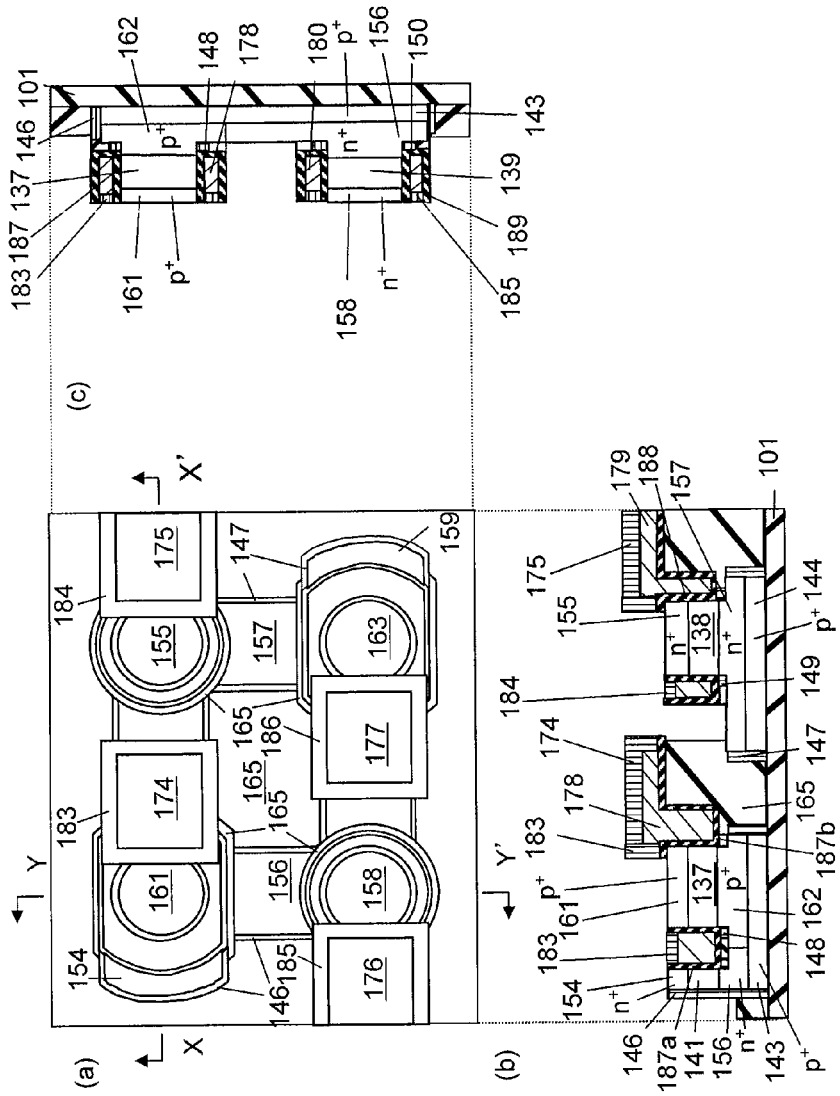
FIG. 49 shows a step in the example of the production process, wherein (a), (b) and (c) are a top plan view, a sectional view taken along the line X-X' in (a), and a sectional view taken along the line Y-Y' in (a), respectively.

Referring to FIG. 49, the oxide film 165 is wet-etched.

Figure 50:
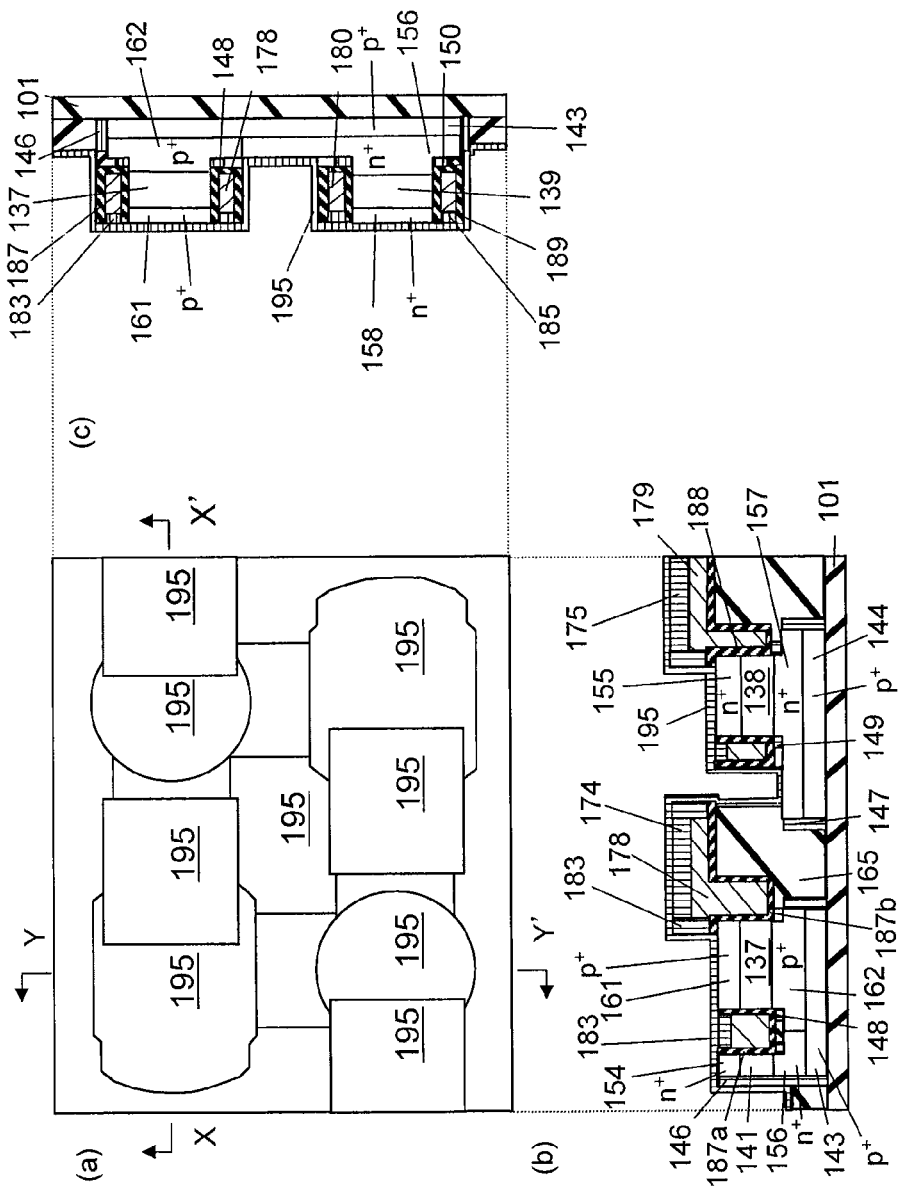
FIG. 50 shows a step in the example of the production process, wherein (a), (b) and (c) are a top plan view, a sectional view taken along the line X-X' in (a), and a sectional view taken along the line Y-Y' in (a), respectively.

Referring to FIG. 50, a nitride film 195 is deposited.

Figure 51:
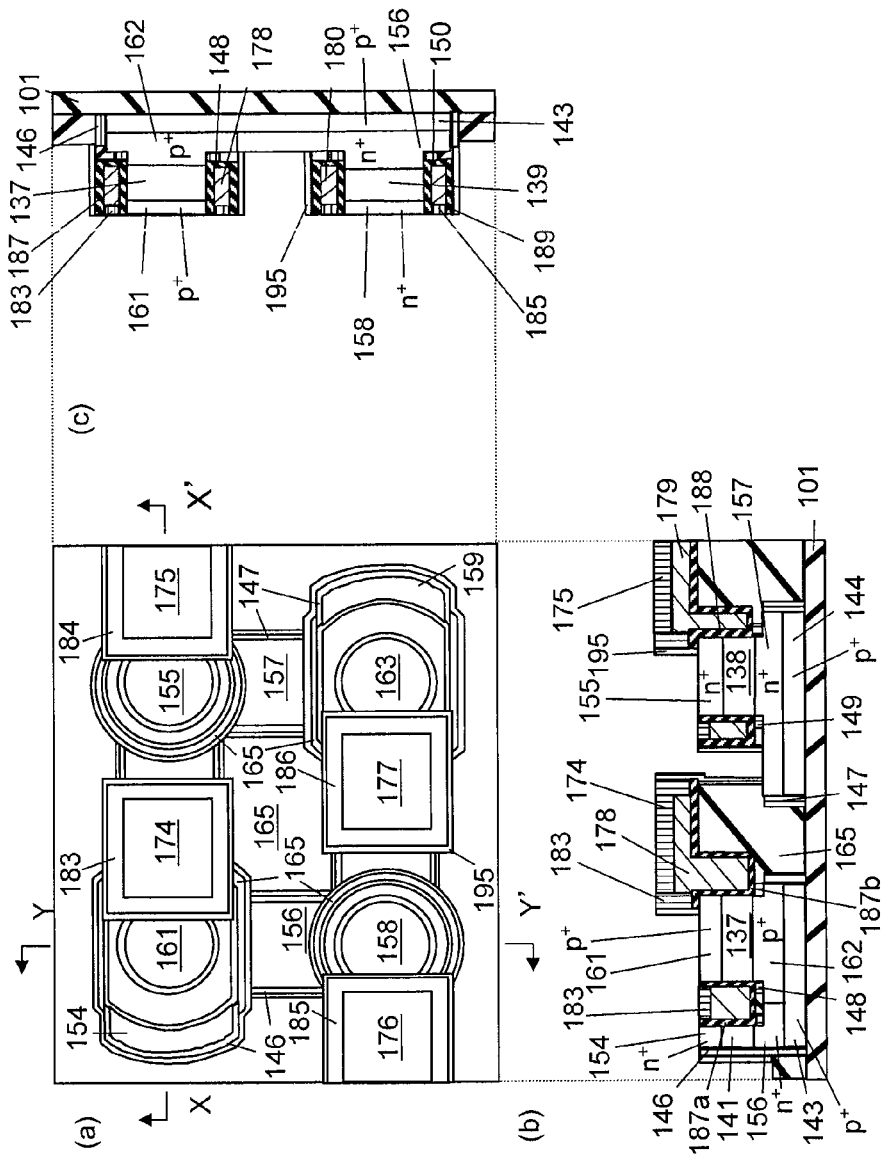
FIG. 51 shows a step in the example of the production process, wherein (a), (b) and (c) are a top plan view, a sectional view taken along the line X-X' in (a), and a sectional view taken along the line Y-Y' in (a), respectively.

Referring to FIG. 51, the nitride film 195 is etched to form nitride film-based sidewalls 195.

Figure 52:
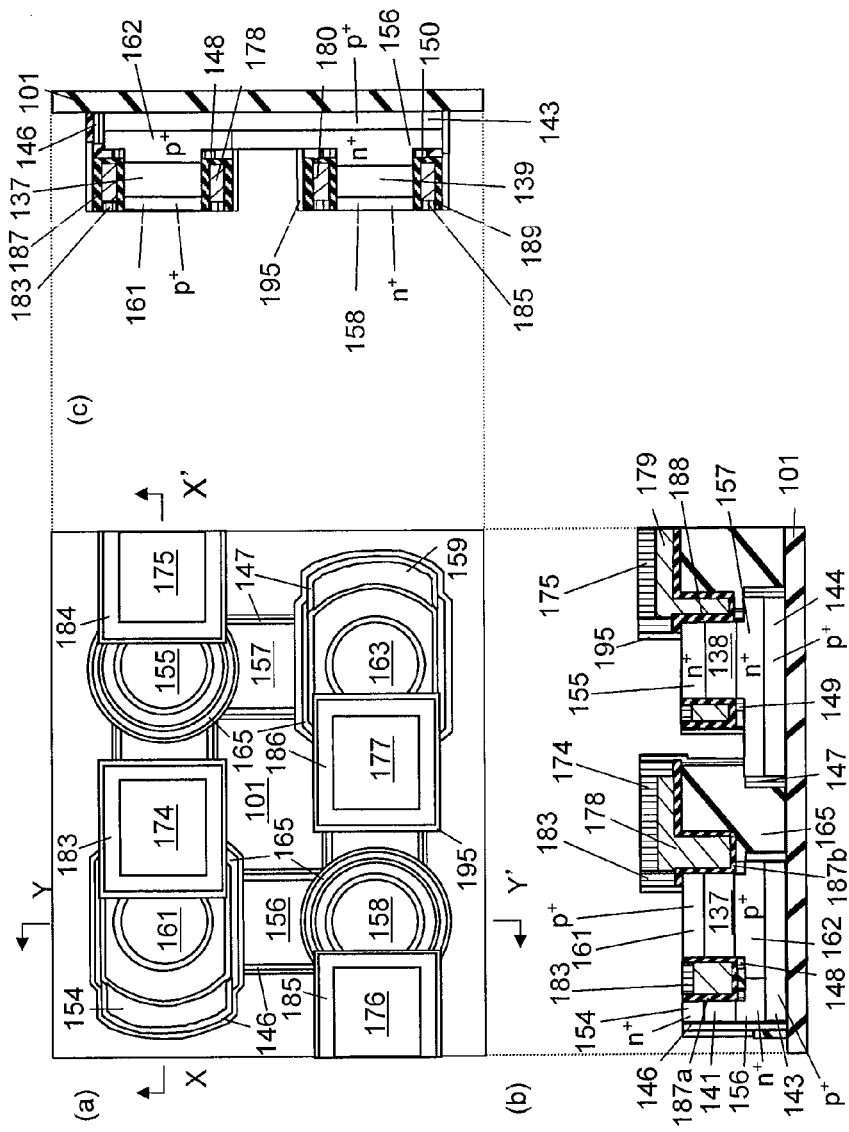
FIG. 52 shows a step in the example of the production process, wherein (a), (b) and (c) are a top plan view, a sectional view taken along the line X-X' in (a), and a sectional view taken along the line Y-Y' in (a), respectively.

Referring to FIG. 52, the oxide film 165 is dry-etched.

Figure 53:
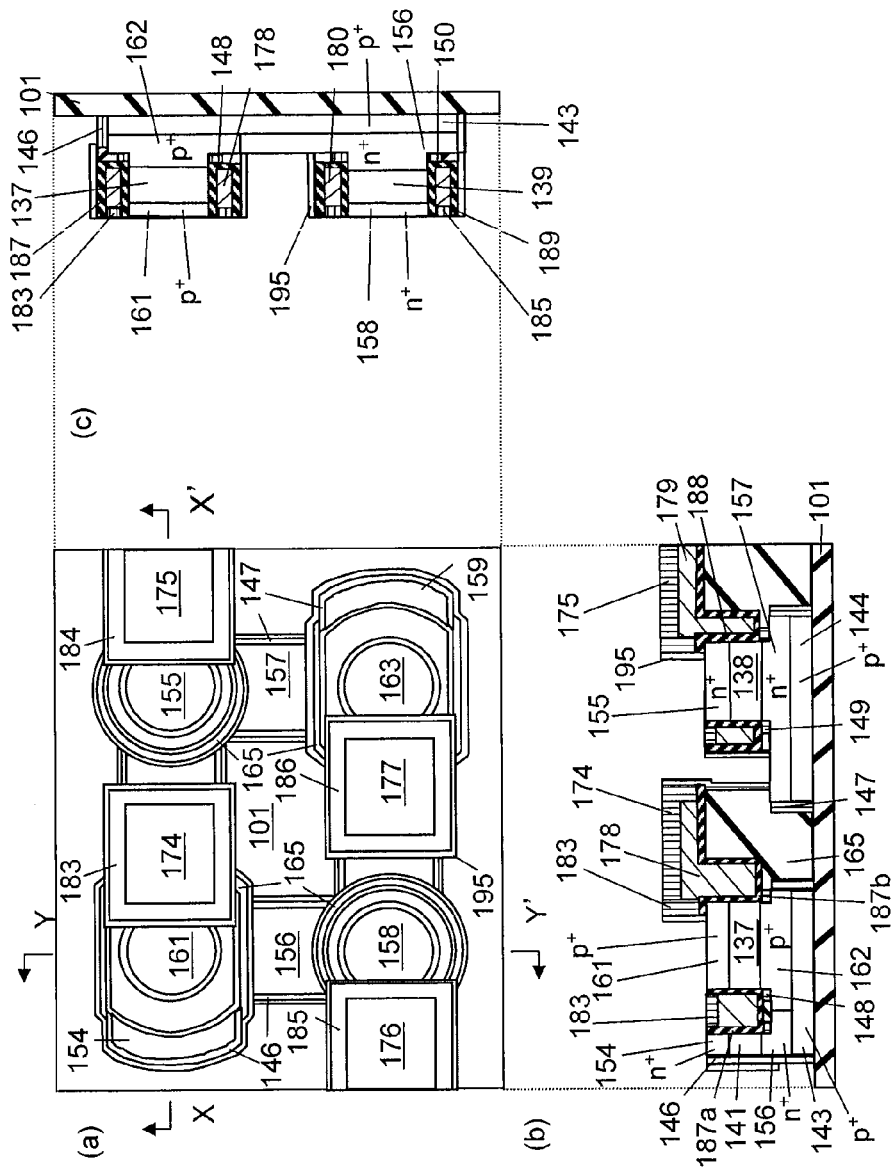
FIG. 53 shows a step in the example of the production process, wherein (a), (b) and (c) are a top plan view, a sectional view taken along the line X-X' in (a), and a sectional view taken along the line Y-Y' in (a), respectively.

Referring to FIG. 53, the oxide film 165 is wet-etched to expose the nitride film-based sidewalls 146, 147.

Figure 54:
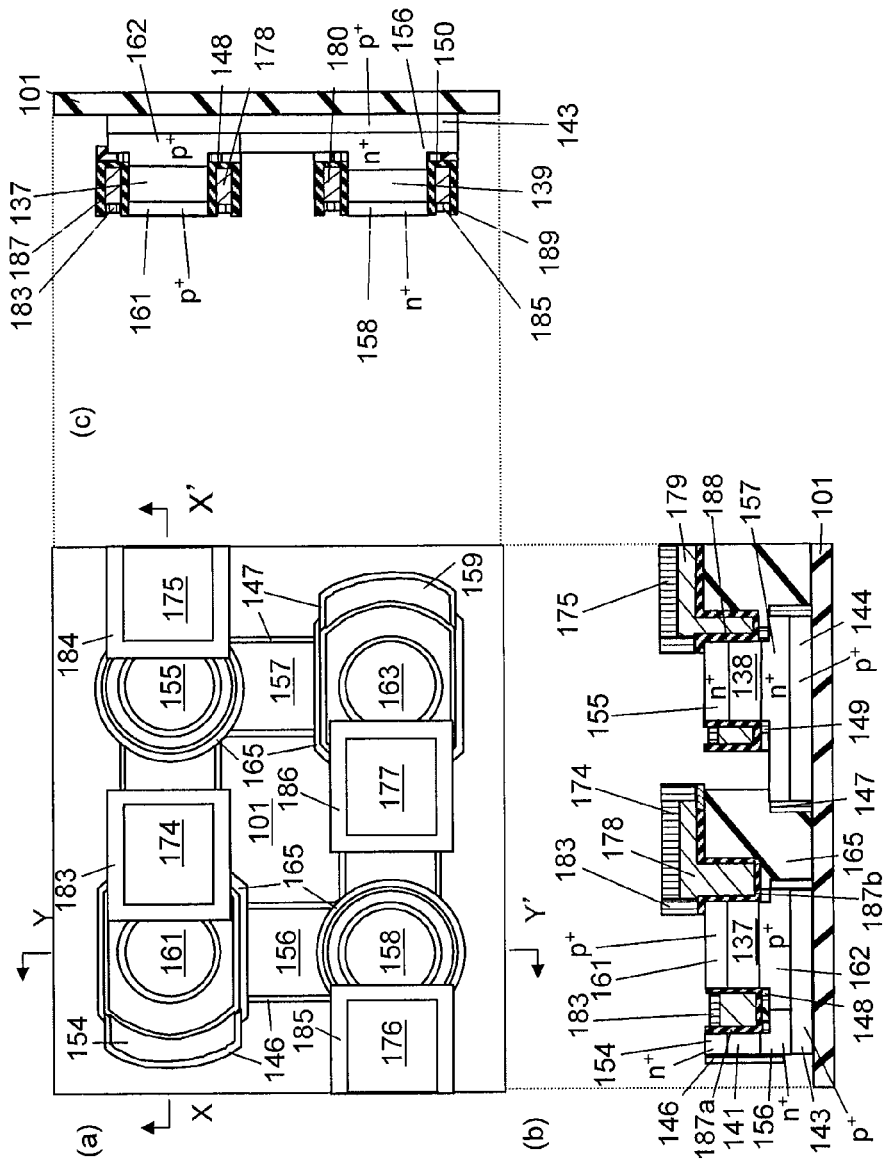
FIG. 54 shows a step in the example of the production process, wherein (a), (b) and (c) are a top plan view, a sectional view taken along the line X-X' in (a), and a sectional view taken along the line Y-Y' in (a), respectively.

Referring to FIG. 54, the nitride film-based sidewalls 195 are etched, and a part of the nitride film-based sidewalls 146, 147 is etched, to expose a part of respective sidewalls of the second n+-type silicon layer 156, the fifth p+-type silicon layer 143, and a part of respective sidewalls of the fourth n+-type silicon layer 157 and the sixth p+-type silicon layer 144.

Figure 55:
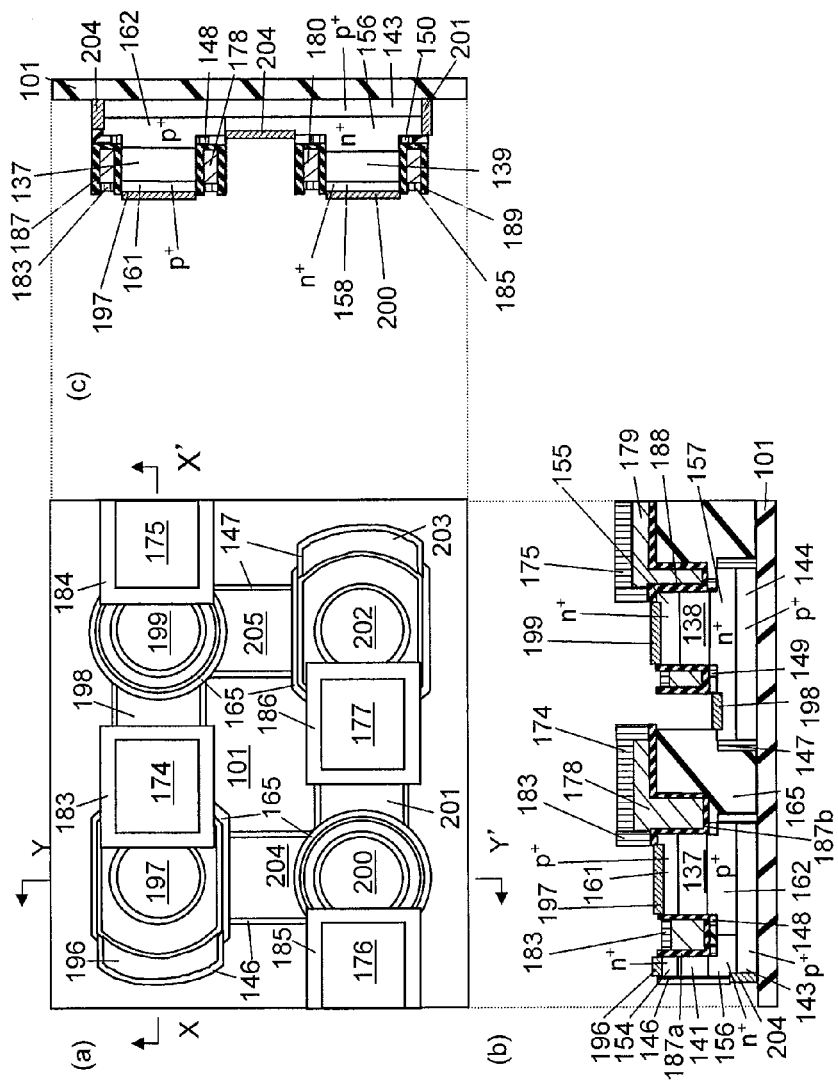
FIG. 55 shows a step in the example of the production process, wherein (a), (b) and (c) are a top plan view, a sectional view taken along the line X-X' in (a), and a sectional view taken along the line Y-Y' in (a), respectively.

Referring to FIG. 55, a metal, such as nickel (Ni) or cobalt (Co), is deposited. Subsequently, a heat treatment is performed, and then an unreacted metal film is removed, to obtain a first silicon-metal compound layer 204 formed on a part of the sidewalls of the second n+-type silicon layer 156 and the fifth p+-type silicon layer 143, a second silicon-metal compound layer 201 formed on the eighth n+silicon layer 156 and the fifth p+-type silicon layer 143, a third silicon-metal compound layer 205 formed on a part of the sidewalls of the fourth n+-type silicon layer 157 and the sixth p+-type silicon layer 144, a fourth silicon-metal compound layer 198 formed on the sixth n+-type silicon layer 157 and the sixth p+-type silicon layer 144; a fifth silicon-metal compound layer 197 formed on the first p+-type silicon layer 161, a sixth silicon-metal compound layer 196 formed on the first n+-type silicon layer 154, a seventh silicon-metal compound layer 202 formed on the third p+-type silicon layer 163, an eighth silicon-metal compound layer 203 formed on the third n+-type silicon layer 159, a ninth silicon-metal compound layer 199 formed on the fifth n+-type silicon layer 155, and a tenth silicon-metal compound layer 200 formed on the seventh n+-type silicon layer 158.

Figure 56:
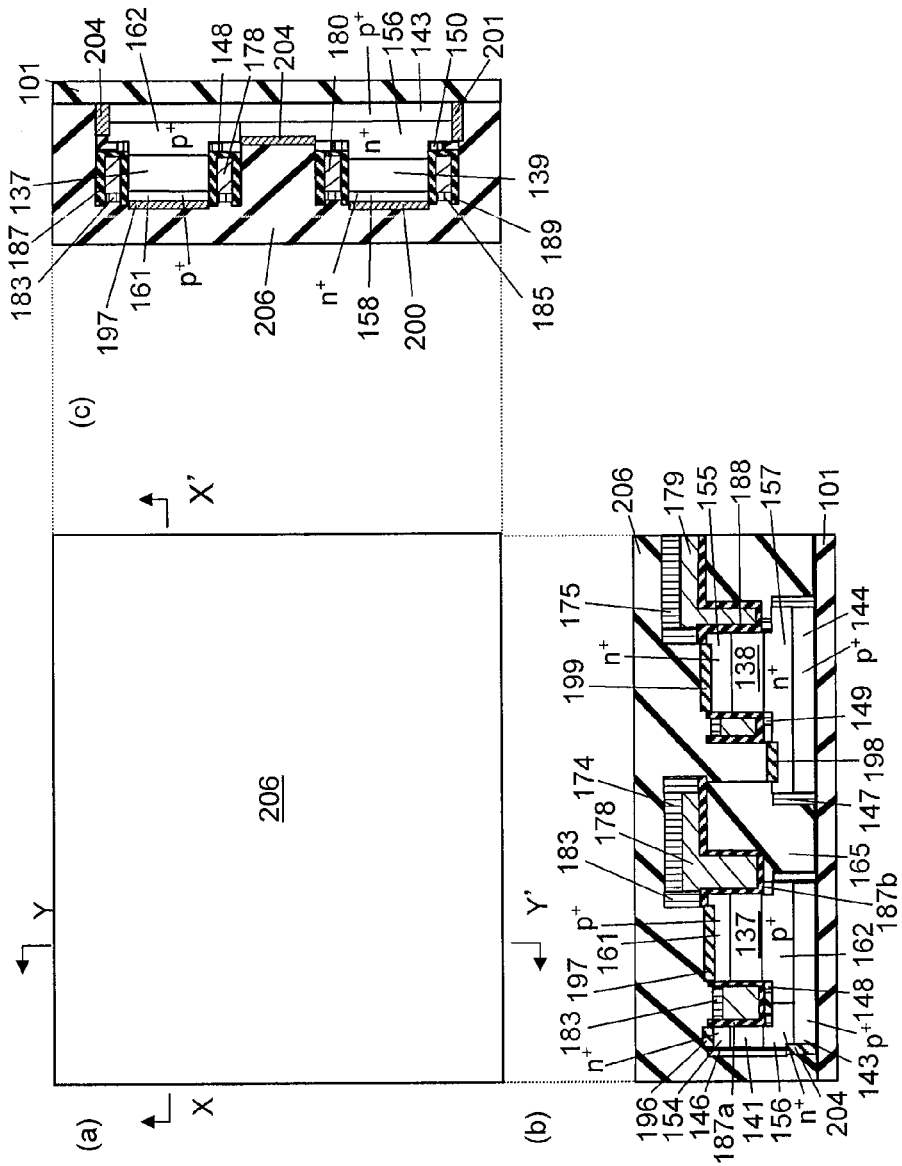
FIG. 56 shows a step in the example of the production process, wherein (a), (b) and (c) are a top plan view, a sectional view taken along the line X-X' in (a), and a sectional view taken along the line Y-Y' in (a), respectively.

Referring to FIG. 56, an interlayer film 206, such as an oxide film, is formed.

Figure 57:
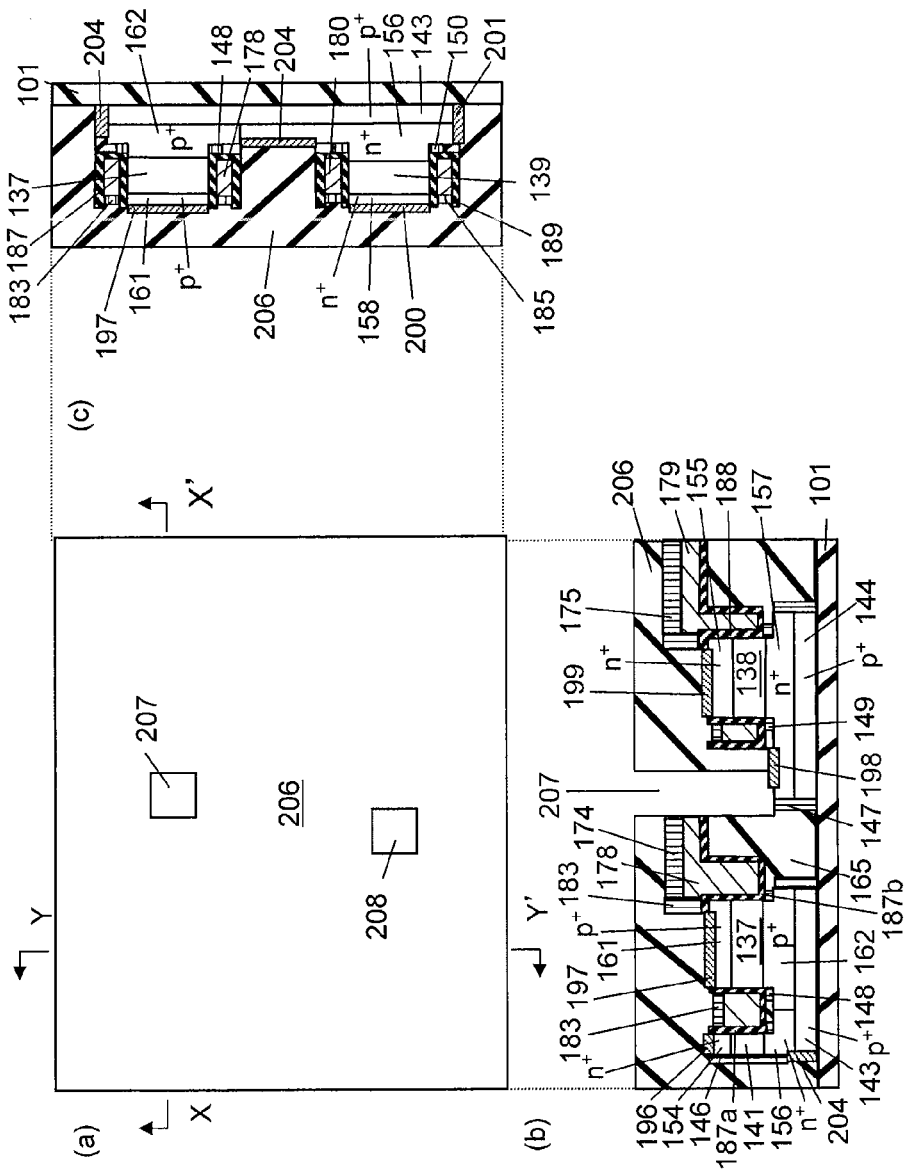
FIG. 57 shows a step in the example of the production process, wherein (a), (b) and (c) are a top plan view, a sectional view taken along the line X-X' in (a), and a sectional view taken along the line Y-Y' in (a), respectively.

Referring to FIG. 57, a contact hole 207 is formed to expose a part of the first gate electrode 178 and the fourth silicon-metal compound layer 198, and a contact hole 208 is formed to expose a part of the second gate electrode 181 and the second silicon-metal compound layer 201.

Figure 58:
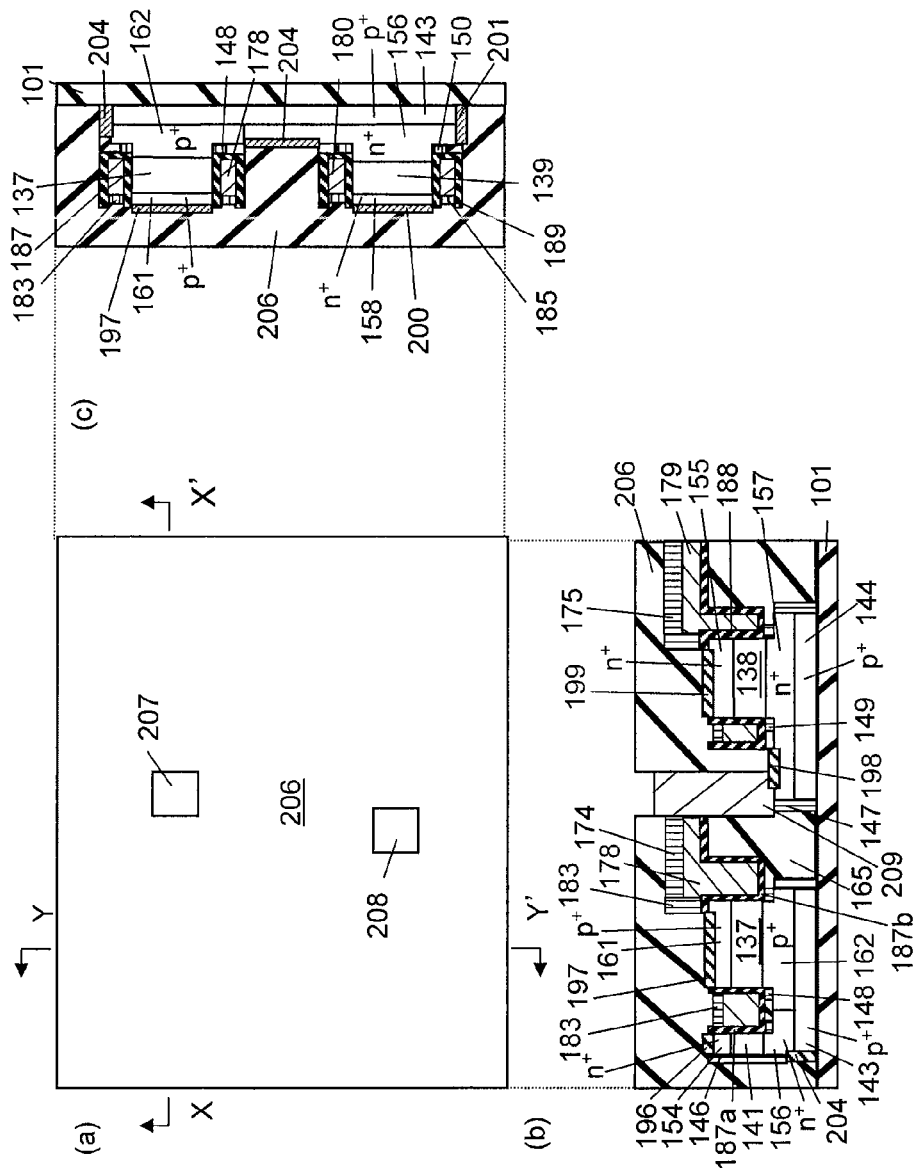
FIG. 58 shows a step in the example of the production process, wherein (a), (b) and (c) are a top plan view, a sectional view taken along the line X-X' in (a), and a sectional view taken along the line Y-Y' in (a), respectively.

Referring to FIG. 58, a metal, such as tungsten (W), is deposited to form first and second contacts 209, 210.

Figure 59:
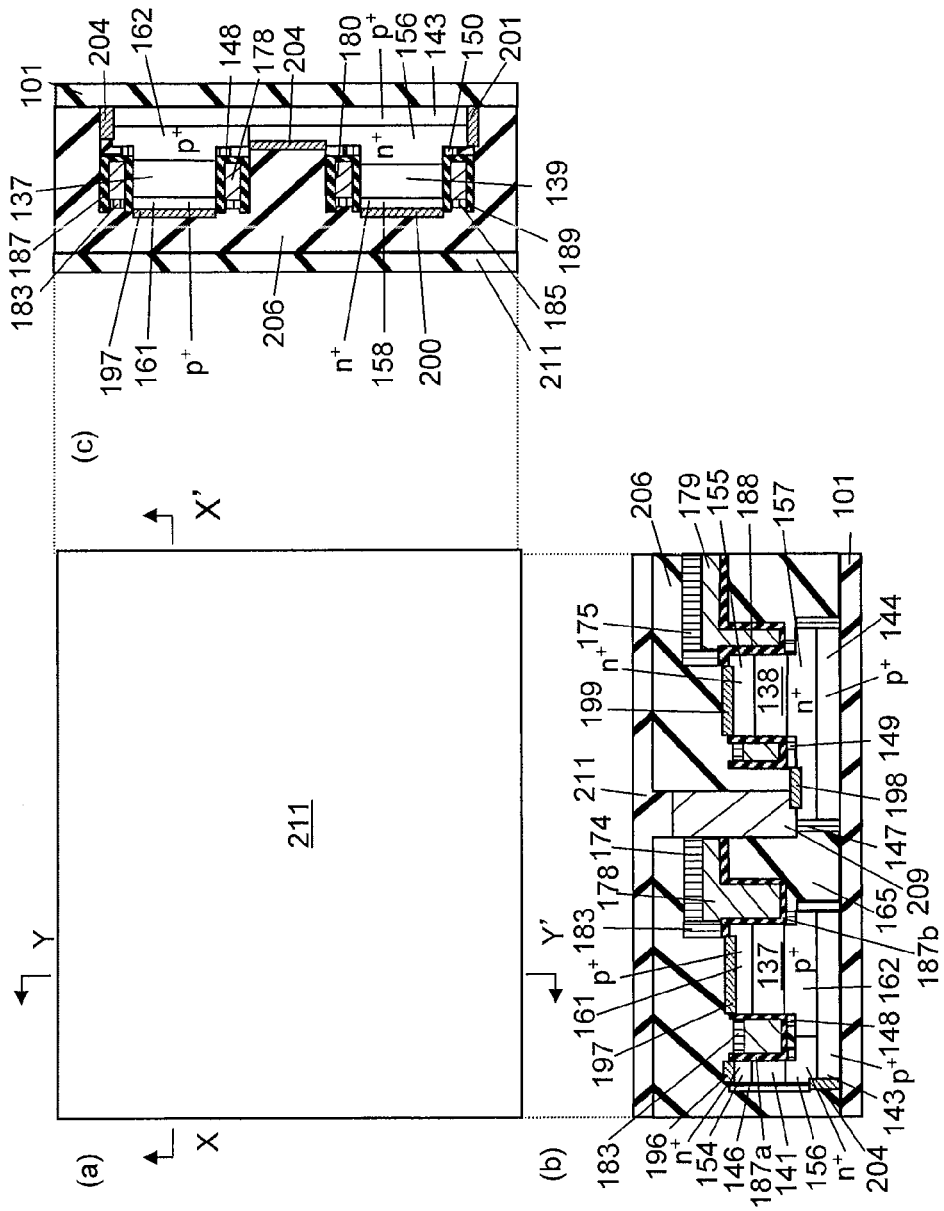
FIG. 59 shows a step in the example of the production process, wherein (a), (b) and (c) are a top plan view, a sectional view taken along the line X-X' in (a), and a sectional view taken along the line Y-Y' in (a), respectively.

Referring to FIG. 59, an interlayer film 211 is formed.

Figure 60:
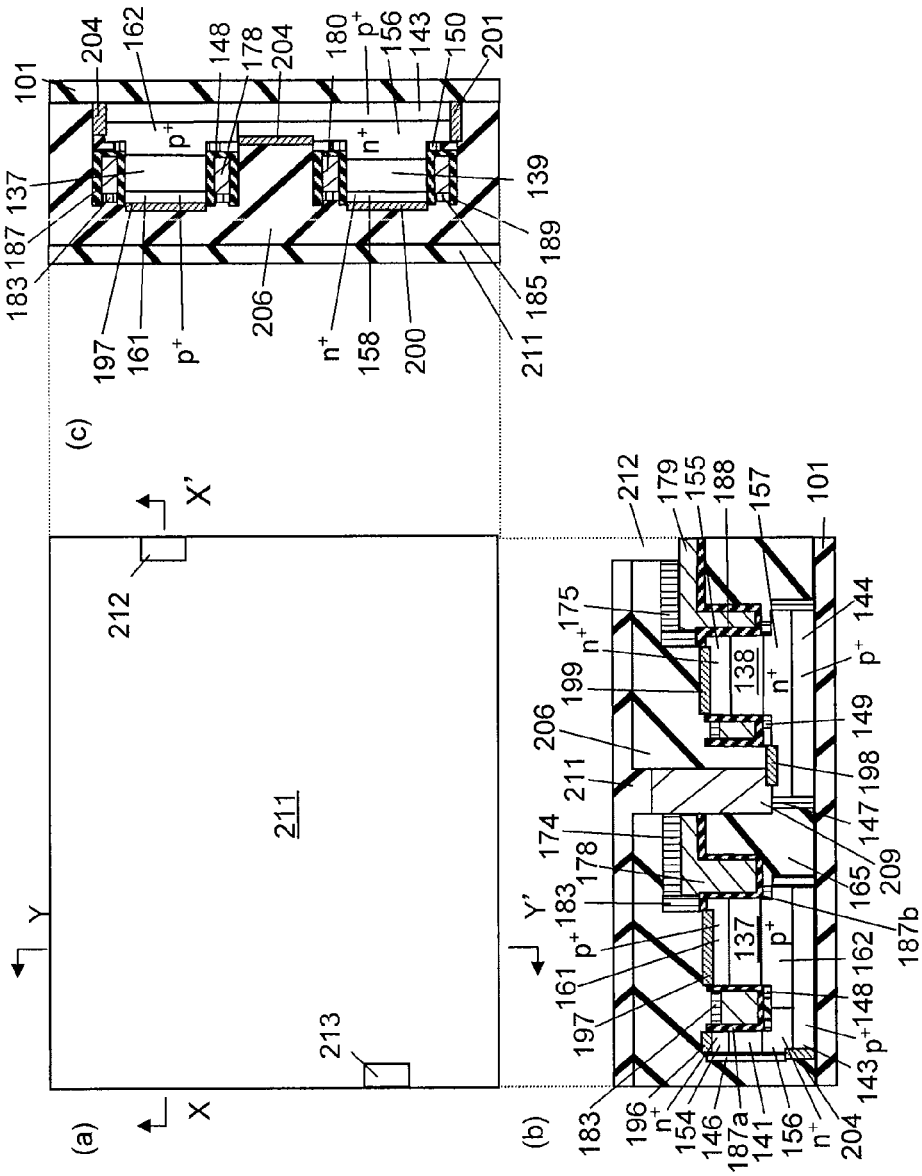
FIG. 60 shows a step in the example of the production process, wherein (a), (b) and (c) are a top plan view, a sectional view taken along the line X-X' in (a), and a sectional view taken along the line Y-Y' in (a), respectively.

Referring to FIG. 60, a contact hole 212 is formed on the third gate electrode 179, and a contact hole 213 is formed on the fourth gate electrode 180.

Figure 61:
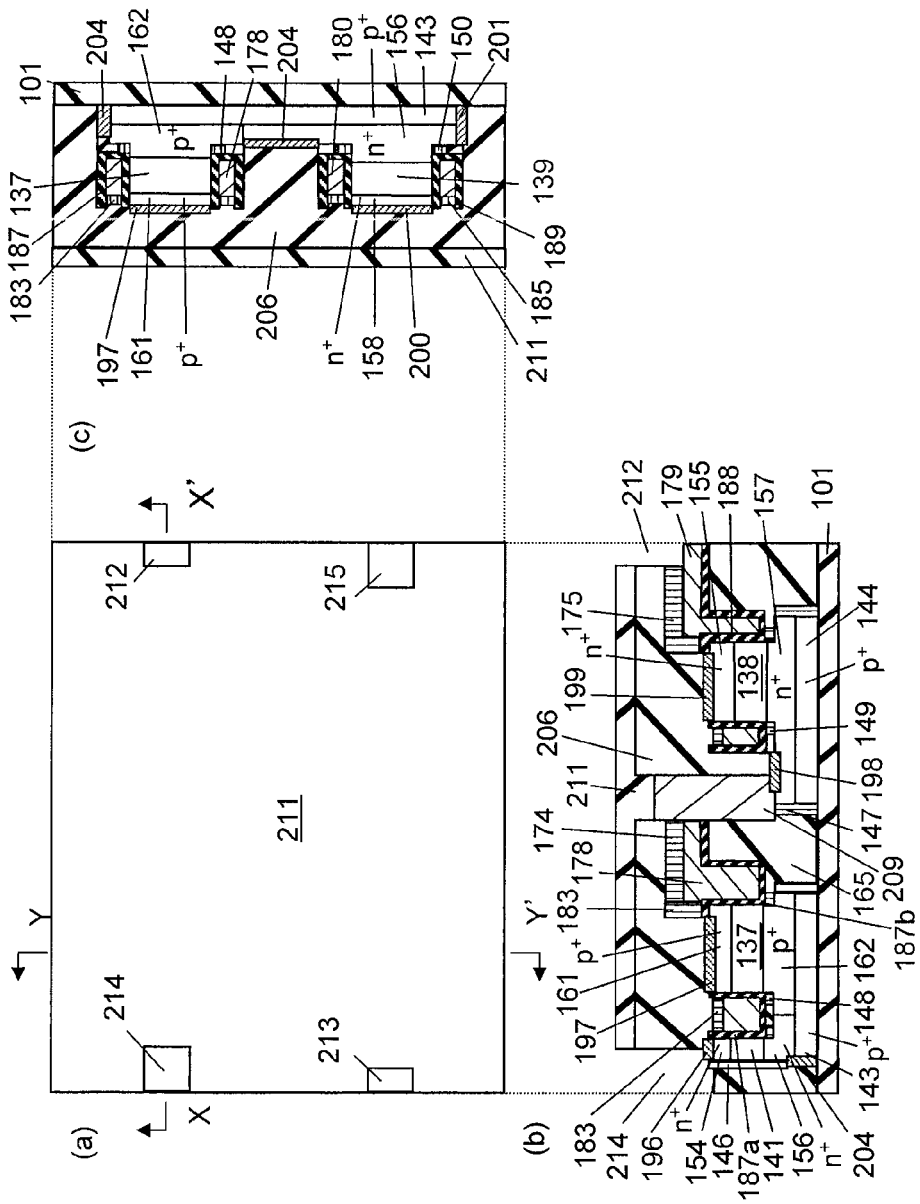
FIG. 61 shows a step in the example of the production process, wherein (a), (b) and (c) are a top plan view, a sectional view taken along the line X-X' in (a), and a sectional view taken along the line Y-Y' in (a), respectively.

Referring to FIG. 61, a contact hole 214 is formed on the sixth silicon-metal compound layer 196, and a contact hole 215 is formed on the eighth silicon-metal compound layer 203.

Figure 62:
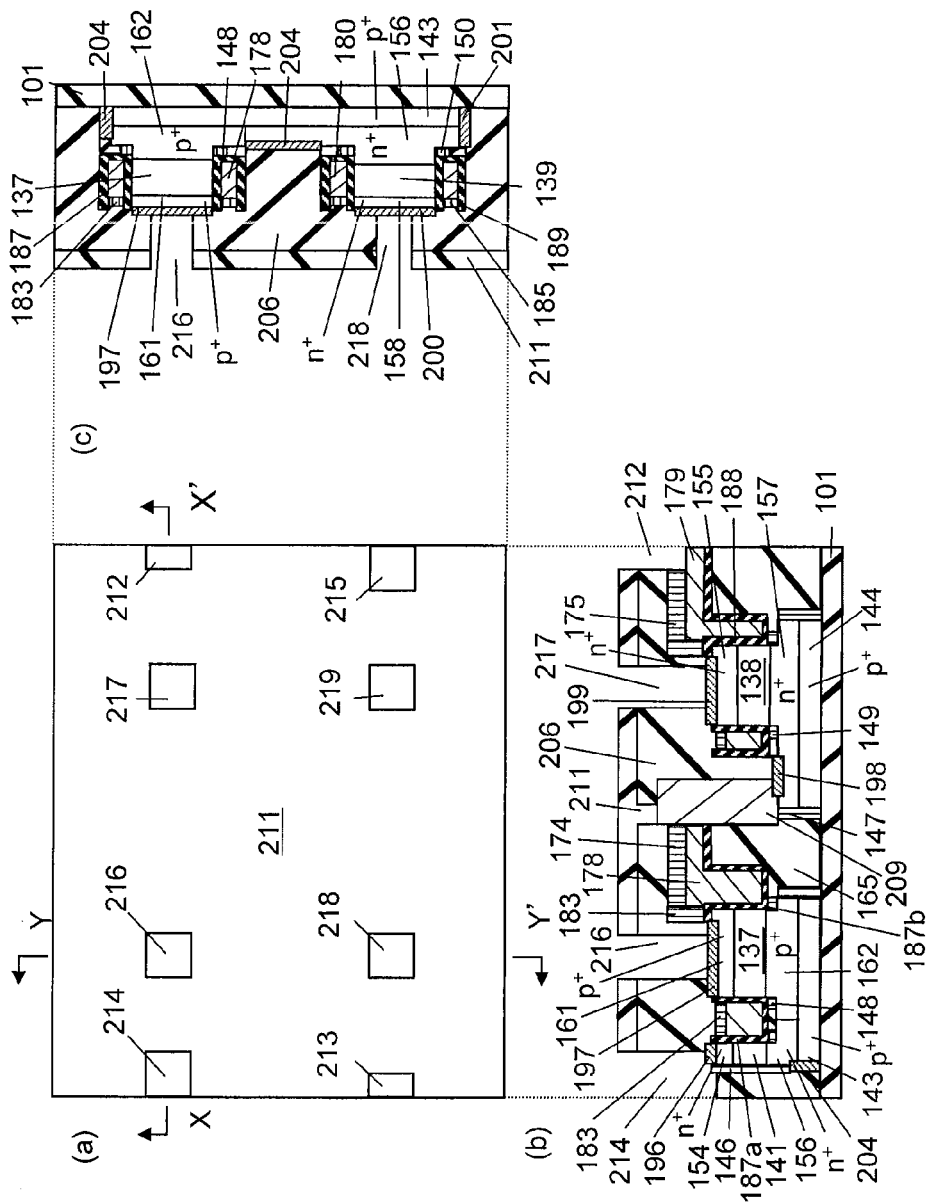
FIG. 62 shows a step in the example of the production process, wherein (a), (b) and (c) are a top plan view, a sectional view taken along the line X-X' in (a), and a sectional view taken along the line Y-Y' in (a), respectively.

Referring to FIG. 62, four contact holes 216, 217, 218, 219 are formed on the fifth silicon-metal compound layer 197, the ninth silicon-metal compound layer 199, the tenth silicon-metal compound layer 200 and the seventh silicon-metal compound layer 202, respectively.

Figure 63:
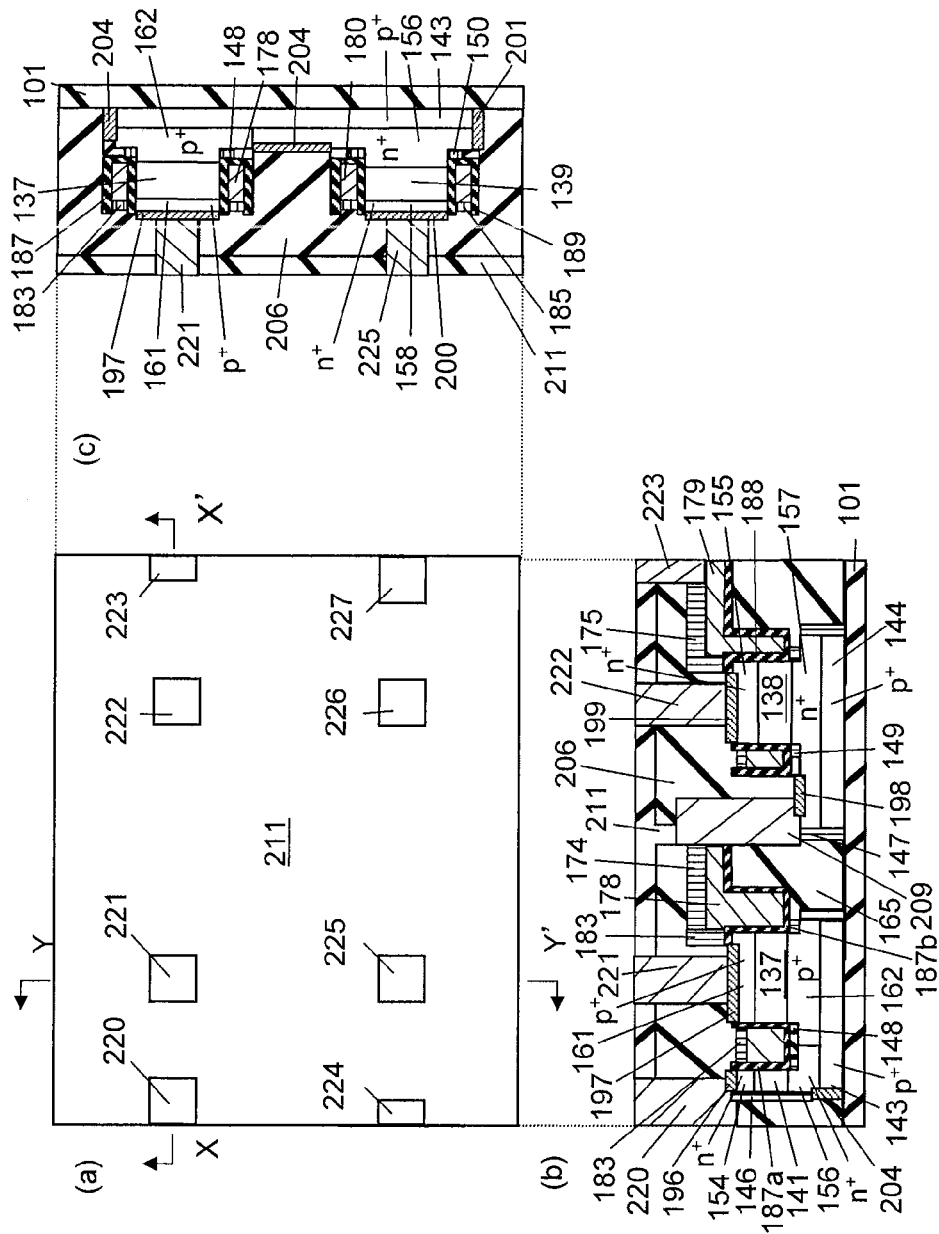
FIG. 63 shows a step in the example of the production process, wherein (a), (b) and (c) are a top plan view, a sectional view taken along the line X-X' in (a), and a sectional view taken along the line Y-Y' in (a), respectively.

Referring to FIG. 63, a metal, such as tungsten (W), is deposited to form eight contacts 220, 221, 222, 223, 224, 225, 226, 227.

Figure 64:
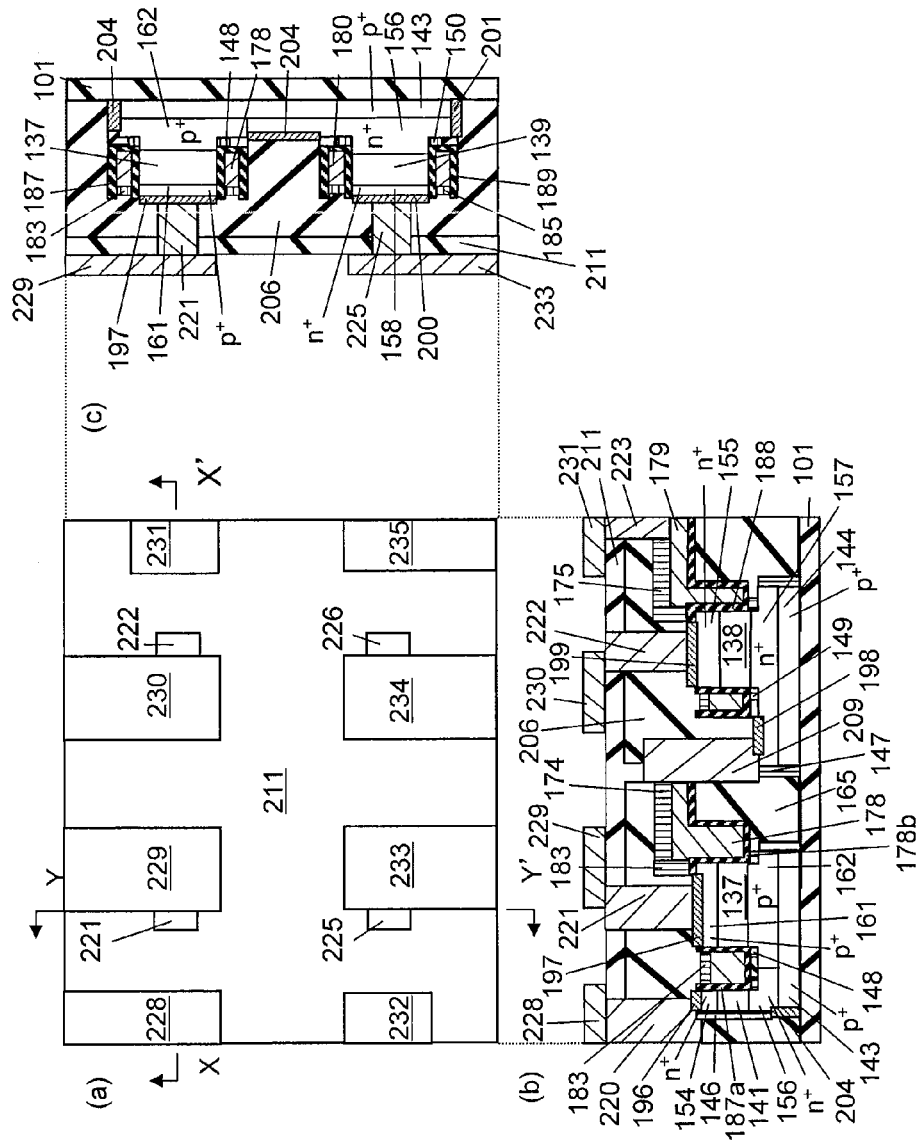
FIG. 64 shows a step in the example of the production process, wherein (a), (b) and (c) are a top plan view, a sectional view taken along the line X-X' in (a), and a sectional view taken along the line Y-Y' in (a), respectively.

Referring to FIG. 64, eight first level metals 228, 229, 230, 231, 232, 233, 234, 235 are formed on respective ones of the eight contacts.

Referring to FIG. 65, an interlayer film 236 is formed. In the above manner, an SRAM memory cell is formed.

Figure 66:
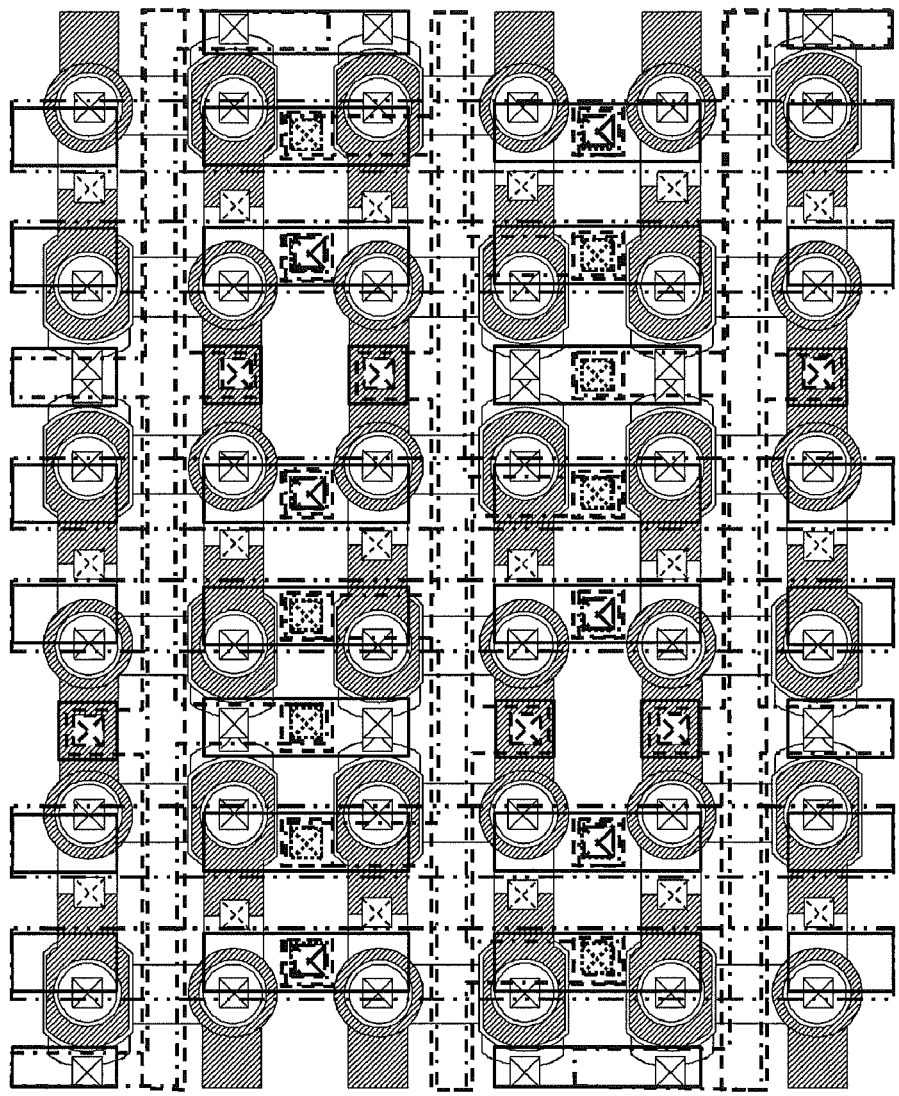
FIG. 66 is a diagram showing a semiconductor device structure formed by arranging the semiconductor device according to the embodiment in a three-row by three-column array.
Figure 67:
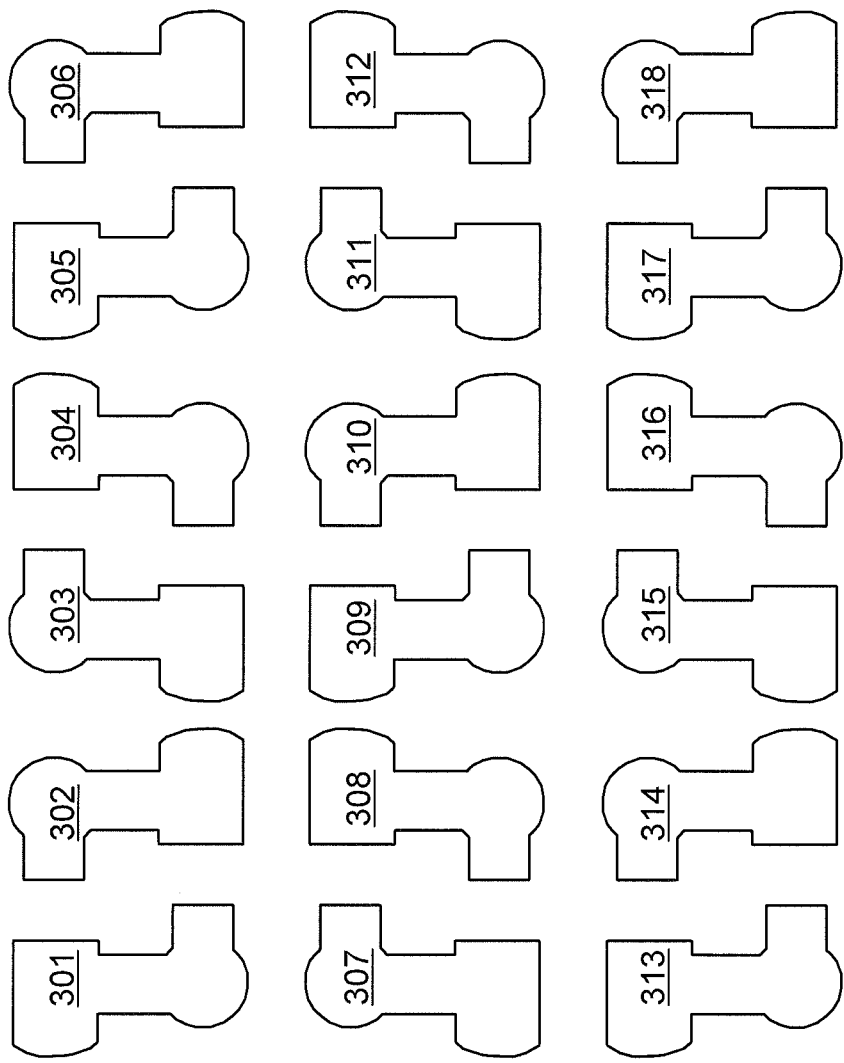
FIG. 67 is a diagram showing an inverter output terminal layer in the semiconductor device structure formed by arranging the semiconductor device according to the embodiment in a three-row by three-column array.
Figure 68:
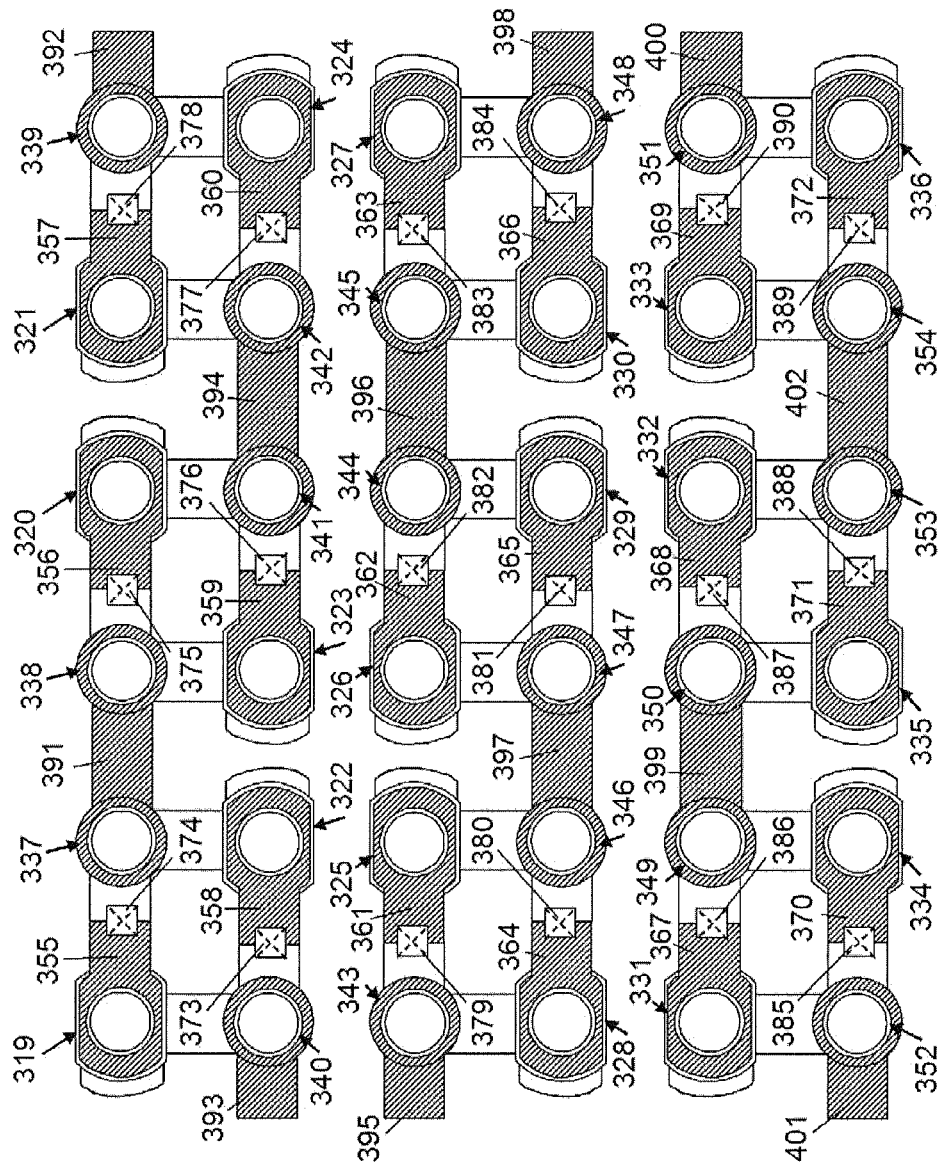
FIG. 68 is a diagram showing a transistor layer in the semiconductor device structure formed by arranging the semiconductor device according to the embodiment in a three-row by three-column array.
Figure 69:
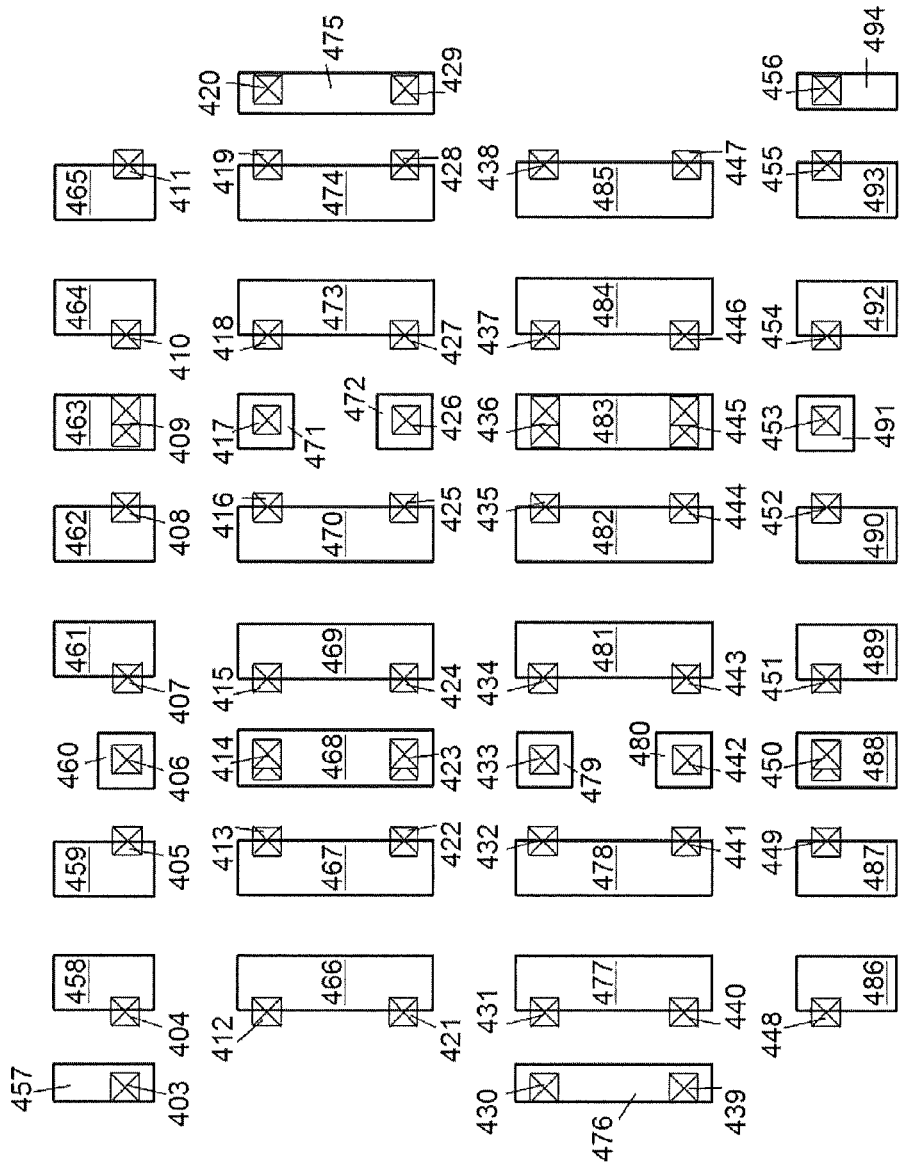
FIG. 69 is a diagram showing a contact layer and a first level metal layer in the semiconductor device structure formed by arranging the semiconductor device according to the embodiment in a three-row by three-column array.
Figure 70:
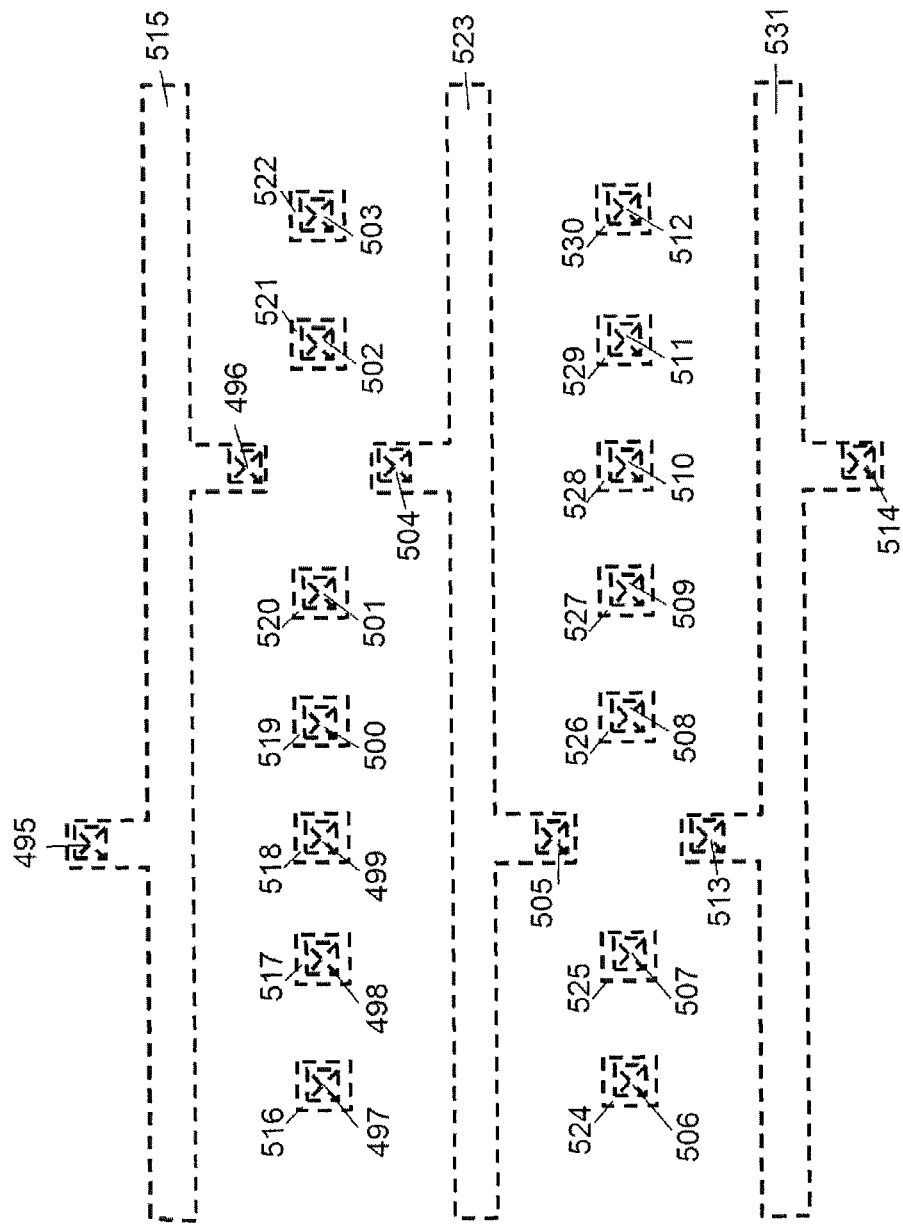
FIG. 70 is a diagram showing a second level metal layer, and a first level via (a contact between the first level metal layer and the second level metal layer), in the semiconductor device structure formed by arranging the semiconductor device according to the embodiment in a three-row by three-column array.
Figure 71:
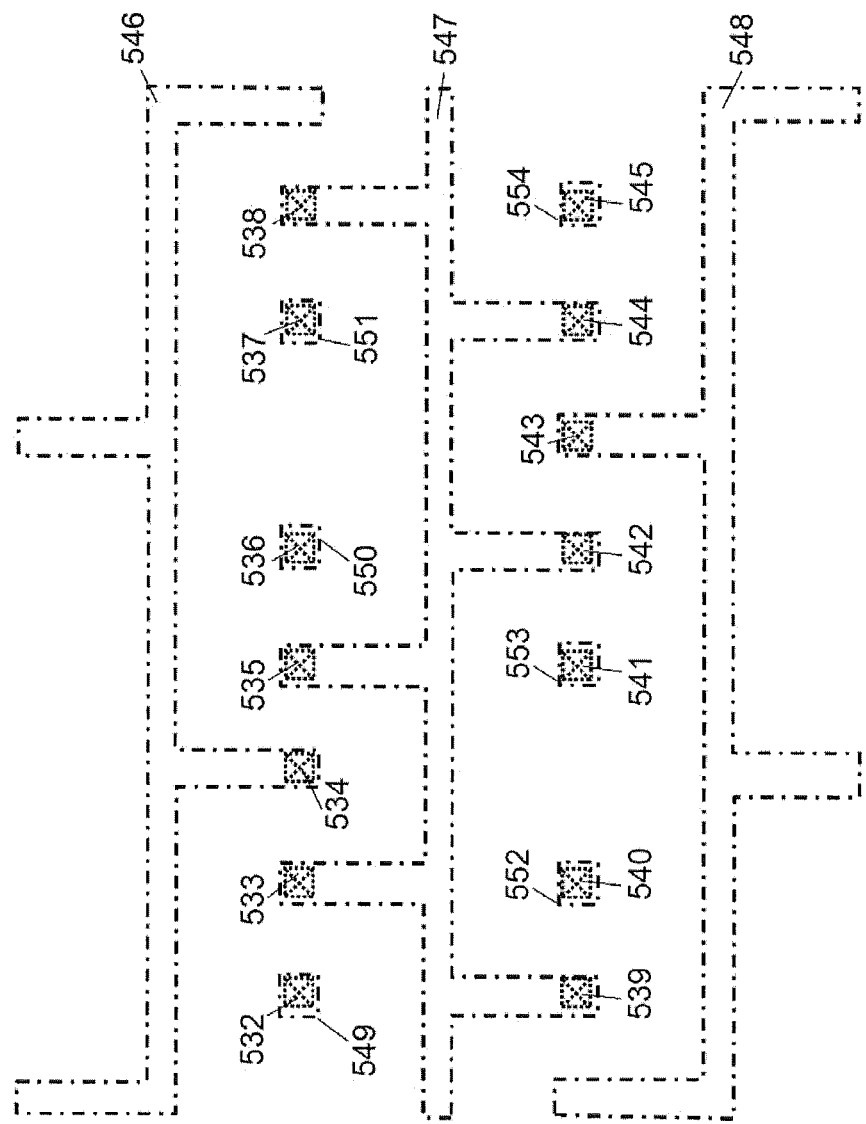
FIG. 71 is a diagram showing a third level metal layer, and a second level via (a contact between the second level metal layer and the third level metal layer), in the semiconductor device structure formed by arranging the semiconductor device according to the embodiment in a three-row by three-column array.

With reference to FIGS. 66 to 72, one example of a semiconductor device structure formed by arranging the semiconductor device according to the above embodiment in a three-row by three-column array. In these figures, the same elements or components are defined by a common reference numeral or code. FIG. 66 shows the semiconductor device structure formed by arranging the semiconductor device according to the above embodiment in a three-row by three-column array. FIG. 67 shows an inverter output terminal layer in the semiconductor device structure, and FIG. 68 shows a transistor layer in the semiconductor device structure. FIG. 69 shows a contact layer and a first level metal layer in the semiconductor device structure, and FIG. 70 shows a second level metal layer, and a first level via (a contact between the first level metal layer and the second level metal layer), in the semiconductor device structure. FIG. 71 shows a third level metal layer, and a second level via (a contact between the second level metal layer and the third level metal layer), in the semiconductor device structure, and FIG. 72 shows a fourth level metal layer, and a third level via (a contact between the third level metal layer and the fourth level metal layer), in the semiconductor device structure.

An inverter 319 is arranged at an intersection of the 1st row and the 1st column. A selection transistor 337 is arranged at an intersection of the 1st row and the 2nd column. A selection transistor 340 is arranged at an intersection of the 2nd row and the 1st column. An inverter 322 is arranged at an intersection of the 2nd row and the 2nd column. The inverter 319 and the selection transistor 340 are connected to each other by an output terminal 301. The inverter 322 and the selection transistor 337 are connected to each other by an output terminal 302. An input terminal 355 of the inverter 319 is connected to the output terminal 302 via a contact 374. An input terminal 358 of the inverter 322 is connected to the output terminal 301 via a contact 373.

An inverter 320 is arranged at an intersection of the 1st row and the 4th column. A selection transistor 338 is arranged at an intersection of the 1st row and the 3rd column. A selection transistor 341 is arranged at an intersection of the 2nd row and the 4th column. An inverter 323 is arranged at an intersection of the 2nd row and the 3rd column. The inverter 323 and the selection transistor 338 are connected to each other by an output terminal 303. The inverter 320 and the selection transistor 341 are connected to each other by an output terminal 304. An input terminal 359 of the inverter 323 is connected to the output terminal 304 via a contact 376. An input terminal 356 of the inverter 320 is connected to the output terminal 303 via a contact 375.

An inverter 321 is arranged at an intersection of the 1st row and the 5th column. A selection transistor 339 is arranged at an intersection of the 1st row and the 6th column. A selection transistor 342 is arranged at an intersection of the 2nd row and the 5th column. An inverter 324 is arranged at an intersection of the 2nd row and the 6th column. The inverter 321 and the selection transistor 342 are connected to each other by an output terminal 305. The inverter 324 and the selection transistor 339 are connected to each other by an output terminal 306. An input terminal 357 of the inverter 321 is connected to the output terminal 306 via a contact 378. An input terminal 360 of the inverter 324 is connected to the output terminal 305 via a contact 377.

The selection transistor 340 has a gate electrode 393. The selection transistor 337 and the selection transistor 338 have a gate electrode 391. The selection transistor 341 and the selection transistor 342 have a gate electrode 394. The selection transistor 339 has a gate electrode 392.

An inverter 325 is arranged at an intersection of the 3rd row and the 2nd column. A selection transistor 343 is arranged at an intersection of the 3rd row and the 1st column. A selection transistor 346 is arranged at an intersection of the 4th row and the 2nd column. An inverter 328 is arranged at an intersection of the 4th row and the 1st column. The inverter 328 and the selection transistor 343 are connected to each other by an output terminal 307. The inverter 325 and the selection transistor 346 are connected to each other by an output terminal 308. An input terminal 364 of the inverter 328 is connected to the output terminal 308 via a contact 380. An input terminal 361 of the inverter 325 is connected to the output terminal 307 via a contact 379.

An inverter 326 is arranged at an intersection of the 3rd row and the 3rd column. A selection transistor 344 is arranged at an intersection of the 3rd row and the 4th column. A selection transistor 347 is arranged at an intersection of the 4th row and the 3rd column. An inverter 329 is arranged at an intersection of the 4th row and the 4th column. The inverter 326 and the selection transistor 347 are connected to each other by an output terminal 309. The inverter 329 and the selection transistor 344 are connected to each other by an output terminal 310. An input terminal 362 of the inverter 326 is connected to the output terminal 310 via a contact 382. An input terminal 365 of the inverter 329 is connected to the output terminal 309 via a contact 381.

An inverter 327 is arranged at an intersection of the 3rd row and the 6th column. A selection transistor 345 is arranged at an intersection of the 3rd row and the 5th column. A selection transistor 348 is arranged at an intersection of the 4th row and the 6th column. An inverter 330 is arranged at an intersection of the 4th row and the 5th column. The inverter 330 and the selection transistor 345 are connected to each other by an output terminal 311. The inverter 327 and the selection transistor 348 are connected to each other by an output terminal 312. An input terminal 366 of the inverter 330 is connected to the output terminal 312 via a contact 384. An input terminal 363 of the inverter 327 is connected to the output terminal 311 via a contact 383.

The selection transistor 343 has a gate electrode 395. The selection transistor 346 and the selection transistor 347 have a gate electrode 397. The selection transistor 344 and the selection transistor 345 have a gate electrode 396. The selection transistor 348 has a gate electrode 398.

An inverter 331 is arranged at an intersection of the 5th row and the 1st column. A selection transistor 349 is arranged at an intersection of the 5th row and the 2nd column. A selection transistor 352 is arranged at an intersection of the 6th row and the 1st column. An inverter 334 is arranged at an intersection of the 6th row and the 2nd column. The inverter 331 and the selection transistor 352 are connected to each other by an output terminal 313. The inverter 334 and the selection transistor 349 are connected to each other by an output terminal 314. An input terminal 367 of the inverter 331 is connected to the output terminal 314 via a contact 386. An input terminal 370 of the inverter 334 is connected to the output terminal 313 via a contact 385.

An inverter 332 is arranged at an intersection of the 5th row and the 4th column. A selection transistor 350 is arranged at an intersection of the 5th row and the 3rd column. A selection transistor 353 is arranged at an intersection of the 6th row and the 4th column. An inverter 335 is arranged at an intersection of the 6th row and the 3rd column. The inverter 335 and the selection transistor 350 are connected to each other by an output terminal 315. The inverter 332 and the selection transistor 353 are connected to each other by an output terminal 316. An input terminal 371 of the inverter 335 is connected to the output terminal 316 via a contact 388. An input terminal 368 of the inverter 332 is connected to the output terminal 315 via a contact 387.

An inverter 333 is arranged at an intersection of the 5th row and the 5th column. A selection transistor 351 is arranged at an intersection of the 5th row and the 6th column. A selection transistor 354 is arranged at an intersection of the 6th row and the 5th column. An inverter 336 is arranged at an intersection of the 6th row and the 6th column. The inverter 333 and the selection transistor 354 are connected to each other by an output terminal 317. The inverter 336 and the selection transistor 351 are connected to each other by an output terminal 318. An input terminal 369 of the inverter 333 is connected to the output terminal 318 via a contact 390. An input terminal 372 of the inverter 336 is connected to the output terminal 317 via a contact 389.

The selection transistor 352 has a gate electrode 401. The selection transistor 349 and the selection transistor 350 have a gate electrode 399. The selection transistor 353 and the selection transistor 354 have a gate electrode 402. The selection transistor 351 has a gate electrode 400.

A contact 403 is arranged on an nMOS transistor of the inverter 319, and a contact 404 is arranged on a pMOS transistor of the inverter 319. A contact 412 is arranged on the selection transistor 340. A contact 414 is arranged on an nMOS transistor of the inverter 322, and a contact 413 is arranged on a pMOS transistor of the inverter 322. A contact 405 is arranged on the selection transistor 337. The contact 414 is also arranged on an nMOS transistor of the inverter 323, and a contact 415 is arranged on a pMOS transistor of the inverter 323. A contact 407 is arranged on the selection transistor 338. A contact 409 is arranged on an nMOS transistor of the inverter 320, and a contact 408 is arranged on a pMOS transistor of the inverter 320. A contact 416 is arranged on the selection transistor 341. The contact 409 is also arranged on an nMOS transistor of the inverter 321, and a contact 410 is arranged on a pMOS transistor of the inverter 321. A contact 418 is arranged on the selection transistor 342. A contact 420 is arranged on an nMOS transistor of the inverter 324, and a contact 419 is arranged on a pMOS transistor of the inverter 324. A contact 411 is arranged on the selection transistor 339. A contact 406 is arranged on the gate electrode 391, and a contact 417 is arranged on the gate electrode 394.

A contact 430 is arranged on an nMOS transistor of the inverter 328, and a contact 431 is arranged on a pMOS transistor of the inverter 328. A contact 421 is arranged on the selection transistor 343. A contact 423 is arranged on an nMOS transistor of the inverter 325, and a contact 422 is arranged on a pMOS transistor of the inverter 325. A contact 432 is arranged on the selection transistor 346. The contact 423 is also arranged on an nMOS transistor of the inverter 326, and a contact 424 is arranged on a pMOS transistor of the inverter 326. A contact 434 is arranged on the selection transistor 347. A contact 436 is arranged on an nMOS transistor of the inverter 329, and a contact 435 is arranged on a pMOS transistor of the inverter 329. A contact 425 is arranged on the selection transistor 344. The contact 436 is also arranged on an nMOS transistor of the inverter 330, and a contact 437 is arranged on a pMOS transistor of the inverter 330. A contact 427 is arranged on the selection transistor 345. A contact 429 is arranged on an nMOS transistor of the inverter 327, and a contact 428 is arranged on a pMOS transistor of the inverter 327. A contact 438 is arranged on the selection transistor 348. A contact 433 is arranged on the gate electrode 397, and a contact 426 is arranged on the gate electrode 396.

A contact 439 is arranged on an nMOS transistor of the inverter 331, and a contact 440 is arranged on a pMOS transistor of the inverter 331. A contact 448 is arranged on the selection transistor 352. A contact 450 is arranged on an nMOS transistor of the inverter 334, and a contact 449 is arranged on a pMOS transistor of the inverter 334. A contact 441 is arranged on the selection transistor 349. The contact 450 is also arranged on an nMOS transistor of the inverter 335, and a contact 451 is arranged on a pMOS transistor of the inverter 335. A contact 443 is arranged on the selection transistor 350. A contact 445 is arranged on an nMOS transistor of the inverter 332, and a contact 444 is arranged on a pMOS transistor of the inverter 332. A contact 452 is arranged on the selection transistor 353. The contact 445 is also arranged on an nMOS transistor of the inverter 333, and a contact 446 is arranged on a pMOS transistor of the inverter 333. A contact 454 is arranged on the selection transistor 354. A contact 456 is arranged on an nMOS transistor of the inverter 336, and a contact 455 is arranged on a pMOS transistor of the inverter 336. A contact 447 is arranged on the selection transistor 351. A contact 442 is arranged on the gate electrode 399, and a contact 453 is arranged on the gate electrode 402.

A first level metal 457 is connected to the contact 403, and a first level metal 458 is connected to the contact 404. A first level metal 459 is connected to the contact 405, and a first level metal 460 is connected to the contact 406. A first level metal 461 is connected to the contact 407, and a first level metal 462 is connected to the contact 408. A first level metal 463 is connected to the contact 409, and a first level metal 464 is connected to the contact 410. A first level metal 465 is connected to the contact 411.

A first level metal 466 is connected to the contacts 412, 421, and a first level metal 467 is connected to the contacts 413, 422. A first level metal 468 is connected to the contacts 414, 423, and a first level metal 469 is connected to the contacts 415, 424. A first level metal 470 is connected to the contacts 416, 425. A first level metal 471 is connected to the contact 417, and a first level metal 472 is connected to the contact 472. A first level metal 473 is connected to the contacts 418, 427. A first level metal 474 is connected to the contacts 419, 428, and a first level metal 475 is connected to the contacts 420, 429.

A first level metal 476 is connected to the contacts 430, 439, and a first level metal 477 is connected to the contacts 431, 440. A first level metal 478 is connected to the contacts 432, 441. A first level metal 479 is connected to the contact 433, and a first level metal 480 is connected to the contact 442. A first level metal 481 is connected to the contacts 434, 443. A first level metal 482 is connected to the contacts 435, 444, and a first level metal 483 is connected to the contacts 436, 445. A first level metal 484 is connected to the contacts 437, 446, and a first level metal 485 is connected to the contacts 438, 447.

A first level metal 486 is connected to the contact 448, and a first level metal 487 is connected to the contact 449. A first level metal 488 is connected to the contact 450, and a first level metal 489 is connected to the contact 451. A first level metal 490 is connected to the contact 452, and a first level metal 491 is connected to the contact 453. A first level metal 492 is connected to the contact 454, and a first level metal 493 is connected to the contact 455. A first level metal 494 is connected to the contact 456.

A first level via 495 is arranged on the first level metal 460, and a first level via 496 is arranged on the first level metal 471.

A first level via 497 is arranged on the first level metal 466, and a first level via 498 is arranged on the first level metal 467. A first level via 499 is arranged on the first level metal 468, and a first level via 500 is arranged on the first level metal 469. A first level via 501 is arranged on the first level metal 470, and a first level via 502 is arranged on the first level metal 473. A first level via 503 is arranged on the first level metal 474. A first level via 505 is arranged on the first level metal 479, and a first level via 504 is arranged on the first level metal 472. A first level via 506 is arranged on the first level metal 477, and a first level via 507 is arranged on the first level metal 478. A first level via 508 is arranged on the first level metal 481, and a first level via 509 is arranged on the first level metal 482. A first level via 510 is arranged on the first level metal 483, and a first level via 511 is arranged on the first level metal 484. A first level via 512 is arranged on the first level metal 485. A first level via 513 is arranged on the first level metal 480, and a first level via 514 is arranged on the first level metal 491.

A second level metal 515 is connected to the first level vias 495, 496. A second level metal 516 is connected to the first level via 497, and a second level metal 517 is connected to the first level via 498. A second level metal 518 is connected to the first level via 499, and a second level metal 519 is connected to the first level via 500. A second level metal 520 is connected to the first level via 501, and a second level metal 521 is connected to the first level via 502. A second level metal 522 is connected to the first level via 503. A second level metal 523 is connected to the first level vias 505, 504.

A second level metal 523 is connected to the first level via 506, and a second level metal 525 is connected to the first level via 507. A second level metal 526 is connected to the first level via 508, and a second level metal 527 is connected to the first level via 509. A second level metal 528 is connected to the first level via 510, and a second level metal 529 is connected to the first level via 511. A second level metal 530 is connected to the first level via 512. A second level metal 531 is connected to the first level vias 513, 514.

A second level via 532 is arranged on the second level metal 516, and a second level via 533 is arranged on the second level metal 517. A second level via 534 is arranged on the second level metal 518, and a second level via 535 is arranged on the second level metal 519. A second level via 536 is arranged on the second level metal 520, and a second level via 537 is arranged on the second level metal 521. A second level via 538 is arranged on the second level metal 522, and a second level via 539 is arranged on the second level metal 524. A second level via 540 is arranged on the second level metal 525, and a second level via 541 is arranged on the second level metal 526. A second level via 542 is arranged on the second level metal 527, and a second level via 543 is arranged on the second level metal 528. A second level via 544 is arranged on the second level metal 529, and a second level via 545 is arranged on the second level metal 530.

A third level metal 546 is connected to the second level via 534, and a third level metal 549 is connected to the second level via 532. A third level metal 550 is connected to the second level via 536, and a third level metal 551 is connected to the second level via 537. A third level metal 547 is connected to the second level vias 533, 535, 538, 539, 542, 544. A third level metal 552 is connected to the second level via 540, and a third level metal 553 is connected to the second level via 541. A third level metal 554 is connected to the second level via 545, and a third level metal 548 is connected to the second level via 543.

A third level via 561 is arranged on the third level metal 549, and a third level via 564 is arranged on the third level metal 550. A third level via 565 is arranged on the third level metal 551, and a third level via 562 is arranged on the third level metal 552. A third level via 563 is arranged on the third level metal 553, and a third level via 566 is arranged on the third level metal 554.

A fourth level metal 555 is connected to the third level via 561, and a fourth level metal 556 is connected to the third level via 562. A fourth level metal 557 is connected to the third level via 563, and a fourth level metal 558 is connected to the third level via 564. A fourth level metal 559 is connected to the third level via 565, and a fourth level metal 560 is connected to the third level via 566.

Having described and illustrated the principles of the present invention by reference to one preferred embodiment, it should be apparent that the preferred embodiment may be modified in arrangement and detail without departing from the principles disclosed herein and that it is intended that the application be construed as including all such modifications and variations insofar as they come within the spirit and scope of the subject matter disclosed herein.

EXPLANATIONS OF LETTERS OR NUMERALS

101: oxide film
102: p+-type silicon layer
103: p-type or non-doped silicon layer
104: resist
105: n-type or non-doped silicon layer
106: n-type or non-doped silicon layer
107: oxide film
108: nitride film
109 to 112: resist
113 to 116: nitride film
117 to 119: oxide film
121: oxide film
122 to 125: oxide film-based sidewall
126: nitride film
127: nitride film-based sidewall, nitride film-based hard mask
128, 129: nitride film-based sidewall
130: nitride film-based sidewall, nitride film-based hard mask
131 to 136: resist
137: first island-shaped silicon layer
138: third island-shaped silicon layer
139: fourth island-shaped silicon layer
140: second island-shaped silicon layer
141: first arc-shaped silicon layer
142: second arc-shaped silicon layer
143, 144: p+-type silicon layer
145: nitride film
146 to 151: nitride film-based sidewall
152 to 153: resist
154 to 159: n+-type silicon layer
160: resist
161 to 164: p+-type silicon layer
165: oxide layer
166: resist
167: high-K film
168: metal
169: nitride film
170 to 173: resist
174 to 177: nitride film-based sidewall
178 to 181: gate electrode
182: nitride film
183 to 186: nitride film-based sidewall
187(a) and 187(b) to 190: gate dielectric film, high-K film
191 to 194: resist 195: nitride film-based sidewall
196 to 205: silicon-metal compound layer
206: interlayer film
207, 208: contact hole
209, 210: contact
211: interlayer film
212 to 219: contact hole
220 to 227: contact
228 to 235: first level metal
236: interlayer film
237: first inverter
239: first selection transistor
240: second inverter
242: second selection transistor
301 to 318: output terminal
319 to 336: inverter
337 to 354: selection transistor
355 to 372: input terminal
373 to 390: contact
391 to 402: gate electrode
403 to 456: contact
457 to 494: first level metal
495 to 514: first level via
515 to 531: second level metal
532 to 545: second level via
546 to 554: third level metal
555 to 560: fourth level via
561 to 566: third level via

What is claimed is:

1. A semiconductor device comprising:
a first inverter arranged at an intersection of a 1st row and a 1st column, the first inverter including a first island-shaped semiconductor layer, a first gate dielectric film surrounding a periphery of the first island-shaped semiconductor layer, a first gate electrode surrounding a periphery of the first gate dielectric film, the first gate dielectric film having a first surface surrounding an outer side surface of the first gate electrode and a second surface opposite the first surface, a first arc-shaped semiconductor layer contacting only a portion of the second surface of the first gate dielectric film, a first first-conductive-type high-concentration semiconductor layer arranged on a top of the first island-shaped semiconductor layer, a second first-conductive-type high-concentration semiconductor layer arranged underneath the first island-shaped semiconductor layer, a first second-conductive-type high-concentration semiconductor layer arranged on a top of the first arc-shaped semiconductor layer, and a second second-conductive-type high-concentration semiconductor layer arranged underneath the first arc-shaped semiconductor layer;
a second inverter arranged at an intersection of a 2nd row and a 2nd column, the second inverter including a second island-shaped semiconductor layer, a second gate dielectric film surrounding a periphery of the second island-shaped semiconductor layer, a second gate electrode surrounding a periphery of the second gate dielectric film, the second gate dielectric film having a first surface in contact with a side surface of the second gate electrode and a second surface, a second arc-shaped semiconductor layer contacting only a portion of the second surface of the second gate dielectric film, a third first-conductive-type high-concentration semiconductor layer arranged on a top of the second island-shaped semiconductor layer, a fourth first-conductive-type high-concentration semiconductor layer arranged underneath the second island-shaped semiconductor layer, a third second-conductive-type high-concentration semiconductor layer arranged on a top of the second arc-shaped semiconductor layer, and a fourth second-conductive-type high-concentration semiconductor layer arranged underneath the second arc-shaped semiconductor layer;
a first selection transistor arranged at an intersection of the 1st row and the 2nd column, the first selection transistor including a third island-shaped semiconductor layer, a third gate dielectric film surrounding a periphery of the third island-shaped semiconductor layer, a third gate electrode surrounding a periphery of the third gate dielectric film, a fifth second-conductive-type high-concentration semiconductor layer arranged on a top of the third island-shaped semiconductor layer, and a sixth second-conductive-type high-concentration semiconductor layer arranged underneath the third island-shaped semiconductor layer; and
a second selection transistor arranged at an intersection of the 2nd row and the 1st column, the second selection transistor including a fourth island-shaped semiconductor layer, a fourth gate dielectric film surrounding a periphery of the fourth island-shaped semiconductor layer, a fourth gate electrode surrounding a periphery of the fourth gate dielectric film, a seventh second-conductive-type high-concentration semiconductor layer arranged on a top of the fourth island-shaped semiconductor layer, and an eighth second-conductive-type high-concentration semiconductor layer arranged underneath the fourth island-shaped semiconductor layer
wherein the first inverter and the first selection transistor are connected to each other by a first output terminal and second inverter and the second selection transistor are connected to each other by a second output terminal,
and wherein an input terminal of the first inverter is connected to the second output terminal and an input terminal of the second inverter is connected to the first output terminal.

2. A semiconductor device comprising:
a first inverter arranged at an intersection of a 1st row and a 1st column, the first inverter including a first island-shaped semiconductor layer, a first gate dielectric film surrounding a periphery of the first island-shaped semiconductor layer, a first gate electrode surrounding a periphery of the first gate dielectric film, the first gate dielectric film having a first surface surrounding an outer side surface of the first gate electrode and a second surface opposite the first surface, a first arc-shaped semiconductor layer contacting only a portion of the second surface of the first gate dielectric film, a first first-conductive-type high-concentration semiconductor layer arranged on a top of the first island-shaped semiconductor layer, a second first-conductive-type high-concentration semiconductor layer arranged underneath the first island-shaped semiconductor layer, a first second-conductive-type high-concentration semiconductor layer arranged on a top of the first arc-shaped semiconductor layer, and a second second-conductive-type high-concentration semiconductor layer arranged underneath the first arc-shaped semiconductor layer;
a second inverter arranged at an intersection of a 2nd row and a 2nd column, the second inverter including a second island-shaped semiconductor layer, a second gate dielectric film surrounding a periphery of the second island-shaped semiconductor layer, a second gate electrode surrounding a periphery of the second gate dielectric film, the second gate dielectric film having a first surface in contact with a side surface of the second gate electrode and a second surface, a second arc-shaped semiconductor layer contacting only a portion of the second surface of the second gate dielectric film, a third first-conductive-type high-concentration semiconductor layer arranged on a top of the second island-shaped semiconductor layer, a fourth first-conductive-type high-concentration semiconductor layer arranged underneath the second island-shaped semiconductor layer, a third second-conductive-type high-concentration semiconductor layer arranged on a top of the second arc-shaped semiconductor layer, and a fourth second-conductive-type high-concentration semiconductor layer arranged underneath the second arc-shaped semiconductor layer;

a first selection transistor arranged at an intersection of the 1st row and the 2nd column, the first selection transistor including a third island-shaped semiconductor layer, a third gate dielectric film surrounding a periphery of the third island-shaped semiconductor layer, a third gate electrode surrounding a periphery of the third gate dielectric film, a fifth second-conductive-type high-concentration semiconductor layer arranged on a top of the third island-shaped semiconductor layer, and a sixth second-conductive-type high-concentration semiconductor layer arranged underneath the third island-shaped semiconductor layer; and a second selection transistor arranged at an intersection of the 2nd row and the 1st column, the second selection transistor including a fourth island-shaped semiconductor layer, a fourth gate dielectric film surrounding a periphery of the fourth island-shaped semiconductor layer, a fourth gate electrode surrounding a periphery of the fourth gate dielectric film, a seventh second-conductive-type high-concentration semiconductor layer arranged on a top of the fourth island-shaped semiconductor layer, and an eighth second-conductive-type high-concentration semiconductor layer arranged underneath the fourth island-shaped semiconductor layer wherein the first inverter and the first selection transistor are connected to each other by a first output terminal and second inverter and the second selection transistor are connected to each other by a second output terminal, and wherein an input terminal of the first inverter is connected to the second output terminal and an input terminal of the second inverter is connected to the first output terminal;

a fifth first-conductive-type high-concentration semiconductor layer arranged underneath the second first-conductive-type high-concentration semiconductor layer, the second second-conductive-type high-concentration semiconductor layer and the eighth second-conductive-type high-concentration semiconductor layer;

a sixth first-conductive-type high-concentration semiconductor layer arranged underneath the fourth first-conductive-type high-concentration semiconductor layer, the fourth second-conductive-type high-concentration semiconductor layer and the sixth second-conductive-type high-concentration semiconductor layer;

a first semiconductor-metal compound layer formed on a part of respective sidewalls of the second second-conductive-type high-concentration semiconductor layer and the fifth first-conductive-type high-concentration semiconductor layer;

a second semiconductor-metal compound layer formed on the eighth second-conductive-type high-concentration semiconductor layer and the fifth first-conductive-type high-concentration semiconductor layer;

a third semiconductor-metal compound layer formed on a part of respective sidewalls of the fourth second-conductive-type high-concentration semiconductor layer and the sixth first-conductive-type high-concentration semiconductor layer;

a fourth semiconductor-metal compound layer formed on the sixth second-conductive-type high-concentration semiconductor layer and the sixth first-conductive-type high-concentration semiconductor layer;

a fifth semiconductor-metal compound layer formed on the first first-conductive-type high-concentration semiconductor layer;

a sixth semiconductor-metal compound layer formed on the first second-conductive-type high-concentration semiconductor layer;

a seventh semiconductor-metal compound layer formed on the third first-conductive-type high-concentration semiconductor layer;

an eighth semiconductor-metal compound layer formed on the third second-conductive-type high-concentration semiconductor layer;

a ninth semiconductor-metal compound layer formed on the fifth second-conductive-type high-concentration semiconductor layer;

a tenth semiconductor-metal compound layer formed on the seventh second-conductive-type high-concentration semiconductor layer;

a first contact connecting the first gate electrode and the fourth semiconductor-metal compound layer; and a second contact connecting the second gate electrode and the second semiconductor-metal compound layer.

3. A semiconductor device comprising:

a first inverter arranged at an intersection of a 1st row and a 1st column, the first inverter including a first island-shaped semiconductor layer, a first gate dielectric film surrounding a periphery of the first island-shaped semiconductor layer, a first gate electrode surrounding a periphery of the first gate dielectric film, the first gate dielectric film having a first surface surrounding an outer side surface of the first gate electrode and a second surface opposite the first surface, a first arc-shaped semiconductor layer contacting only a portion of the second surface of the first gate dielectric film, a first p+-type semiconductor layer arranged on a top of the first island-shaped semiconductor layer, a second p+-type semiconductor layer arranged underneath the first island-shaped semiconductor layer, a first n+-type semiconductor layer arranged on a top of the first arc-shaped semiconductor layer and a second n+-type semiconductor layer arranged underneath the first arc-shaped semiconductor layer;

a second inverter arranged at an intersection of a 2nd row and a 2nd column, the second inverter including a second island-shaped semiconductor layer, a second gate dielectric film surrounding a periphery of the second island-shaped semiconductor layer, a second gate electrode surrounding a periphery of the second gate dielectric film, the second gate dielectric film having a first surface surrounding an outer side surface of the second gate electrode and a second surface opposite the first surface, a second arc-shaped semiconductor layer contacting only a portion of the second surface of the second gate dielectric film, a third p+-type semiconductor layer arranged on a top of the second island-shaped semiconductor layer, a fourth p+-type semiconductor layer arranged underneath the second island-shaped semiconductor layer, a third n+-type semiconductor layer arranged on a top of the second arc-shaped semiconductor layer, and a fourth n+-type semiconductor layer arranged underneath the second arc-shaped semiconductor layer;

a first selection transistor arranged at an intersection of the 1st row and the 2nd column, the first selection transistor including a third island-shaped semiconductor layer, a third gate dielectric film surrounding a periphery of the third island-shaped semiconductor layer, a third gate electrode surrounding a periphery of the third gate dielectric film, a fifth n+-type semiconductor layer arranged on a top of the third island-shaped semiconductor layer, and a sixth n+-type semiconductor layer arranged underneath the third island-shaped semiconductor layer;

a second selection transistor arranged at an intersection of the 2nd row and the 1st column, the second selection transistor including a fourth island-shaped semiconductor layer, a fourth gate dielectric film surrounding a periphery of the fourth island-shaped semiconductor layer, a fourth gate electrode surrounding a periphery of the fourth gate dielectric film, a seventh n+-type semiconductor layer arranged on a top of the fourth island-shaped semiconductor layer, and an eighth n+-type semiconductor layer arranged underneath the fourth island-shaped semiconductor layer wherein the first inverter and the first selection transistor are connected to each other by a first output terminal and second inverter and the second selection transistor are connected to each other by a second output terminal, and wherein an input terminal of the first inverter is connected to the second output terminal and an input terminal of the second inverter is connected to the first output terminal;

a fifth p+-type semiconductor layer arranged underneath the second p+-type semiconductor layer, the second n+-type semiconductor layer and the eighth n+-type semiconductor layer;

a sixth p+-type semiconductor layer arranged underneath the fourth p+-type semiconductor layer, the fourth n+-type semiconductor layer and the sixth n+-type semiconductor layer;

a first semiconductor-metal compound layer formed on a part of respective sidewalls of the second n+-type semiconductor layer and the fifth p+-type semiconductor layer;

a second semiconductor-metal compound layer formed on the eighth n+-type semiconductor layer and the fifth p+-type semiconductor layer;

a third semiconductor-metal compound layer formed on a part of respective sidewalls of the fourth n+-type semiconductor layer and the sixth p+-type semiconductor layer;

a fourth semiconductor-metal compound layer formed on the sixth n+-type semiconductor layer and the sixth p+-type semiconductor layer;

a fifth semiconductor-metal compound layer formed on the first p+-type semiconductor layer;

a sixth semiconductor-metal compound layer formed on the first n+-type semiconductor layer;

a seventh semiconductor-metal compound layer formed on the third p+-type semiconductor layer;

an eighth semiconductor-metal compound layer formed on the third n+-type semiconductor layer;

a ninth semiconductor-metal compound layer formed on the fifth n+-type semiconductor layer;

a tenth semiconductor-metal compound layer formed on the seventh n+-type semiconductor layer;

a first contact connecting the first gate electrode and the fourth semiconductor-metal compound layer; and a second contact connecting the second gate electrode and the second semiconductor-metal compound layer.

4. The semiconductor device as defined in claim 3, which is configured to satisfy the following condition: Wp1 is approximately equal to 2 times Wn1, wherein Wp1 is an outer peripheral length of the first island-shaped semiconductor layer, and Wn1 is a length of an arc of the first arc-shaped semiconductor layer in contact with a part of the second surface of the second gate dielectric film.

5. The semiconductor device as defined in claim 3, which is configured to satisfy the following condition: Wp2 is approximately equal to 2 times Wn2, wherein Wp2 is an outer peripheral length of the second island-shaped semiconductor layer, and Wn2 is a length of an arc of the second arc-shaped semiconductor layer in contact with a part of the second surface of the fourth gate dielectric film.

6. The semiconductor device as defined in claim 3, which is configured to satisfy the following condition: Ln1 is approximately equal to Lp1, wherein Ln1 is a channel length of the first arc-shaped semiconductor layer, and Lp1 is a channel length of the first island-shaped semiconductor layer.

7. The semiconductor device as defined in claim 3, which is configured to satisfy the following condition: Ln2 is approximately equal to Lp2, wherein Ln2 is a channel length of the second arc-shaped semiconductor layer, and Lp2 is a channel length of the second island-shaped semiconductor layer.

8. The semiconductor device as defined in claim 3, wherein:

a first pMOS transistor comprises a combination of the first island-shaped semiconductor layer, the gate dielectric film, the first gate electrode, the first p+-type semiconductor layer, and the second p+-type semiconductor layer;

a first nMOS transistor comprises a combination of the first gate electrode, the first gate dielectric film, the first arc-shaped semiconductor layer, a first n+-type semiconductor layer arranged on the top of the first arc-shaped semiconductor layer, and the second n+-type semiconductor layer;

a second pMOS transistor comprises a combination of the second island-shaped semiconductor layer, the second gate dielectric film, the second gate electrode, the third p+-type semiconductor layer, and the fourth p+-type semiconductor layer; and a second nMOS transistor comprising a combination of the second gate electrode, the second gate dielectric film, the second arc-shaped semiconductor layer, the third n+-type semiconductor layer, and the fourth n+-type semiconductor layer, and wherein: the first pMOS transistor, the first nMOS transistor, the second pMOS transistor, and the second nMOS transistor, operate as enhancement type transistors.

9. The semiconductor device as defined in claim 3, wherein each of the first to tenth semiconductor-metal compound layers is a silicon-metal compound layer.

10. The semiconductor device as defined in claim 3, wherein:

the first island-shaped semiconductor layer is a first island-shaped silicon layer;

the first arc-shaped semiconductor layer is a first arc-shaped silicon layer;

the second island-shaped semiconductor layer is a second island-shaped silicon layer;

the second arc-shaped semiconductor layer is a second arc-shaped silicon layer;

the third island-shaped semiconductor layer is a third island-shaped silicon layer;

the fourth island-shaped semiconductor layer is a fourth island-shaped silicon layer;

each of the n+-type semiconductor layers is a n+-type silicon layer; and each of the p+-type semiconductor layers is a p+-type silicon layer.

11. The semiconductor device as defined in claim 10, wherein:

the first island-shaped silicon layer is a first n-type or non-doped island-shaped silicon layer;

the first arc-shaped silicon layer is a first p-type or non-doped arc-shaped silicon layer;

the second island-shaped silicon layer is a second n-type or non-doped island-shaped silicon layer;

the second arc-shaped silicon layer is a second p-type or non-doped arc-shaped silicon layer;

the third island-shaped silicon layer is a third p-type or non-doped island-shaped silicon layer; and the fourth island-shaped silicon layer is a fourth p-type or non-doped island-shaped silicon layer.

* * * * *